United States Patent
Kaiser et al.

(10) Patent No.: US 9,444,064 B2
(45) Date of Patent: Sep. 13, 2016

(54) ORGANIC ELECTROLUMINESCENT DEVICE

(75) Inventors: Joachim Kaiser, Darmstadt (DE); Holger Heil, Frankfurt am Main (DE); Philipp Stoessel, Frankfurt am Main (DE); Dominik Joosten, Frankfurt am Main (DE); Simone Leu, Dittelsheim-Hessloch (DE)

(73) Assignee: Merck Patent GmbH (DE)

( * ) Notice: Subject to any disclaimer, the term of this patent is extended or adjusted under 35 U.S.C. 154(b) by 1266 days.

(21) Appl. No.: 13/258,214

(22) PCT Filed: Feb. 24, 2010

(86) PCT No.: PCT/EP2010/001123
§ 371 (c)(1),
(2), (4) Date: Sep. 21, 2011

(87) PCT Pub. No.: WO2010/108579
PCT Pub. Date: Sep. 30, 2010

(65) Prior Publication Data
US 2012/0056169 A1 Mar. 8, 2012

(30) Foreign Application Priority Data

Mar. 23, 2009 (DE) .................. 10 2009 014 513

(51) Int. Cl.
*H01L 51/50* (2006.01)
*H01L 51/00* (2006.01)

(52) U.S. Cl.
CPC ......... *H01L 51/5016* (2013.01); *H01L 51/008* (2013.01); *H01L 51/005* (2013.01); *H01L 51/0052* (2013.01); *H01L 51/0058* (2013.01); *H01L 51/0067* (2013.01); *H01L 51/0085* (2013.01); *H01L 51/0087* (2013.01); *H01L 2251/552* (2013.01)

(58) Field of Classification Search
CPC ............ H01L 51/005; H01L 51/0052; H01L 51/0067; H01L 51/0058; H01L 51/008; H01L 51/0085; H01L 51/0087; H01L 51/5016; H01L 51/5024; H01L 2251/552; C09K 11/06; C09K 2211/1011; C09K 2211/1018; C09K 2211/1022
See application file for complete search history.

(56) References Cited

U.S. PATENT DOCUMENTS

| | | |
|---|---|---|
| 4,539,507 A | 9/1985 | VanSlyke et al. |
| 4,780,536 A | 10/1988 | Czarnik et al. |
| 5,061,569 A | 10/1991 | VanSlyke et al. |
| 5,151,629 A | 9/1992 | VanSlyke |
| 5,837,166 A | 11/1998 | Kawamura et al. |

(Continued)

FOREIGN PATENT DOCUMENTS

| | | |
|---|---|---|
| DE | 102008033943 A1 | 1/2010 |
| DE | 102008036982 A1 | 2/2010 |

(Continued)

OTHER PUBLICATIONS

English Translation of Japanese Office Action mailed Nov. 5, 2013 for Japanese Patent Application No. 2012-501154.

*Primary Examiner* — Gregory Clark
(74) *Attorney, Agent, or Firm* — Drinker Biddle & Reath LLP

(57) ABSTRACT

The present invention relates to phosphorescent organic electroluminescent devices which comprise at least one phosphorescent emitter and a mixture of at least two matrix materials in the emitting layer.

17 Claims, 1 Drawing Sheet

(56) References Cited

U.S. PATENT DOCUMENTS

| | | |
|---|---|---|
| 5,840,217 A | 11/1998 | Lupo et al. |
| 6,344,283 B1 | 2/2002 | Inoue et al. |
| 6,458,909 B1 | 10/2002 | Spreitzer et al. |
| 7,776,457 B2 * | 8/2010 | Lee .................... H01L 27/3211 313/504 |
| 2006/0035109 A1 | 2/2006 | Arakane et al. |
| 2006/0058494 A1 | 3/2006 | Busing et al. |
| 2006/0068223 A1 | 3/2006 | Nariyuki et al. |
| 2006/0175958 A1 | 8/2006 | Gerhard et al. |
| 2006/0208221 A1 | 9/2006 | Gerhard et al. |
| 2006/0255332 A1 | 11/2006 | Becker et al. |
| 2007/0015005 A1 * | 1/2007 | Chen et al. .................. 428/690 |
| 2007/0082284 A1 | 4/2007 | Stoessel et al. |
| 2007/0099024 A1 | 5/2007 | Nii et al. |
| 2007/0099026 A1 | 5/2007 | Lee et al. |
| 2007/0249834 A1 | 10/2007 | Stossel et al. |
| 2007/0252516 A1 | 11/2007 | Kondakova et al. |
| 2008/0027220 A1 | 1/2008 | Stossel et al. |
| 2008/0069399 A1 | 3/2008 | Nagao et al. |
| 2008/0161567 A1 | 7/2008 | Stoessel et al. |
| 2008/0187748 A1 | 8/2008 | Mishima |
| 2008/0220285 A1 | 9/2008 | Vestweber et al. |
| 2008/0303417 A1 | 12/2008 | Yabunouchi et al. |
| 2009/0026937 A1 | 1/2009 | Kinoshita et al. |
| 2009/0066225 A1 | 3/2009 | Kimura et al. |
| 2009/0184313 A1 | 7/2009 | Buesing et al. |
| 2009/0261717 A1 | 10/2009 | Buesing et al. |
| 2009/0292080 A1 | 11/2009 | Stossel et al. |
| 2010/0193773 A1 | 8/2010 | Yamamoto et al. |
| 2010/0227978 A1 | 9/2010 | Stoessel et al. |
| 2010/0331506 A1 | 12/2010 | Fortte et al. |
| 2011/0012100 A1 | 1/2011 | Stoessel |
| 2011/0089410 A1 | 4/2011 | Stoessel et al. |
| 2011/0121274 A1 | 5/2011 | Parham et al. |
| 2011/0140043 A1 | 6/2011 | Stoessel et al. |

FOREIGN PATENT DOCUMENTS

| | | |
|---|---|---|
| DE | 102009007038 A1 | 8/2010 |
| EP | 650955 A1 | 5/1995 |
| EP | 0 676 461 A2 | 10/1995 |
| EP | 0891121 A1 | 1/1999 |
| EP | 1 191 612 A2 | 3/2002 |
| EP | 1 191 613 A2 | 3/2002 |
| EP | 1 191 614 A2 | 3/2002 |
| EP | 1661888 A1 | 5/2006 |
| JP | 2000/053957 A | 2/2000 |
| JP | 2001/226331 A | 8/2001 |
| JP | 2006/253445 A | 9/2006 |
| JP | 2006/523740 A | 10/2006 |
| JP | 2008218972 A | 9/2008 |
| JP | 2009/032976 A | 2/2009 |
| WO | WO-95/09147 A1 | 4/1995 |
| WO | WO-98/27136 A1 | 6/1998 |
| WO | WO-98/30071 A1 | 7/1998 |
| WO | WO-01/41512 A1 | 6/2001 |
| WO | WO-01/049806 A1 | 7/2001 |
| WO | WO-02/02714 A2 | 1/2002 |
| WO | WO-02/15645 A1 | 2/2002 |
| WO | WO-03/060956 A2 | 7/2003 |
| WO | WO-2004/028217 A1 | 4/2004 |
| WO | WO-2004/037887 A2 | 5/2004 |
| WO | WO-2004/080975 A1 | 9/2004 |
| WO | WO-2004/081017 A1 | 9/2004 |
| WO | WO-2004/093207 A2 | 10/2004 |
| WO | WO-2005/003253 A2 | 1/2005 |
| WO | WO-2005/011013 A1 | 2/2005 |
| WO | WO-2005/029923 | 3/2005 |
| WO | WO-2005/033244 A1 | 4/2005 |
| WO | WO-2005/042550 A1 | 5/2005 |
| WO | WO-2005113563 A1 | 12/2005 |
| WO | WO-2006/008069 A1 | 1/2006 |
| WO | WO-2006/061182 A1 | 6/2006 |
| WO | WO-2006/068223 A1 | 6/2006 |
| WO | WO-2006/073054 A1 | 7/2006 |
| WO | WO-2006/081973 A1 | 8/2006 |
| WO | WO-2006/100896 A1 | 9/2006 |
| WO | WO-2006/122630 A1 | 11/2006 |
| WO | WO-2007/127063 A2 | 11/2007 |
| WO | WO-2007/140847 A1 | 12/2007 |
| WO | WO-2008/006449 A1 | 1/2008 |
| WO | WO-2009/118087 A1 | 10/2009 |
| WO | WO-2009/146770 A2 | 12/2009 |
| WO | WO-2010/006680 A1 | 1/2010 |
| WO | WO-2010/086089 A1 | 8/2010 |

* cited by examiner

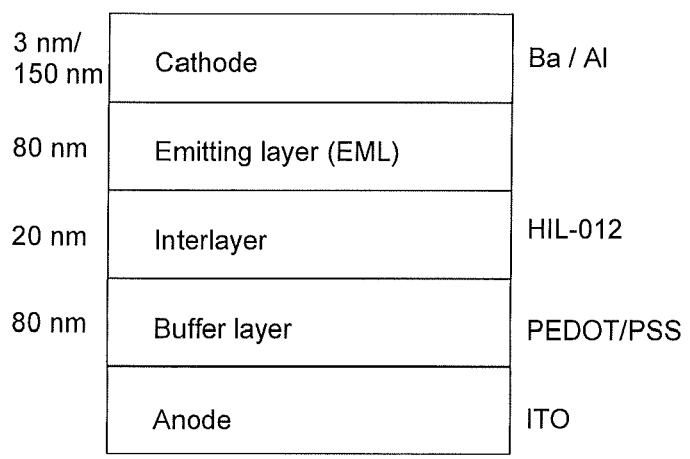

ORGANIC ELECTROLUMINESCENT DEVICE

CROSS-REFERENCE TO RELATED APPLICATIONS

This application is a national stage application (under 35 U.S.C. §371) of PCT/EP2010/001123, filed Feb. 24, 2010, which claims benefit of German application 10 2009 014 513.3, filed Mar. 23, 2009.

BACKGROUND OF THE INVENTION

The present invention relates to organic electroluminescent devices which comprise at least one layer comprising at least one phosphorescent dopant and at least two matrix materials.

The structure of organic electroluminescent devices (OLEDs) in which organic semiconductors are employed as functional materials is described, for example, in U.S. Pat. No. 4,539,507, U.S. Pat. No. 5,151,629, EP 0676461 and WO 98/27136. A development in the area of organic electroluminescent devices is phosphorescent OLEDs. These have significant advantages owing to the higher achievable efficiency compared with fluorescent OLEDs.

However, there is still a need for improvement in the case of phosphorescent OLEDs. This applies, in particular, to the efficiency and the lifetime of the device.

The technical object on which the present invention is based therefore consists in the provision of a phosphorescent organic electroluminescent device which has an improved lifetime. A further object consists in the provision of a phosphorescent organic electroluminescent device which has improved efficiency.

In accordance with the prior art, electron-conducting materials, including ketones (for example in accordance with WO 2004/093207 or in accordance with the unpublished application DE 102008033943.1) or triazine derivatives (for example in accordance with the unpublished application DE 102008036982.9), are used as matrix materials for phosphorescent emitters. With ketones in particular, low operating voltages and long lifetimes are achieved, which makes this class of compound a very interesting matrix material. However, there is still a need for improvement on use of these matrix materials, as in the case of other matrix materials, in particular in respect of the efficiency and the lifetime of the device.

The prior art furthermore discloses organic electroluminescent devices which comprise a phosphorescent emitter doped into a mixture of two matrix materials.

US 2007/0252516 discloses phosphorescent organic electroluminescent devices which comprise a mixture of a hole-conducting matrix material and an electron-conducting matrix material. Improved efficiency is disclosed for these OLEDs. No effect on the lifetime is evident.

US 2007/0099026 discloses white-emitting organic electroluminescent devices, where the green- or red-emitting layer comprises a phosphorescent emitter and a mixture of a hole-conducting matrix material and an electron-conducting matrix material. Hole-conducting materials indicated are, inter alia, triarylamine and carbazole derivatives. Electron-conducting materials indicated are, inter alia, aluminium and zinc compounds, oxadiazole compounds and triazine or triazole compounds. Further improvements are also still desirable for these OLEDs.

BRIEF SUMMARY OF THE INVENTION

Surprisingly, it has been found that both the efficiency and also the lifetime of a phosphorescent organic electroluminescent device based on low-molecular-weight molecules (so-called small molecules) are significantly improved if the matrix used for the phosphorescent emitter in the emitting layer is a mixture of at least two matrix materials, where one of the two matrix materials is a material which is capable of transporting charges, i.e. an electron- or hole-transport material, and the other of the two matrix materials is a material which is selected so that it is not involved in charge transport. This is achieved by means of materials in which the position of the HOMO (highest occupied molecular orbital) and of the LUMO (lowest unoccupied molecular orbital) and the energy gap (band gap) are selected correspondingly. Better results, in particular in respect of efficiency and lifetime, are achieved with electroluminescent devices of this type than with electroluminescent devices which comprise, as matrix for the phosphorescent emitter, a mixture of an electron-transporting material and a hole-transporting material.

The invention thus relates to an organic electroluminescent device comprising an anode, a cathode and at least one emitting layer which comprises at least one phosphorescent compound which is doped into a mixture of two materials A and B, where these materials are defined low-molecular-weight compounds having a molecular weight of 2000 g/mol or less, characterised in that material A is a charge-transporting material and in that material B is a material which has an HOMO of −5.4 eV or less and an LUMO of −2.4 eV or more and which has an energy gap of at least 3.5 eV.

A DETAILED DESCRIPTION OF THE INVENTION

Materials A and B here are the matrix materials for the phosphorescent compound and are not themselves involved in the emission by the electroluminescent device.

The charge-transporting matrix material A can be a hole-transporting material or an electron-transporting material.

For the purposes of this application, a hole-transporting material is characterised by an HOMO of greater than −5.4 eV. For the purposes of this application, an electron-transporting material is characterised by an LUMO of less than −2.4 eV. The HOMO and LUMO positions and the energy gap are determined here as generally described in detail in the example part.

The organic electroluminescent device according to the invention comprises, as described above, an anode, a cathode and at least one emitting layer which is arranged between the anode and the cathode. The emitting layer here comprises at least one phosphorescent compound and furthermore at least one charge-transporting matrix material and a further matrix material having an HOMO of −5.4 eV or less, an LUMO of −2.4 eV or more and an energy gap of 3.5 eV or more. The organic electroluminescent device does not necessarily have to comprise only layers which are built up from organic or organometallic materials. Thus, it is also possible for the anode, cathode and/or one or more layers to comprise inorganic materials or to be built up entirely from inorganic materials.

A BRIEF DESCRIPTION OF THE FIGURES

FIG. 1 shows the device according to the invention.

For the purposes of this invention, a phosphorescent compound is a compound which exhibits, at room temperature, luminescence from an excited state of relatively high spin multiplicity, i.e. a spin state >1, in particular from an excited triplet state. For the purposes of this invention, all luminescent transition-metal complexes, in particular all luminescent iridium, platinum and copper compounds, are to be regarded as phosphorescent compounds.

In a preferred embodiment of the invention, the phosphorescent compound is a red-phosphorescent compound or a green-phosphorescent compound.

Matrix materials A and B preferably have a glass-transition temperature $T_G$ of greater than 70° C., particularly preferably greater than 90° C., very particularly preferably greater than 110° C.

The proportion of the phosphorescent compound in the emitting layer is preferably 1 to 50% by vol., particularly preferably 3 to 30% by vol., very particularly preferably 5 to 25% by vol., especially 10 to 20% by vol.

The ratio between matrix material A and matrix material B can vary. In particular, the charge balance of the OLED can be adjusted simply and reproducibly by variation of this ratio. Adjustment of the mixing ratio thus enables the efficiency of the OLED to be optimised easily. The mixing ratio between the charge-transporting matrix material A and matrix material B here is generally from 10:1 to 1:10, preferably from 7:1 to 1:7, particularly preferably from 4:1 to 1:4, in each case based on the volume.

Preferred embodiments of the charge-transporting matrix material A and matrix material B and of the phosphorescent compound which are present in accordance with the invention in the emitting layer are indicated below.

In a preferred embodiment of the invention, the charge-transporting matrix material A is an electron-conducting compound. Suitable preferred electron-transporting matrix materials are selected from the group consisting of aromatic ketones, aromatic phosphine oxides, aromatic sulfoxides, aromatic sulfones, triazine derivatives, zinc complexes and aluminium complexes.

For the purposes of this application, an aromatic ketone is taken to mean a carbonyl group to which two aromatic or heteroaromatic groups or aromatic or heteroaromatic ring systems are bonded directly. Aromatic sulfones and sulfoxides are defined correspondingly. For the purposes of this application, an aromatic phosphine oxide is taken to mean a phosphine oxide group to which three aromatic or heteroaromatic groups or aromatic or heteroaromatic ring systems are bonded directly.

In a preferred embodiment of the invention, the aromatic ketone is a compound of the following formula (1a) and the aromatic phosphine oxide is a compound of the following formula (1b):

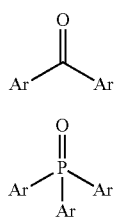

formula (1a)

formula (1b)

where the following applies to the symbols used:

Ar is on each occurrence, identically or differently, an aromatic or heteroaromatic ring system having 5 to 60 aromatic ring atoms, which may in each case be substituted by one or more groups $R^1$;

$R^1$ is on each occurrence, identically or differently, H, D, F, Cl, Br, I, CHO, C($=$O)Ar$^1$, P($=$O)(Ar$^1$)$_2$, S($=$O) Ar$^1$, S($=$O)$_2$Ar$^1$, CR$^2$$=$CR$^2$Ar$^1$, CN, NO$_2$, Si(R$^2$)$_3$, B(OR$^2$)$_2$, B(R$^2$)$_2$, B(N(R$^2$)$_2$)$_2$, OSO$_2$R$^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals R$^2$, where one or more non-adjacent CH$_2$ groups may be replaced by R$^2$C$=$CR$^2$, C$\equiv$C, Si(R$^2$)$_2$, Ge(R$^2$)$_2$, Sn(R$^2$)$_2$, C$=$O, C$=$S, C$=$Se, C$=$NR$^2$, P($=$O)(R$^2$), SO, SO$_2$, NR$^2$, O, S or CONR$^2$ and where one or more H atoms may be replaced by F, Cl, Br, I, CN or NO$_2$, or an aromatic or heteroaromatic ring system having 5 to 60 aromatic ring atoms, which may in each case be substituted by one or more radicals R$^2$, or an aryloxy or heteroaryloxy group having 5 to 60 aromatic ring atoms, which may be substituted by one or more radicals R$^2$, or a combination of these systems; two or more adjacent substituents R$^1$ here may also form a mono- or polycyclic, aliphatic or aromatic ring system with one another;

Ar$^1$ is on each occurrence, identically or differently, an aromatic or heteroaromatic ring system having 5 to 40 aromatic ring atoms, which may be substituted by one or more radicals R$^2$;

R$^2$ is on each occurrence, identically or differently, H, D, CN or an aliphatic, aromatic and/or heteroaromatic hydrocarbon radical having 1 to 20 C atoms, in which, in addition, H atoms may be replaced by F; two or more adjacent substituents R$^2$ here may also form a mono- or polycyclic, aliphatic or aromatic ring system with one another.

For the purposes of this invention, an aryl group contains at least 6 C atoms; for the purposes of this invention, a heteroaryl group contains at least 2 C atoms and at least one heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, pyrene, quinoline, isoquinoline, etc.

For the purposes of this invention, an aromatic ring system contains at least 6 C atoms in the ring system. For the purposes of this invention, a heteroaromatic ring system contains at least 2 C atoms and at least one heteroatom in the ring system, with the proviso that the sum of C atoms and heteroatoms is at least 5. The heteroatoms are preferably selected from N, O and/or S. For the purposes of this invention, an aromatic or heteroaromatic ring system is intended to be taken to mean a system which does not necessarily contain only aryl or heteroaryl groups, but instead in which, in addition, a plurality of aryl or heteroaryl groups may be interrupted by a short non-aromatic unit (preferably less than 10% of the atoms other than H), such as, for example, an sp$^3$-hybridised C, N or O atom or a carbonyl group. Thus, for example, systems such as 9,9'-spirobifluorene, 9,9-diarylfluorene, triarylamine, diaryl ether, stilbene, benzophenone, etc., are also intended to be taken to be aromatic ring systems for the purposes of this invention. An aromatic or heteroaromatic ring system is likewise taken to mean systems in which a plurality of aryl or heteroaryl groups are linked to one another by single bonds, for example biphenyl, terphenyl or bipyridine.

For the purposes of the present invention, a $C_1$- to $C_{40}$-alkyl group, in which, in addition, individual H atoms or CH$_2$ groups may be substituted by the above-mentioned groups, is particularly preferably taken to mean the radicals methyl, ethyl, n-propyl, i-propyl, n-butyl, i-butyl, s-butyl, t-butyl, 2-methylbutyl, n-pentyl, s-pentyl, t-pentyl, 2-pentyl, neopentyl, cyclopentyl, n-hexyl, s-hexyl, t-hexyl, 2-hexyl, 3-hexyl, neohexyl, cyclohexyl, 2-methyl-pentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo-[2.2.2]octyl, 2-(2,6-dimethyl)octyl, 3-(3,7-dimethyl)octyl, trifluoromethyl, pentafluoroethyl and 2,2,2-trifluoroethyl. A C$_2$- to C$_{40}$-alkenyl group is preferably taken to mean ethenyl, propenyl, butenyl, pentenyl, cyclopentenyl, hexenyl, cyclohexenyl, heptenyl, cycloheptenyl, octenyl or cyclooctenyl. A C$_2$- to C$_{40}$-alkynyl group is preferably taken to mean ethynyl, propynyl, butynyl, pentynyl, hexynyl, heptynyl or octynyl. A C$_1$- to C$_{40}$-alkoxy group is preferably taken to mean methoxy, trifluoromethoxy, ethoxy, n-propoxy, i-propoxy, n-butoxy, i-butoxy, s-butoxy, t-butoxy or 2-methylbutoxy. An aromatic or heteroaromatic ring system having 5-60 aromatic ring atoms, which may also in each case be substituted by the above-mentioned radicals R and which may be linked to the aromatic or heteroaromatic ring system via any desired positions, is taken to mean, in particular, groups derived from benzene, naphthalene, anthracene, phenanthrene, benzanthracene, benzophenanthrene, pyrene, chrysene, perylene, fluoranthene, benzofluoranthene, naphthacene, pentacene, benzopyrene, biphenyl, biphenylene, terphenyl, terphenylene, fluorene, benzofluorene, dibenzofluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

Suitable compounds of the formula (1a) are, in particular, the ketones disclosed in WO 04/093207 and in the unpublished DE 102008033943.1 and suitable compounds of the formula (1b) are the phosphine oxides disclosed in WO 05/003253. These are incorporated into the present invention by way of reference.

It is evident from the definition of the compounds of the formulae (1a) and (1b) that they do not have to contain just one carbonyl or phosphine oxide group, but instead may also contain a plurality of these groups.

The group Ar in compounds of the formulae (1a) and (1b) is preferably an aromatic ring system having 6 to 40 aromatic ring atoms, i.e. it does not contain any heteroaryl groups. As defined above, the aromatic ring system does not necessarily have to contain only aromatic groups, but instead two aryl groups may also be interrupted by a non-aromatic group, for example by a further carbonyl group or phosphine oxide group.

In a further preferred embodiment of the invention, the group Ar contains not more than two condensed rings. It is thus preferably built up only from phenyl and/or naphthyl groups, particularly preferably only from phenyl groups, but does not contain any larger condensed aromatic groups, such as, for example, anthracene.

Preferred groups Ar which are bonded to the carbonyl group are phenyl, 2-, 3- or 4-tolyl, 3- or 4-o-xylyl, 2- or 4-m-xylyl, 2-p-xylyl, o-, m- or p-tert-butylphenyl, o-, m- or p-fluorophenyl, benzophenone, 1-, 2- or 3-phenyl-methanone, 2-, 3- or 4-biphenyl, 2-, 3- or 4-o-terphenyl, 2-, 3- or 4-m-terphenyl, 2-, 3- or 4-p-terphenyl, 2'-p-terphenyl, 2'-, 4'- or 5'-m-terphenyl, 3'- or 4'-o-terphenyl, p-, m,p-, o,p-, m,m-, o,m- or o,o-quaterphenyl, quinquephenyl, sexiphenyl, 1-, 2-, 3- or 4-fluorenyl, 2-, 3- or 4-spiro-9,9'-bifluorenyl, 1-, 2-, 3- or 4-(9,10-dihydro)phenanthrenyl, 1- or 2-naphthyl, 2-, 3-, 4-, 5-, 6-, 7- or 8-quinolinyl, 1-, 3-, 4-, 5-, 6-, 7- or 8-isoquinolinyl, 1- or 2-(4-methylnaphthyl), 1- or 2-(4-phenylnaphthyl), 1- or 2-(4-naphthylnaphthyl), 1-, 2- or 3-(4-naphthylphenyl), 2-, 3- or 4-pyridyl, 2-, 4- or 5-pyrimidinyl, 2- or 3-pyrazinyl, 3- or 4-pyridazinyl, 2-(1,3,5-triazin)yl, 2-, 3- or 4-(phenylpyridyl), 3-, 4-, 5- or 6-(2,2'-bipyridyl), 2-, 4-, 5- or 6-(3,3'-bipyridyl), 2- or 3-(4,4'-bipyridyl), and combinations of one or more of these radicals.

The groups Ar may, as described above, be substituted by one or more radicals R$^1$. These radicals R$^1$ are preferably selected, identically or differently on each occurrence, from the group consisting of H, F, C(=O)Ar$^1$, P(=O)(Ar$^1$)$_2$, S(=O)Ar$^1$, S(=O)$_2$Ar$^1$, a straight-chain alkyl group having 1 to 4 C atoms or a branched or cyclic alkyl group having 3 to 5 C atoms, each of which may be substituted by one or more radicals R$^2$, where one or more H atoms may be replaced by F, or an aromatic ring system having 6 to 24 aromatic ring atoms, which may be substituted by one or more radicals R$^2$, or a combination of these systems; two or more adjacent substituents R$^1$ here may also form a mono- or polycyclic, aliphatic or aromatic ring system with one another. If the organic electroluminescent device is applied from solution, straight-chain, branched or cyclic alkyl groups having up to 10 C atoms are also preferred as substituents R$^1$. The radicals R$^1$ are particularly preferably selected, identically or differently on each occurrence, from the group consisting of H, C(=O)Ar$^1$ or an aromatic ring system having 6 to 24 aromatic ring atoms, which may be substituted by one or more radicals R$^2$, but is preferably unsubstituted.

In a further preferred embodiment of the invention, the group Ar$^1$ is, identically or differently on each occurrence, an aromatic ring system having 6 to 24 aromatic ring atoms, which may be substituted by one or more radicals R$^2$. Ar$^1$ is particularly preferably, identically or differently on each occurrence, an aromatic ring system having 6 to 12 aromatic ring atoms.

Particularly preferred aromatic ketones are benzophenone derivatives which are substituted in each of the 3,5,3',5'-positions by an aromatic or heteroaromatic ring system having 5 to 30 aromatic ring atoms, which may in turn be substituted by one or more radicals R$^1$ as defined above. Preference is furthermore given to ketones and phosphine oxides which are substituted by at least one spirobifluorene group.

Preferred aromatic ketones are therefore the compounds of the following formulae (2) to (5):

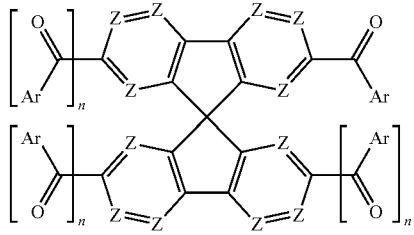
Formel (2)

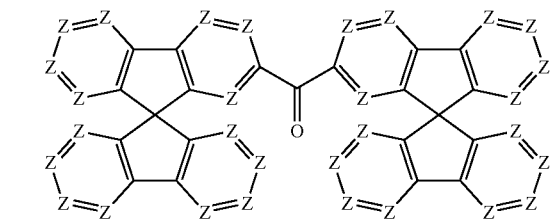
Formel (3)

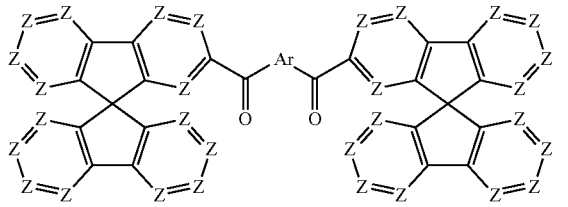
Formel (4)

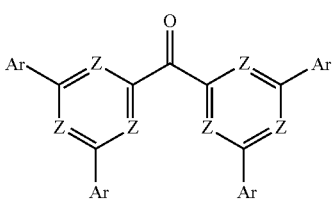
Formel (5)

where Ar and $R^1$ have the same meaning as described above, and furthermore:

Z is, identically or differently on each occurrence, $CR^1$ or N;

n is, identically or differently on each occurrence, 0 or 1.

Ar in the formulae (2), (4) and (5) given above preferably stands for an aromatic or heteroaromatic ring system having 1 to 30 aromatic ring atoms, which may be substituted by one or more radicals $R^1$. The groups Ar mentioned above are particularly preferred.

Examples of suitable compounds of the formula (1a) are compounds (1) to (59) depicted below.

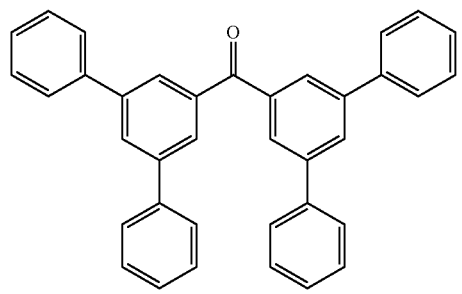
(1)

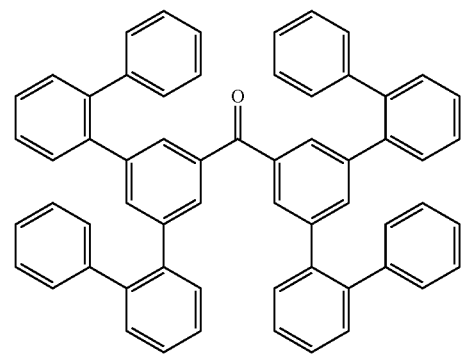
(2)

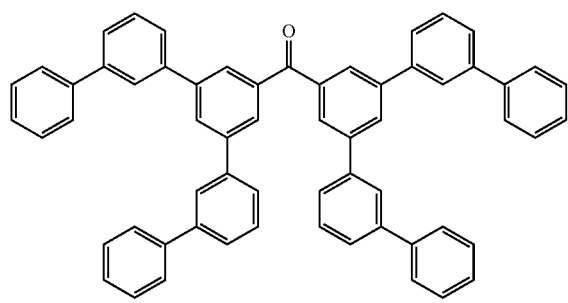
(3)

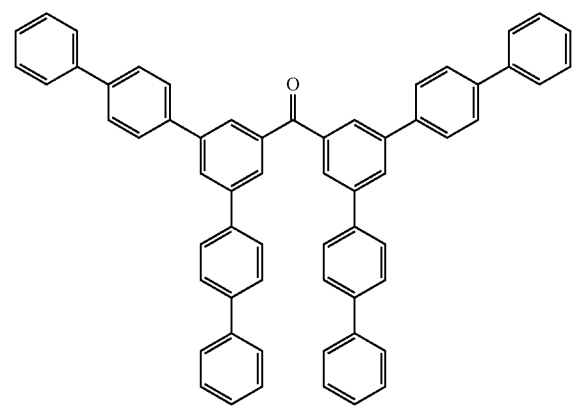
(4)

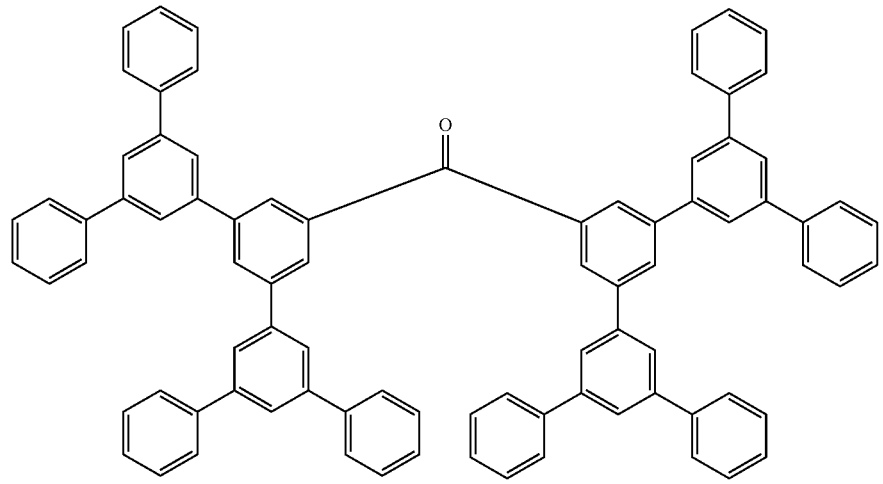
(5)
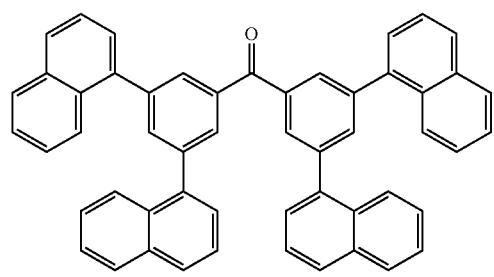
(6)
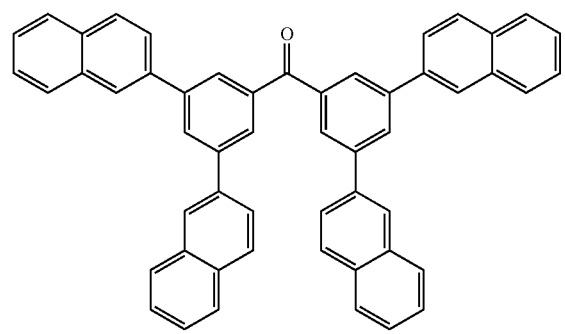
(7)
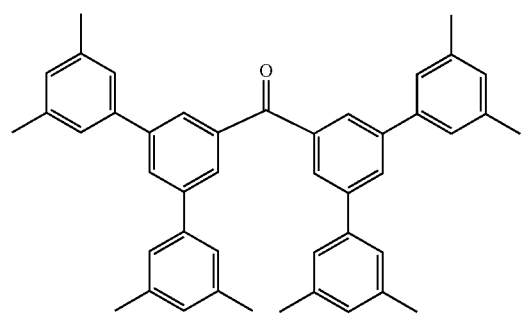
(8)
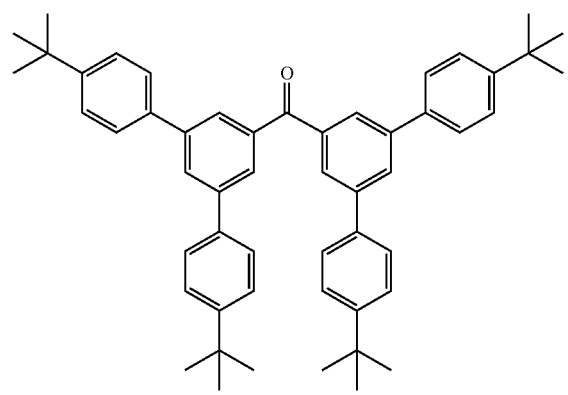
(9)
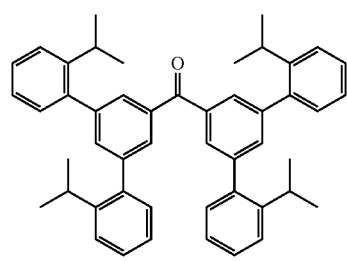
(10)
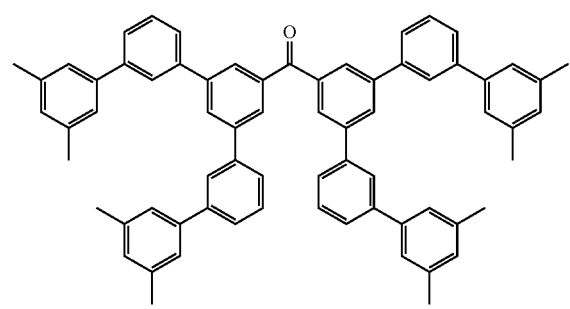
(11)

-continued
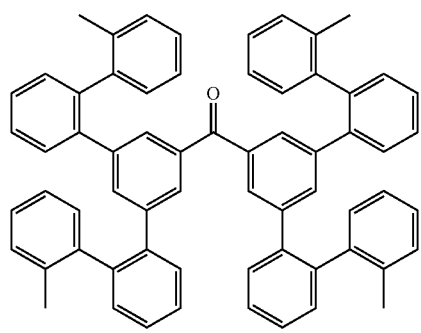
(12)
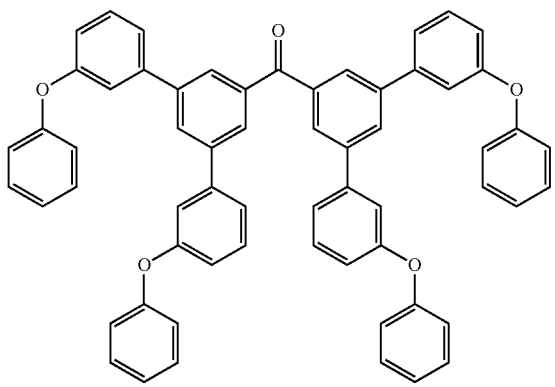
(13)
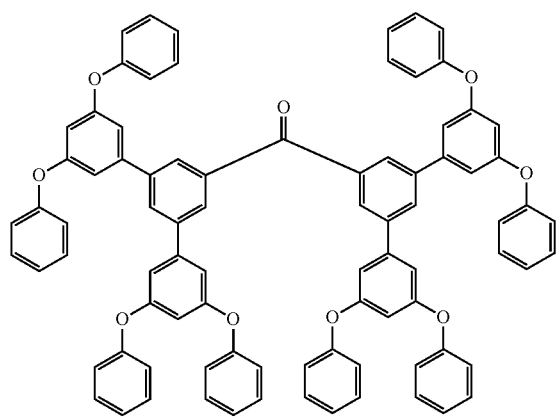
(14)
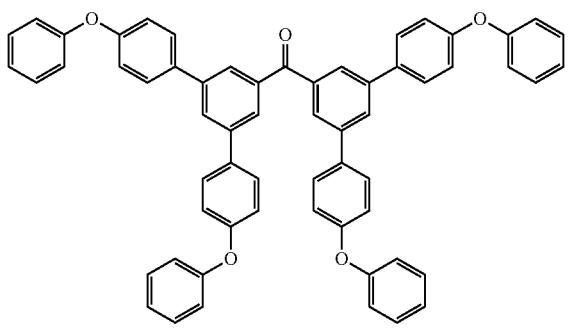
(15)
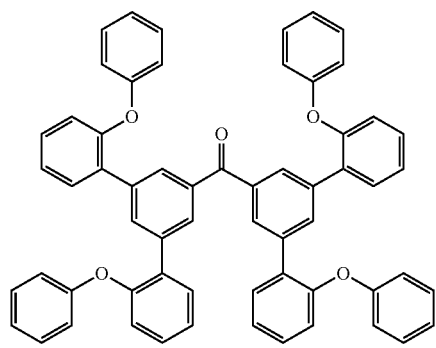
(16)
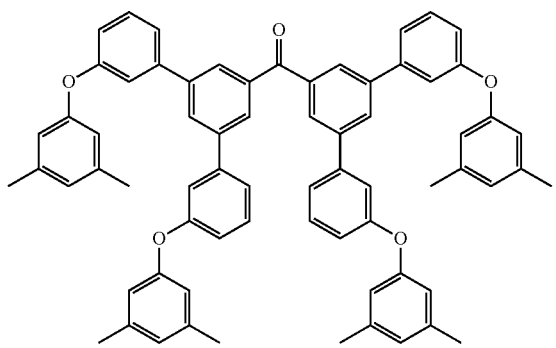
(17)
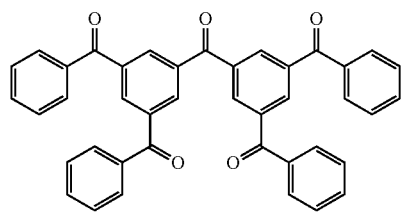
(18)
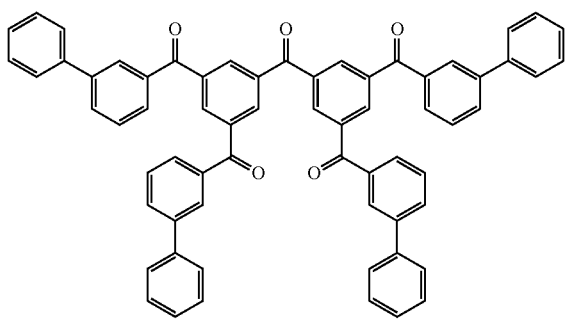
(19)

-continued
(20)
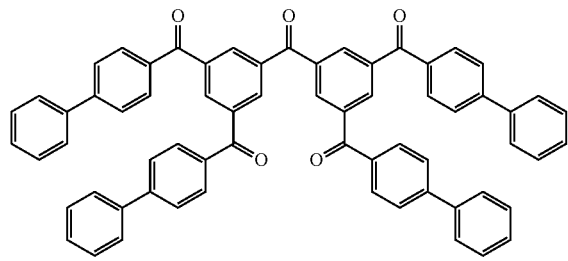
(21)
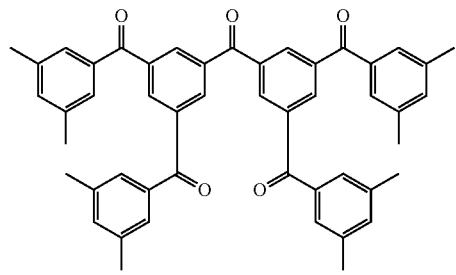
(22)
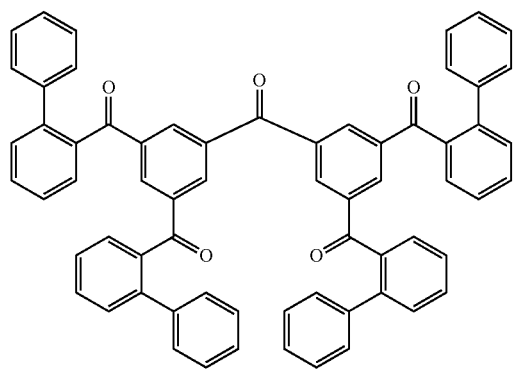
(23)
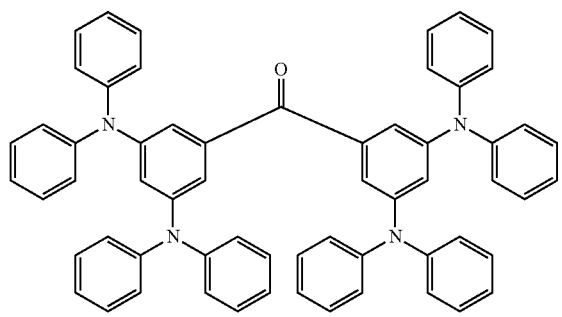
(24)
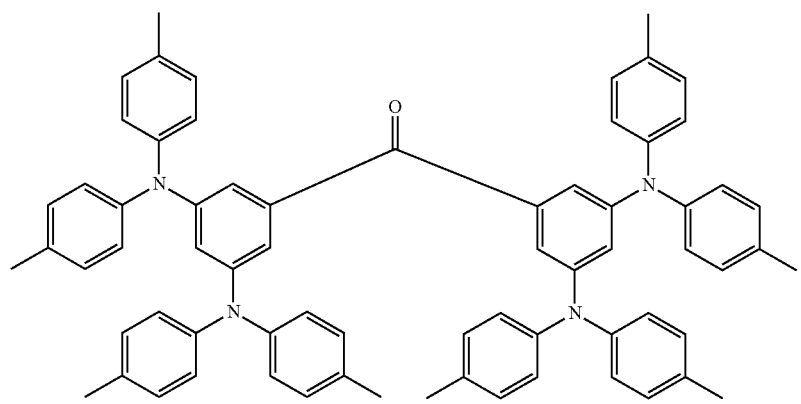
(25)
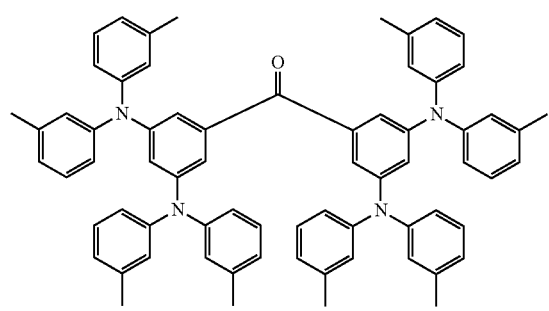
(26)
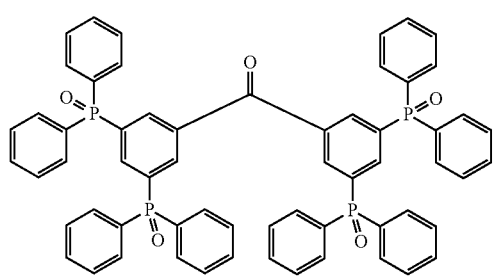

-continued
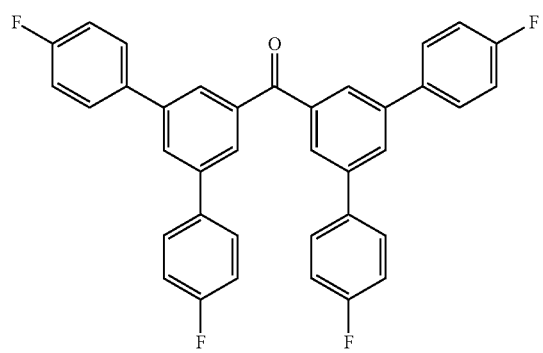 (27)
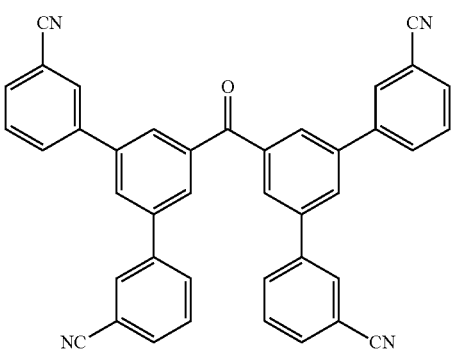 (28)
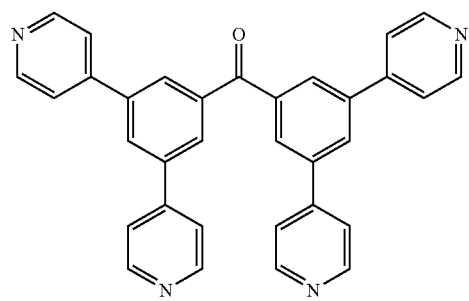 (29)
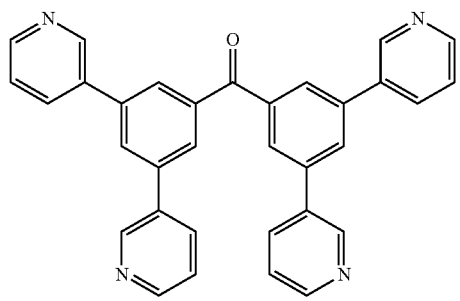 (30)
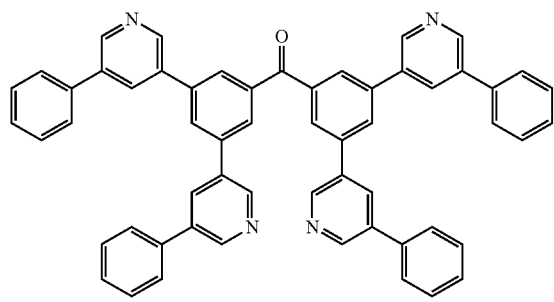 (31)
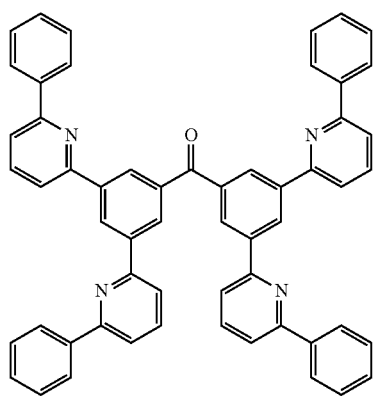 (32)
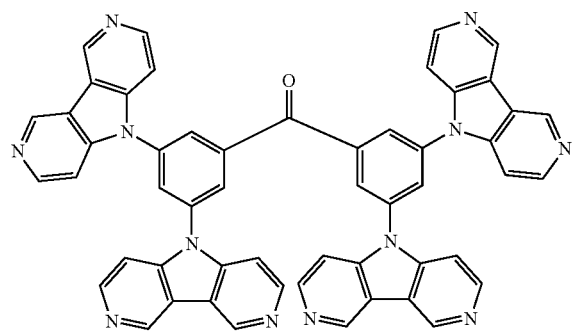 (33)
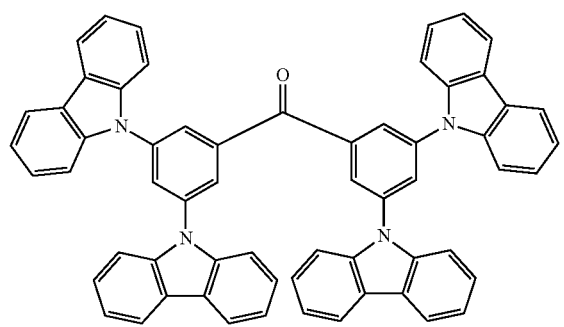 (34)

-continued
(35)
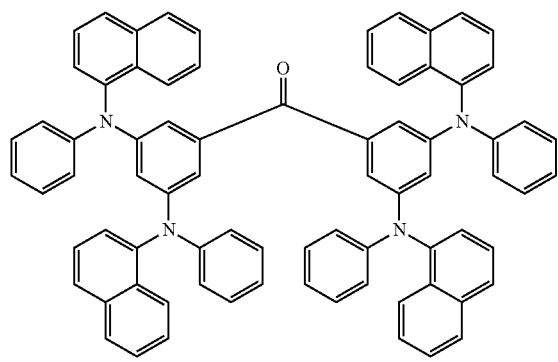
(36)
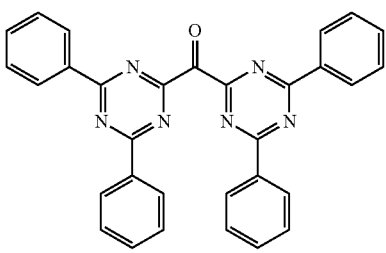
(37)
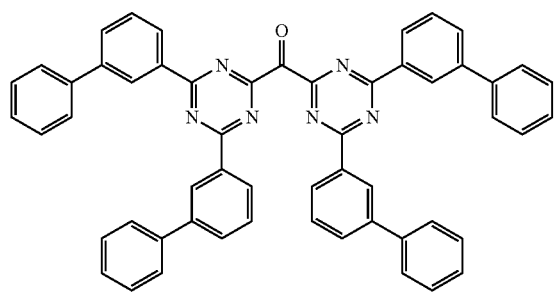
(38)
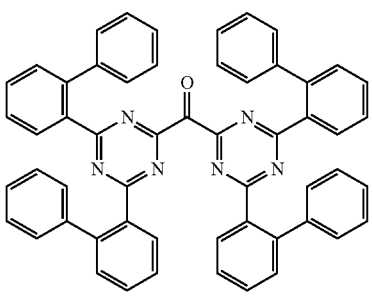
(39)
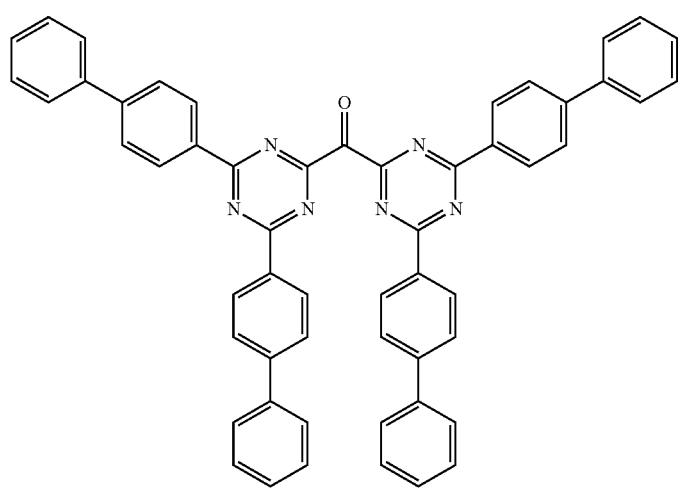

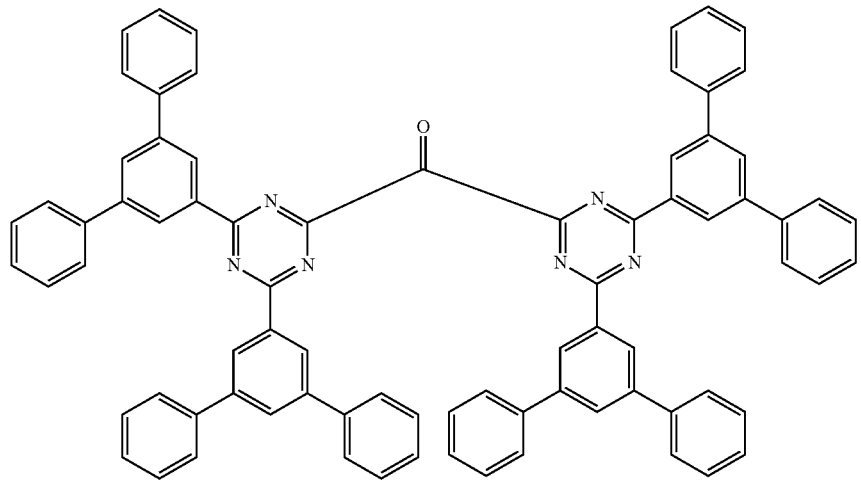
(40)
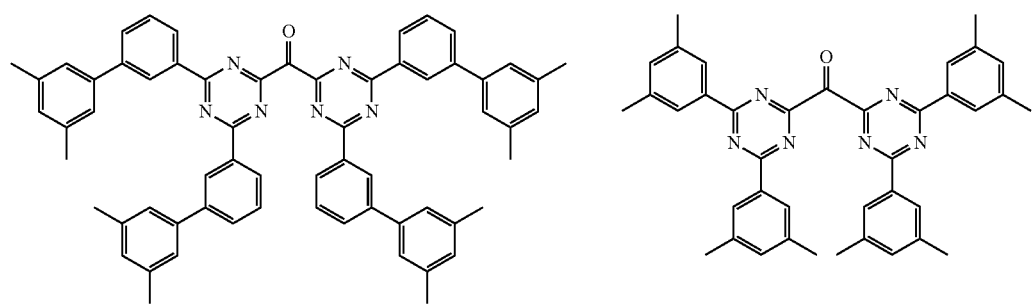
(41)                       (42)
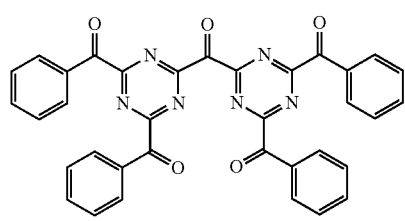
(43)
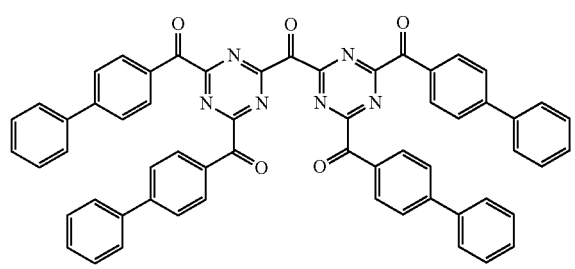
(44)
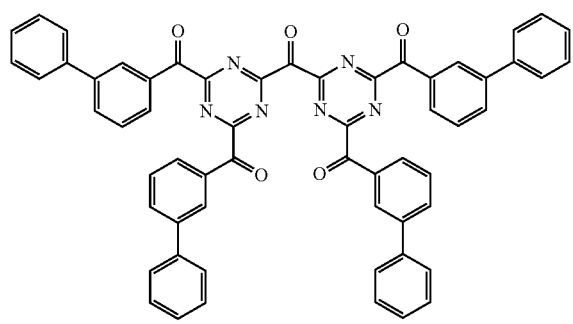
(45)
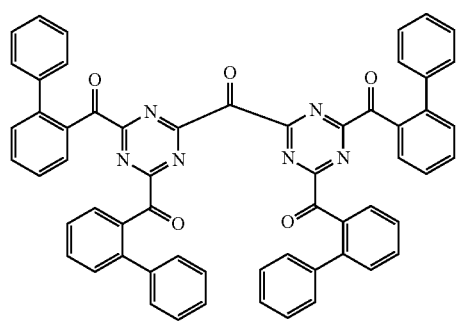
(46)

-continued
(47)
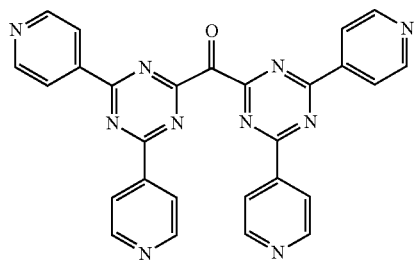
(48)
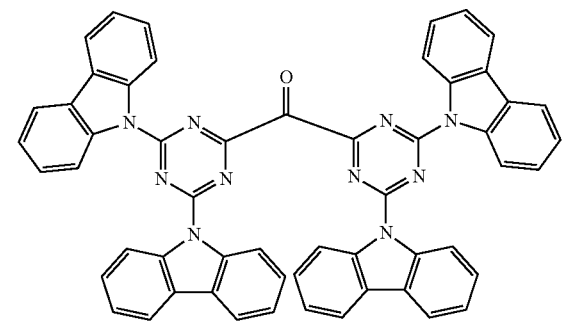
(49)
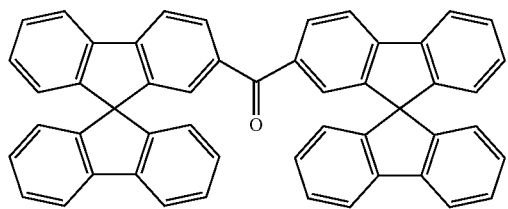
(50)
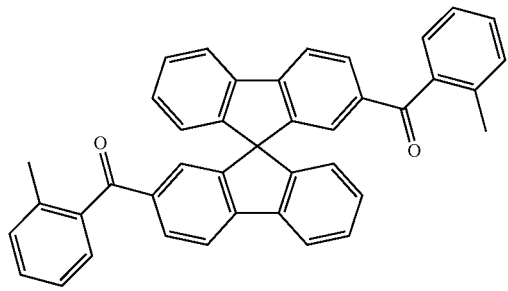
(51)
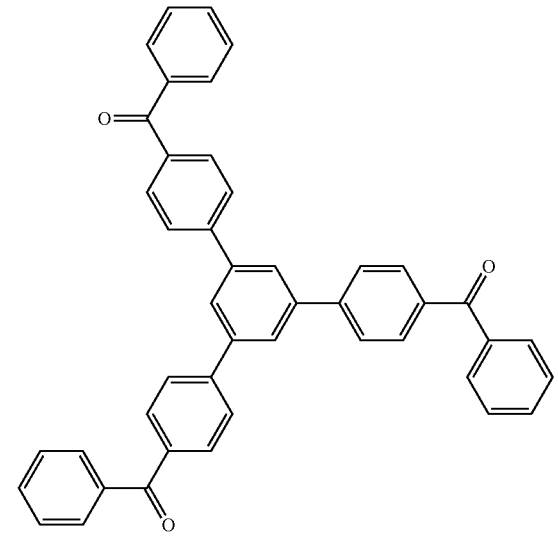
(52)
(53)
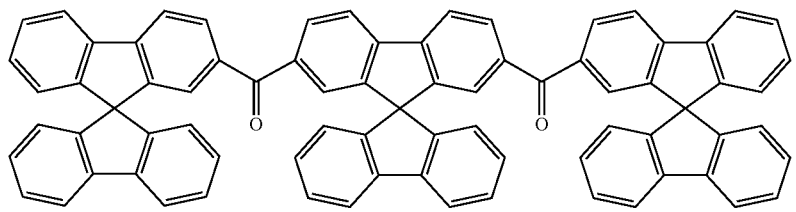
(54)
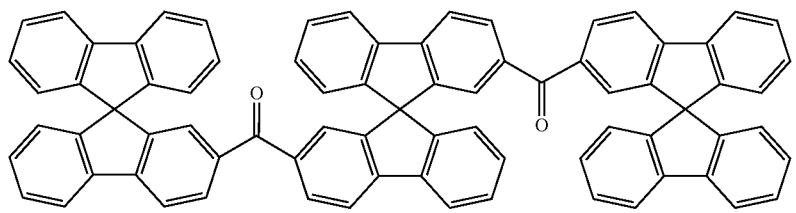

-continued
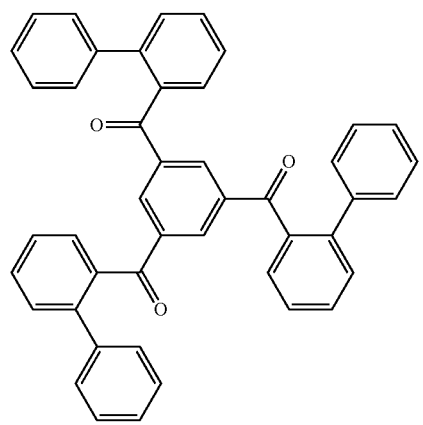
(55)
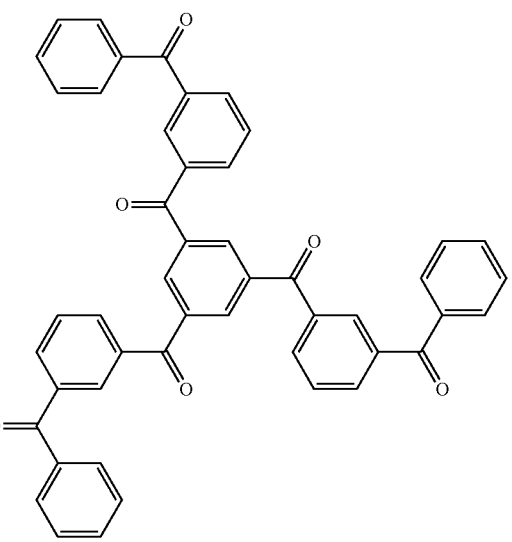
(56)
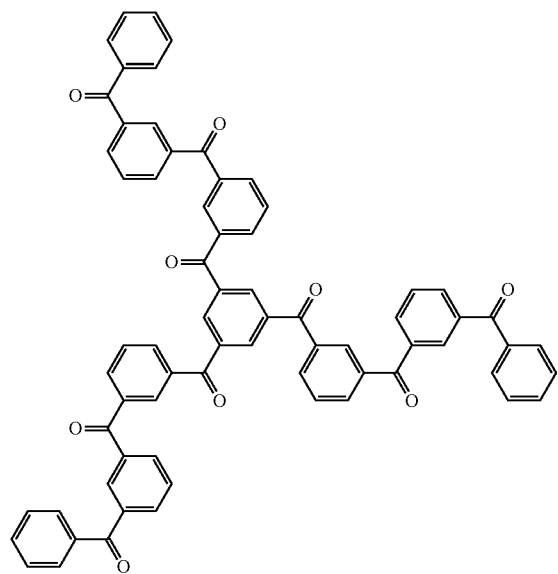
(57)
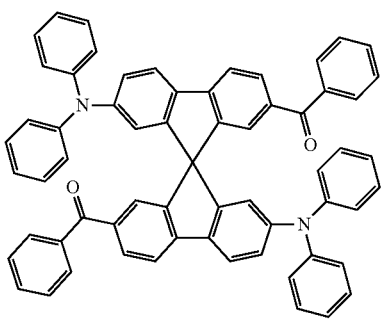
(58)
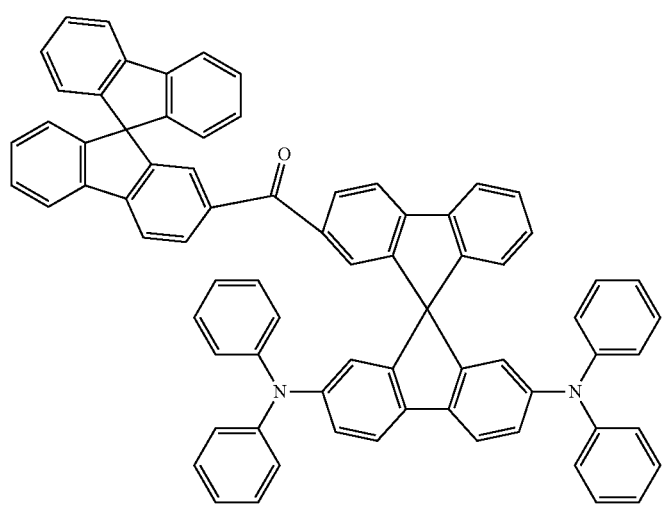
(59)

Examples of suitable aromatic phosphine oxide derivatives are compounds (1) to (17) depicted below.
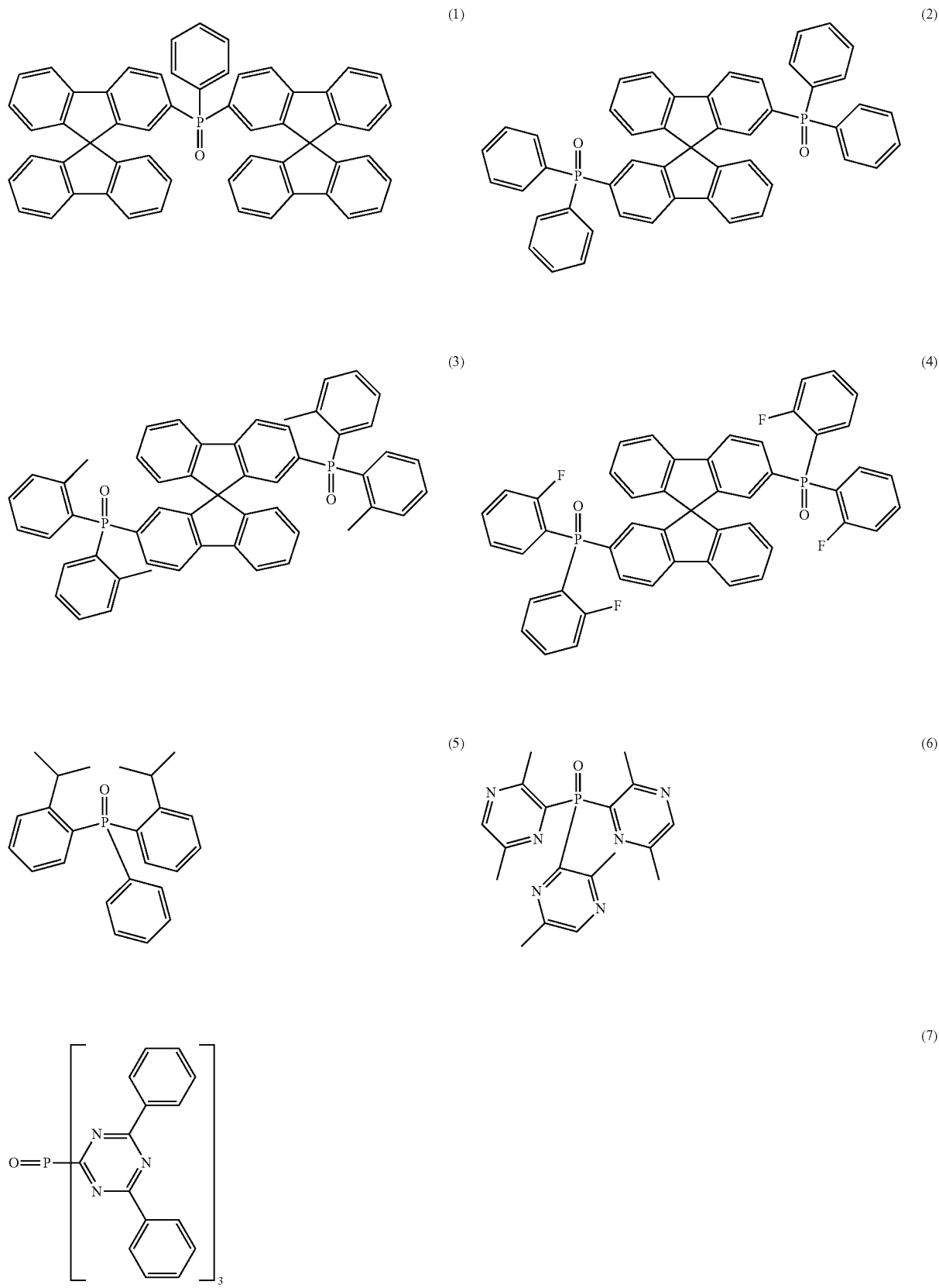

-continued
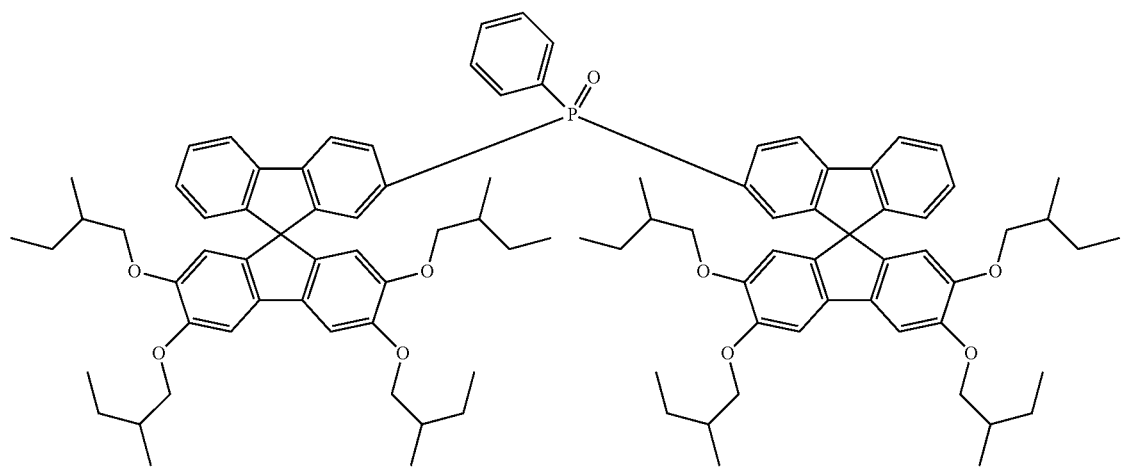
(8)
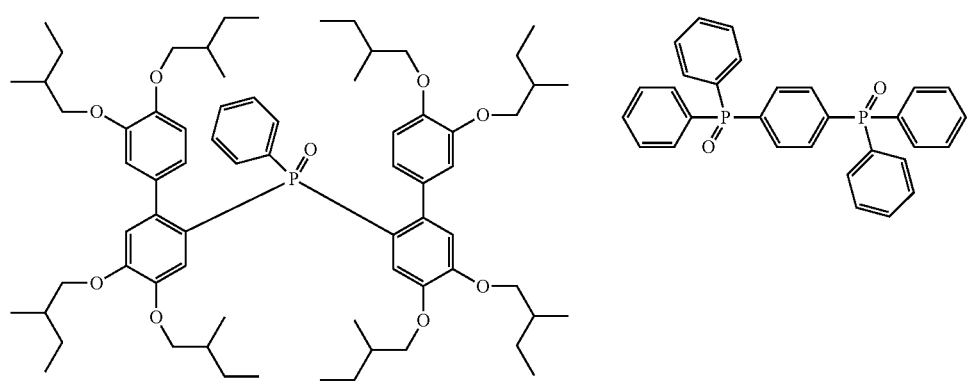
(9)
(10)
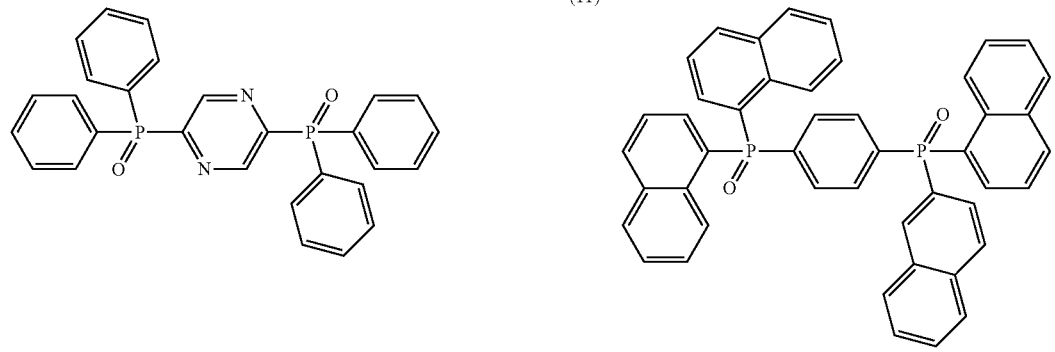
(11)
(12)
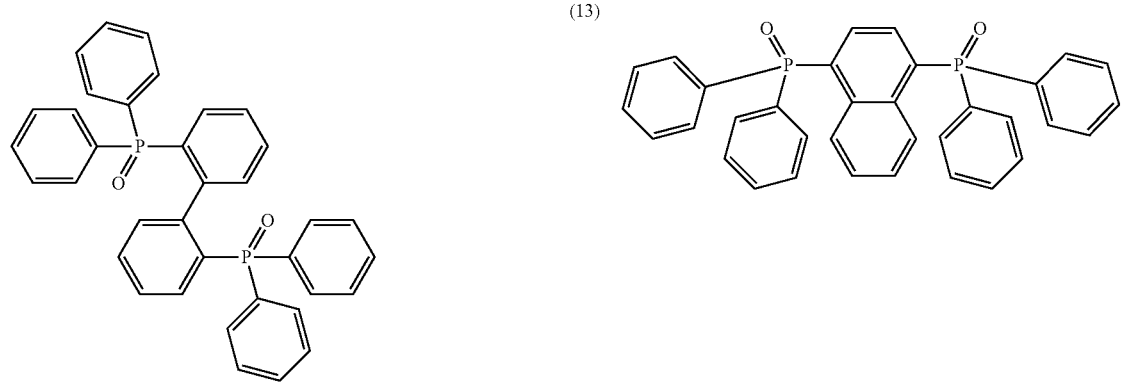
(13)
(14)

-continued

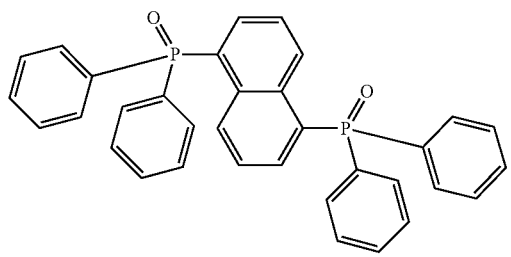
(15)

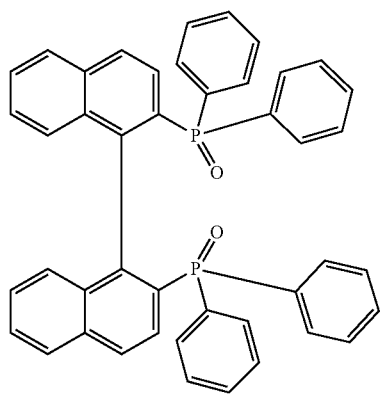
(16)

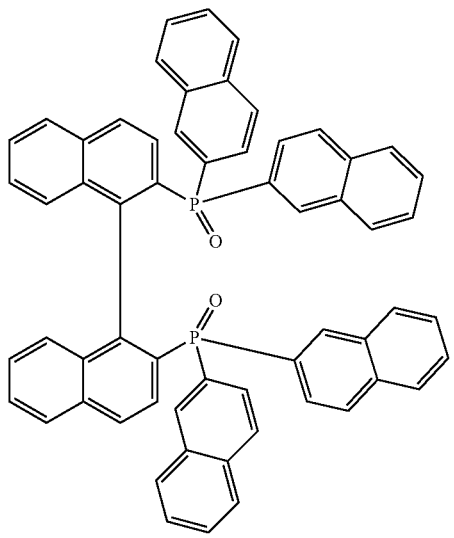
(17)

Suitable triazine derivatives which can be used as matrix material A are, in particular, 1,3,5-triazines which are substituted by at least one, preferably at least two, particularly preferably by three, aromatic or heteroaromatic ring systems. Particular preference is thus given to compounds of the following formula (6) or (7):

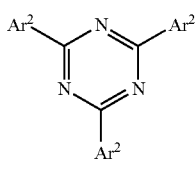
formula (6)

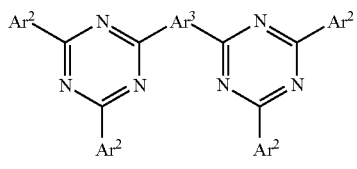
formula (7)

where $R^1$ has the meaning indicated above, and the following applies to the other symbols used:

$Ar^2$ is, identically or differently on each occurrence, a monovalent aromatic or heteroaromatic ring system having 5 to 60 aromatic ring atoms, which may in each case be substituted by one or more radicals $R^1$;

$Ar^3$ is a divalent aromatic or heteroaromatic ring system having 5 to 60 aromatic ring atoms, which may be substituted by one or more radicals $R^1$.

In compounds of the formulae (6) and (7), it is preferred for at least one group $Ar^2$ to be selected from the groups of the following formulae (8) to (14) and for the other groups $Ar^2$ to have the meaning indicated above.

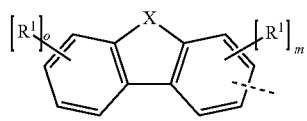
formula (8)

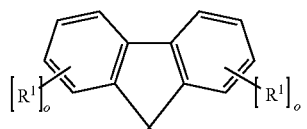
formula (9)

formula (10)
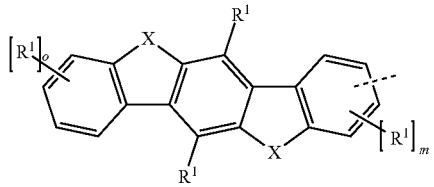

formula (11)
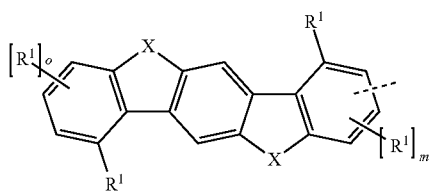

formula (12)
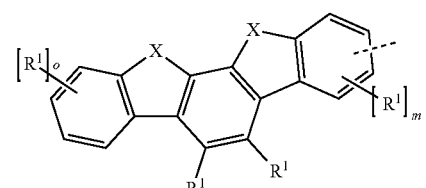

formula (13)
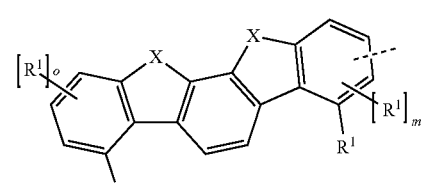

formula (14)
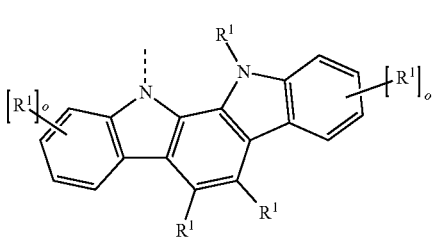

where R¹ has the same meaning as described above, the dashed bond represents the link to the triazine unit, and furthermore:

X is, identically or differently on each occurrence, a divalent bridge selected from B(R¹), C(R¹)₂, Si(R¹)₂, C=O, C=NR¹, C=C(R¹)₂, O, S, S=O, SO₂, N(R¹), P(R¹) and P(=O)R¹;

m is on each occurrence, identically or differently, 0, 1, 2 or 3;

o is on each occurrence, identically or differently, 0, 1, 2, 3 or 4.

Particularly preferred groups Ar² are selected from the groups of the following formulae (8a) to (14a):

formula (8a)
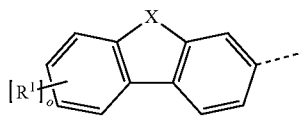

formula (9a)
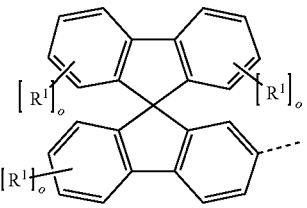

formula (10a)
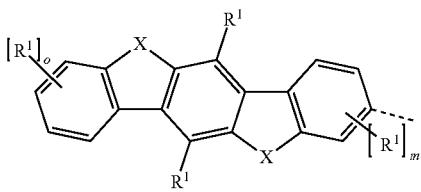

formula (11a)
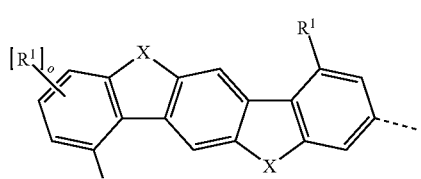

formula (12a)
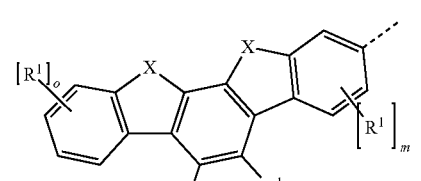

formula (13a)
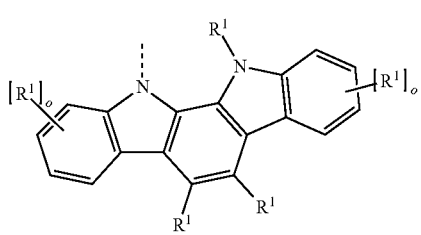

formula (14a)
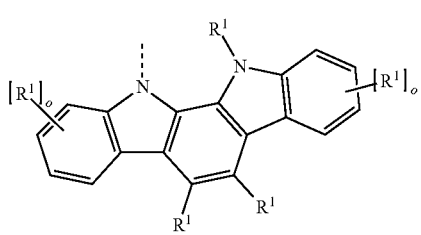

where the symbols and indices used have the same meaning as described above. X here is preferably selected, identically or differently, from C(R¹)₂, N(R¹), O and S, particularly preferably C(R¹)₂.

Preferred groups Ar³ in compounds of the formula (7) are selected from the groups of the following formulae (15) to (21):

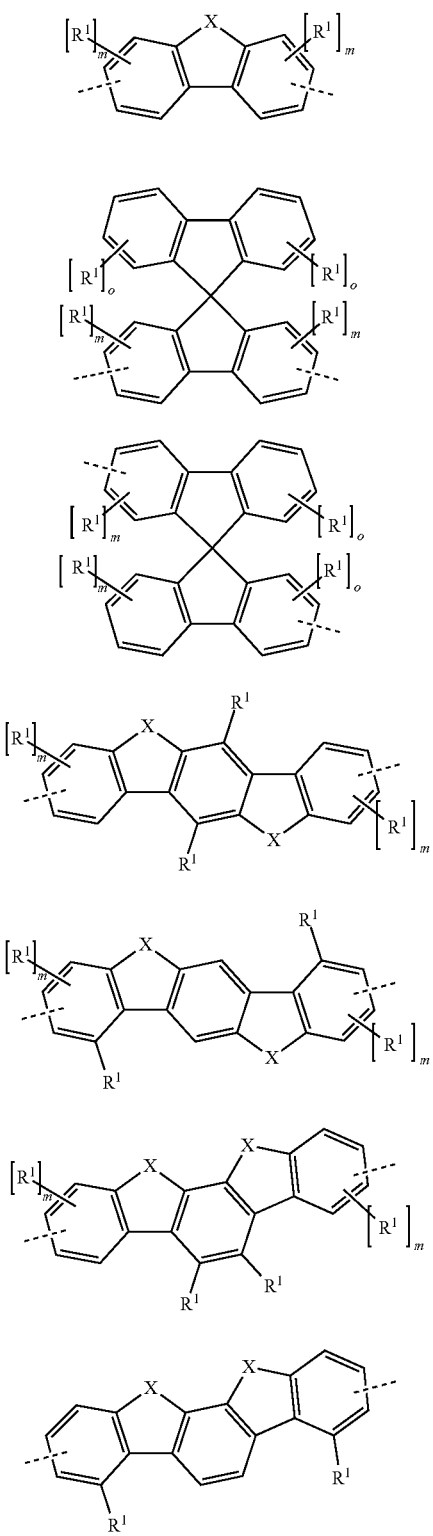
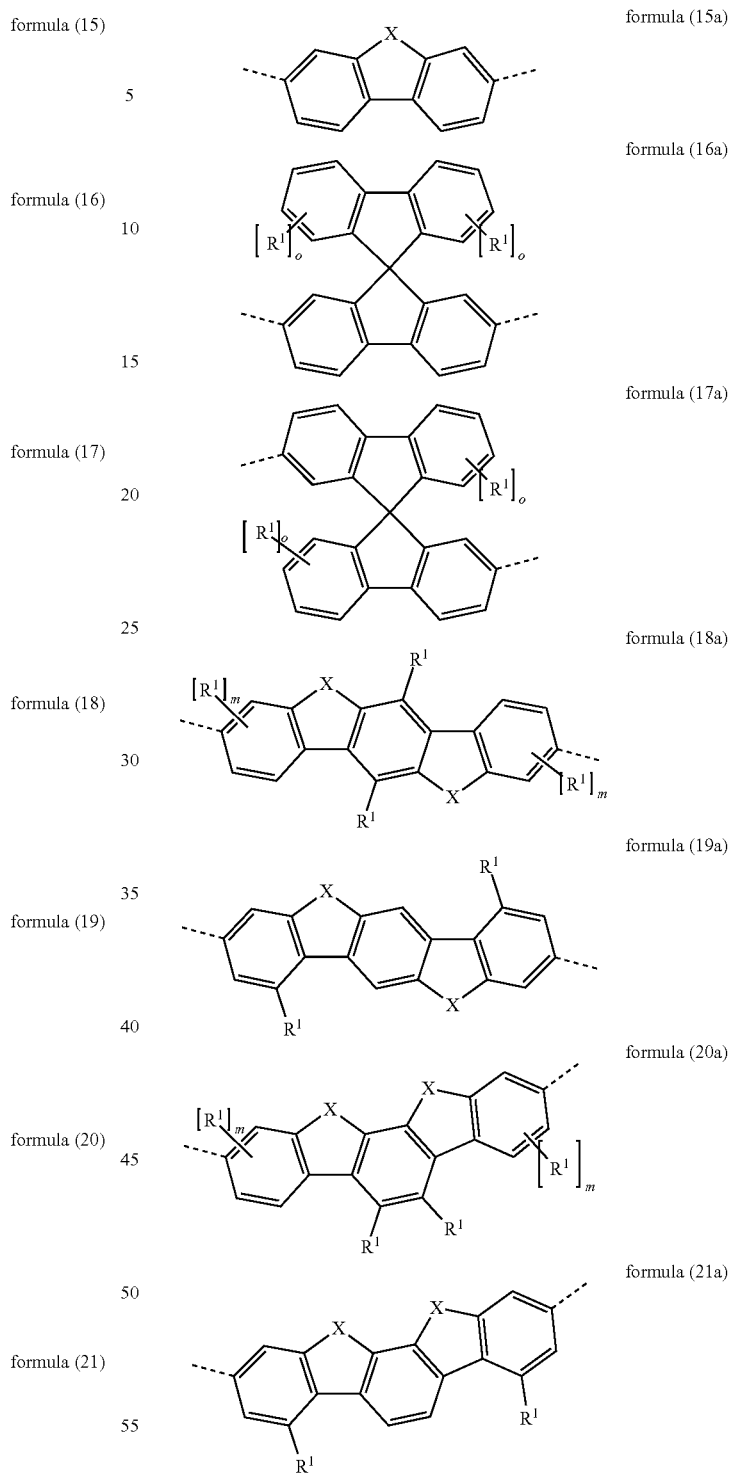

where the symbols and indices used have the same meaning as described above, and the dashed bond represents the link to the two triazine units.

Particularly preferred groups $Ar^3$ are selected from the groups of the following formulae (15a) to (21a):

where the symbols and indices used have the same meaning as described above. X here is preferably selected, identically or differently, from $C(R^1)_2$, $N(R^1)$, O and S, particularly preferably $C(R^1)_2$.

Preference is furthermore given to compounds of the formula (7) given above in which the group $Ar^3$ is selected from the formulae (15) to (21) given above, and $Ar^2$ is selected, identically or differently on each occurrence, from the formulae (8) to (14) given above or phenyl, 1- or 2-naphthyl, ortho-, meta- or para-biphenyl, each of which may be substituted by one or more radicals $R^1$, but are preferably unsubstituted.

As described above, matrix material B is a material which has an HOMO of −5.4 eV or less and which has an LUMO of −2.4 eV or more and which furthermore has an energy gap of 3.5 eV or more. In a preferred embodiment of the invention, matrix material B has an HOMO of −5.7 eV or less, particularly preferably −6.0 eV or less. Matrix material B furthermore preferably has an energy gap of 3.7 eV or more, particularly preferably 3.9 eV or more. Through the choice of materials having the above-mentioned conditions for HOMO, LUMO and energy gap, it is ensured that this material does not participate in the charge transport in the layer, or does not do so to a significant extent. Matrix material B furthermore preferably has an LUMO of −2.2 eV or more, particularly preferably −2.0 eV or more.

In a preferred embodiment of the invention, matrix material B is a diazaborole derivative, in particular an aromatic diazaborole derivative.

In a further preferred embodiment of the invention, matrix material B is a pure hydrocarbon, i.e. a material which is built up only from the atoms carbon and hydrogen and which does not contain any atoms other than carbon and hydrogen. In a particularly preferred embodiment of the invention, matrix material B is an aromatic hydrocarbon. This is characterised in that it contains aromatic groups. However, it may additionally also contain non-aromatic carbon atoms, for example alkyl groups.

In a particularly preferred embodiment of the invention, matrix material B is selected from the group consisting of diarylmethane derivatives, fluorene derivatives, spirobifluorene derivatives or diazaborole derivatives. Particularly suitable matrix materials B are thus compounds of the following formulae (22), (23), (24) and (25):

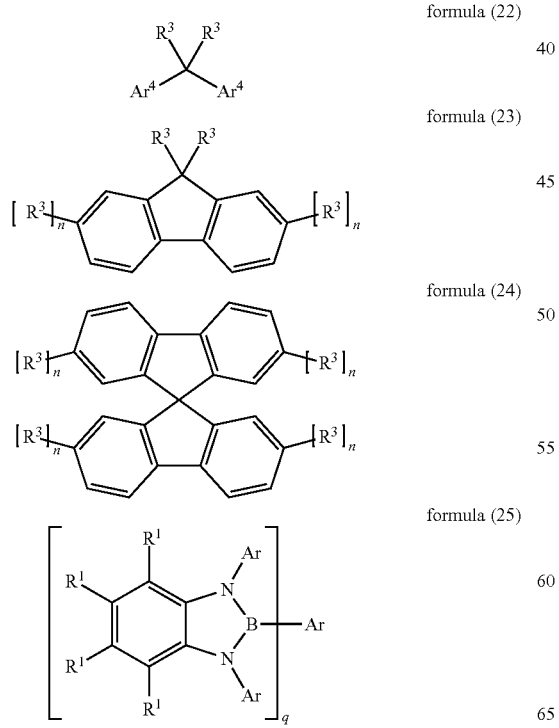

where Ar, $R^1$ and n have the meanings indicated above, and the other symbols used have the following meanings:

$Ar^4$ is on each occurrence, identically or differently, an aromatic ring system having 6 to 60 aromatic C atoms, which does not contain any non-aromatic groups other than carbon or hydrogen; $Ar^4$ here may be substituted by one or more radicals $R^4$;

$R^3$ is on each occurrence, identically or differently, a straight-chain alkyl group having 1 to 20 C atoms or a branched or cyclic alkyl group having 3 to 20 C atoms, or an aromatic ring system having 6 to 60 aromatic C atoms, which does not contain any non-aromatic groups other than carbon and hydrogen and which may be substituted by one or more radicals $R^4$; two or more radicals $R^3$ here may also form a ring system with one another;

$R^4$ is on each occurrence, identically or differently, a straight-chain alkyl group having 1 to 20 C atoms or a branched or cyclic alkyl group having 3 to 20 C atoms; two or more radicals $R^4$ here may also form a ring system with one another;

q is 1, 2, 3 or 4.

Examples of preferred matrix materials B of the formulae (22) to (25) given above are compounds (1) to (19) depicted below.

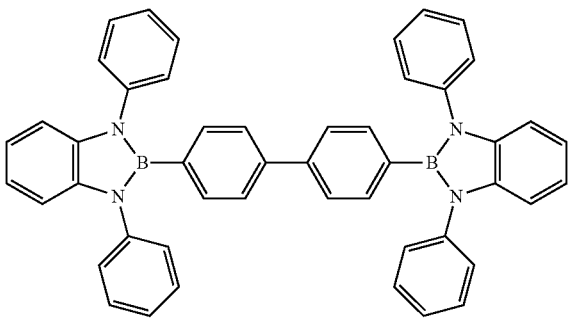

(1)

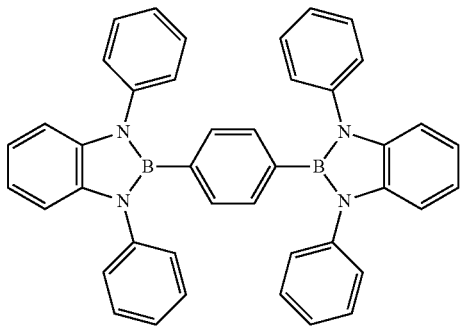

(2)

(3) 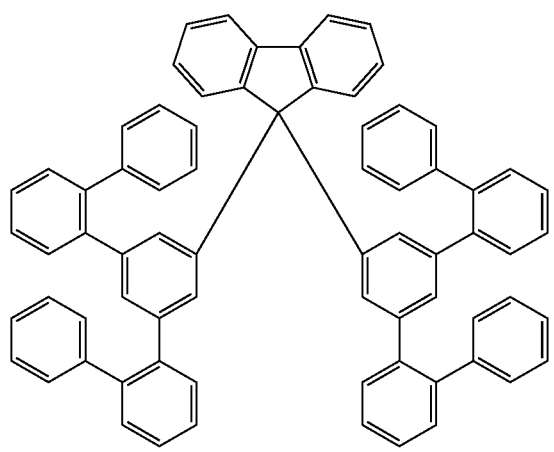
(4) 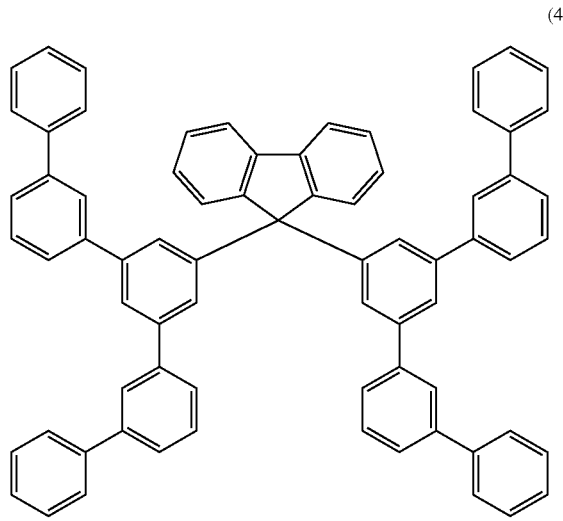
(5) 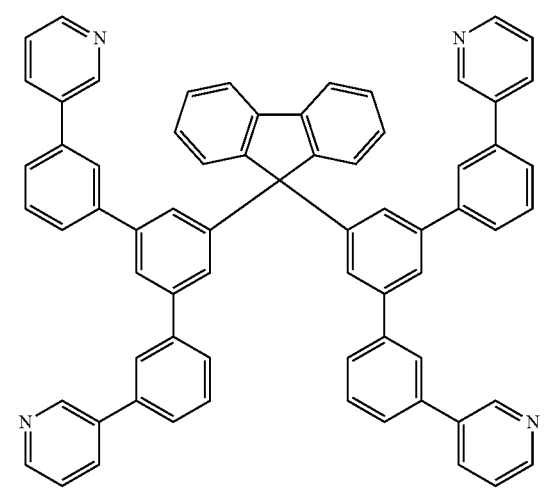
(6) 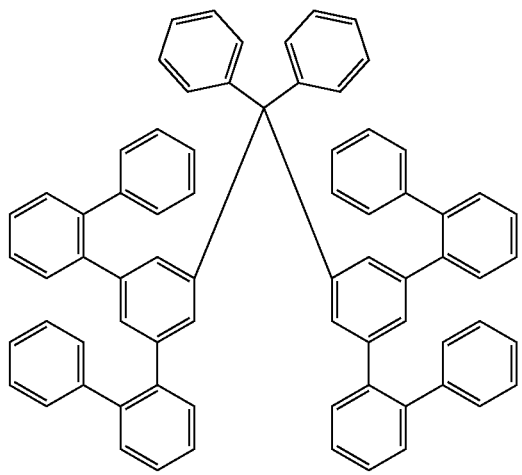
(7) 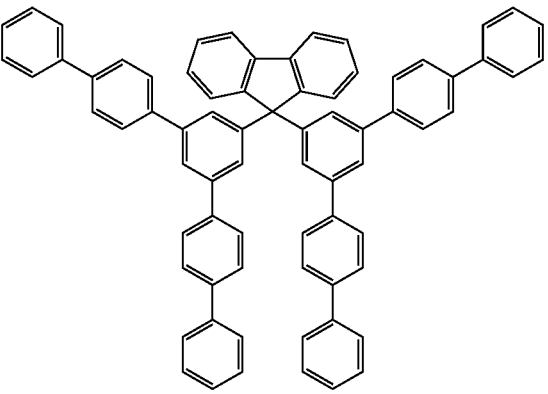
(8) 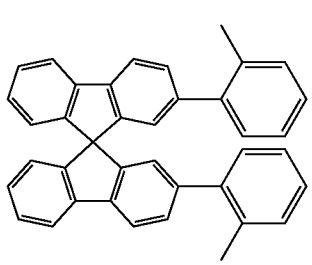
(9) 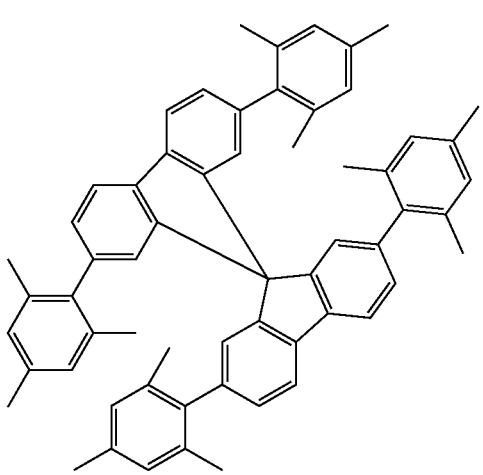

-continued
(10)
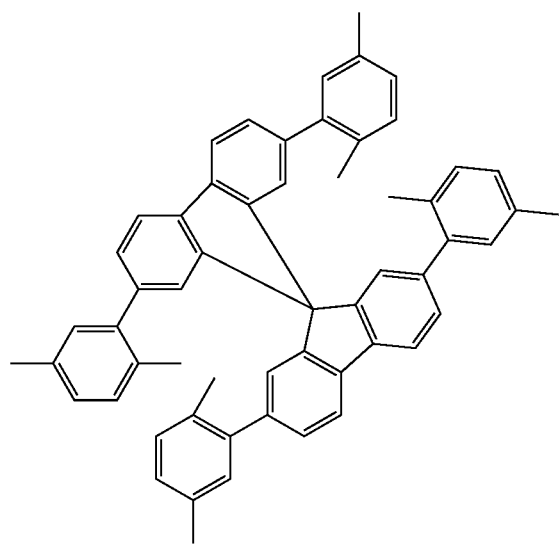
(11)
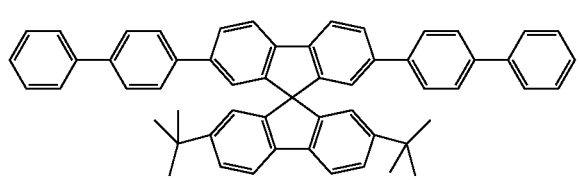
(12)
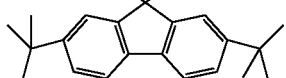
lp;1p
(13)
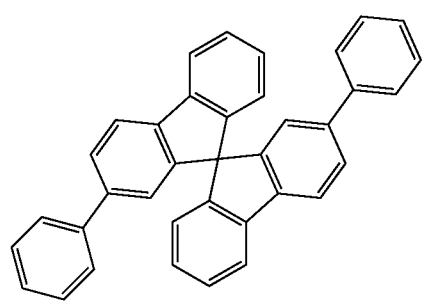
-continued
(14)
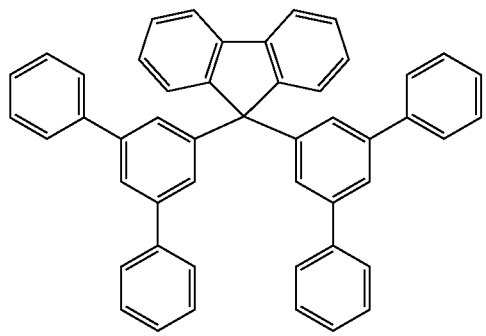
(15)
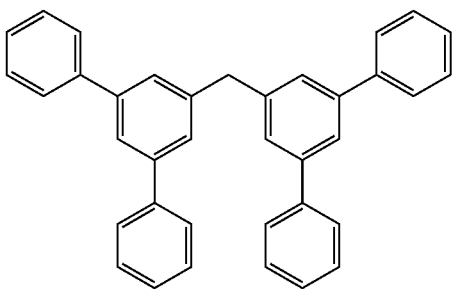
(16)
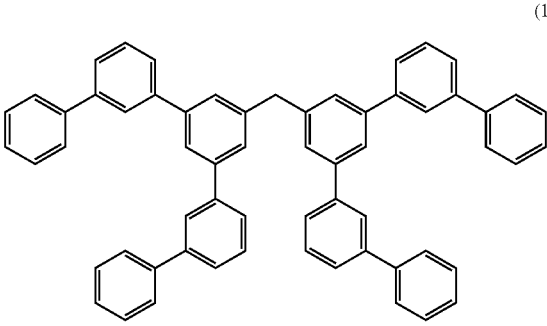
(17)
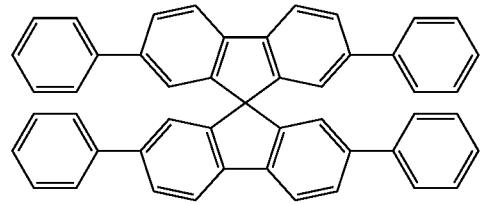
(18)
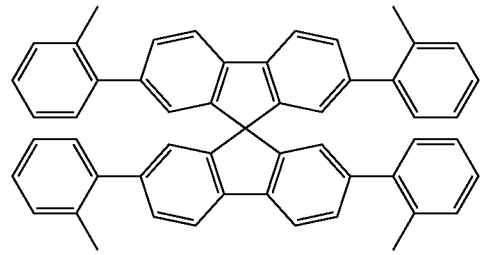

-continued

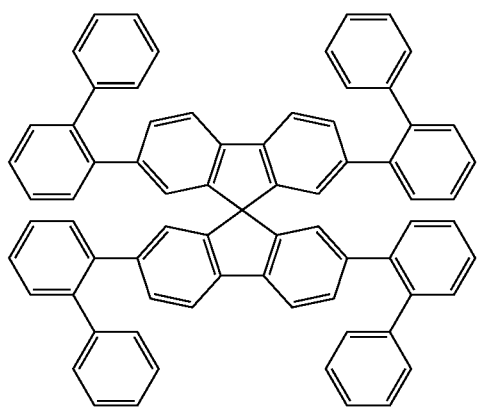
(19)

Suitable phosphorescent compounds are, in particular, compounds which emit light, preferably in the visible region, on suitable excitation and in addition contain at least one atom having an atomic number greater than 20. The phosphorescence emitters used are preferably compounds which contain copper, molybdenum, tungsten, rhenium, ruthenium, osmium, rhodium, iridium, palladium, platinum, silver, gold or europium, in particular compounds which contain iridium, platinum or copper.

Particularly preferred organic electroluminescent devices comprise, as phosphorescent compound, at least one compound of the formulae (26) to (29):

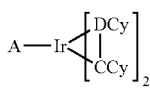
formula (26)

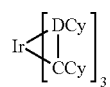
formula (27)

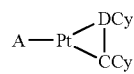
formula (28)

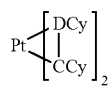
formula (29)

where $R^1$ has the same meaning as described above for formula (1), and the following applies to the other symbols used:

DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents $R^1$; the groups DCy and CCy are bonded to one another via a covalent bond;

CCy is, identically or differently on each occurrence, a cyclic group which contains a carbon atom via which the cyclic group is bonded to the metal and which may in turn carry one or more substituents $R^1$;

A is, identically or differently on each occurrence, a monoanionic, bidentate chelating ligand, preferably a diketonate ligand.

Due to formation of ring systems between a plurality of radicals $R^1$, a bridge may also be present between the groups DCy and CCy. Furthermore, due to formation of ring systems between a plurality of radicals $R^1$, a bridge may also be present between two or three ligands CCy-DCy or between one or two ligands CCy-DCy and the ligand A, giving a polydentate or polypodal ligand system.

Examples of the emitters described above are revealed by the applications WO 20/70655, WO 2001/41512, WO 2002/02714, WO 2002/15645, EP 1191613, EP 1191612, EP 1191614, WO 2004/081017, WO 2005/033244, WO 2005/042550, WO 2005/113563, WO 2006/008069, WO 2006/061182, WO 2006/081973, WO 2009/118087, WO 2009/146770 and the unpublished application DE 102009007038.9. In general, all phosphorescent complexes as used in accordance with the prior art for phosphorescent OLEDs and as are known to the person skilled in the art in the area of organic electroluminescence are suitable, and the person skilled in the art will be able to use further phosphorescent compounds without inventive step. In particular, the person skilled in the art knows which phosphorescent complexes emit in what emission colour.

Examples of suitable phosphorescent compounds are structures (1) to (140) shown in the following table.

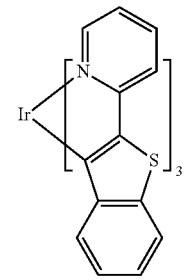
(1)

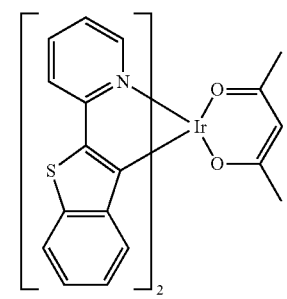
(2)

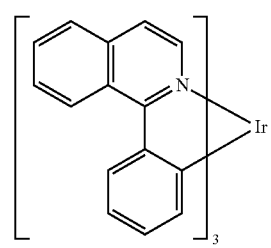
(3)

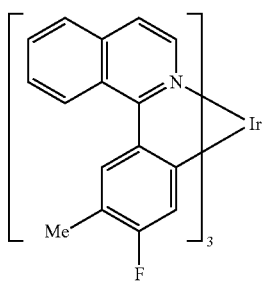 (4)
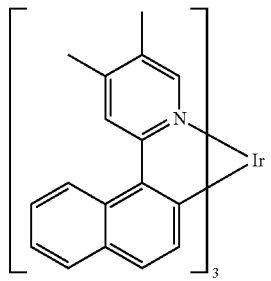 (9)
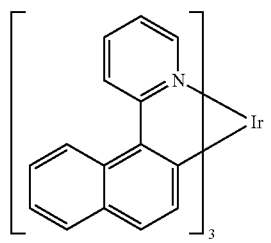 (10)
(5)
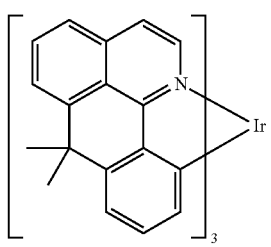 (11)
(6)
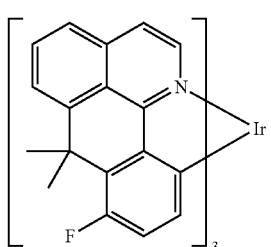 (12)
(7)
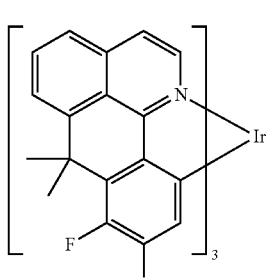 (13)
(8)
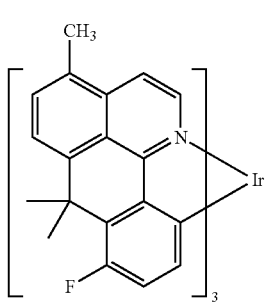 (14)

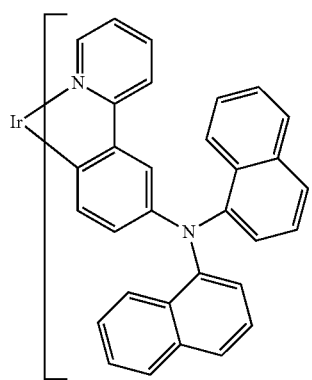 (15)
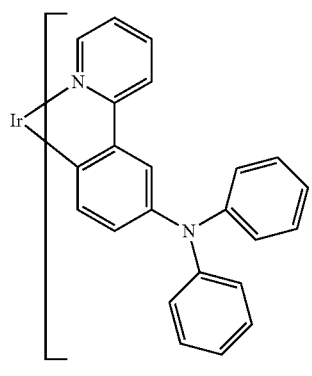 (16)
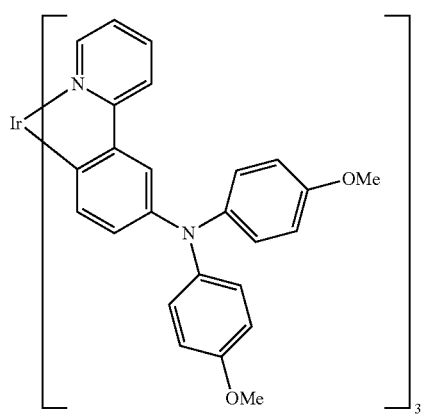 (17)
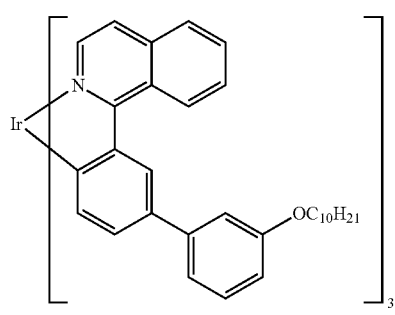 (18)
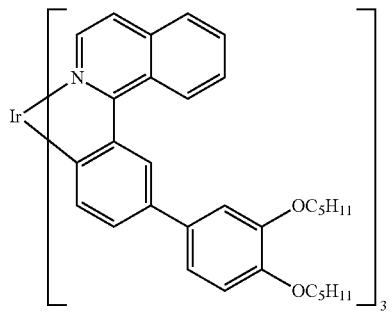 (19)
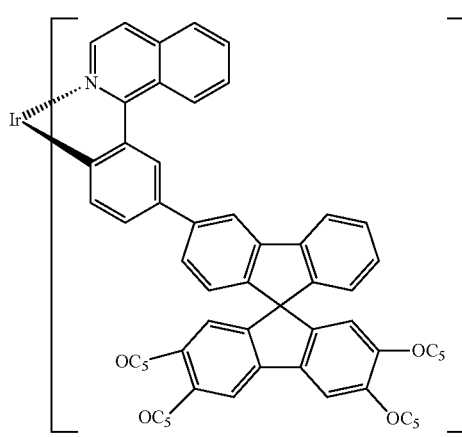 (20)
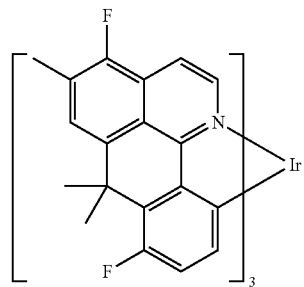 (21)
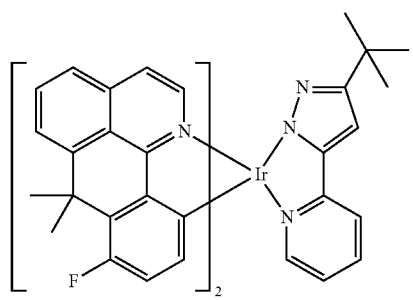 (22)
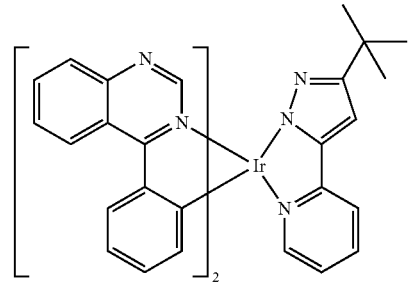 (23)

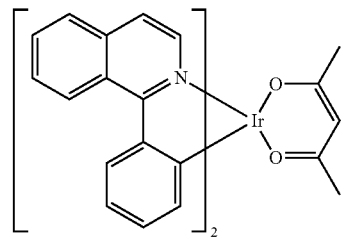
(24)
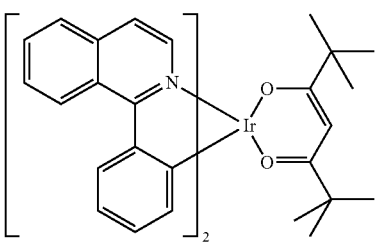
(25)
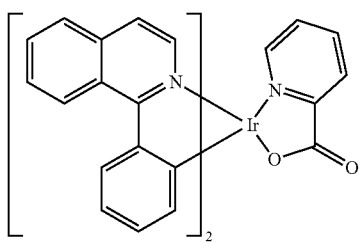
(26)
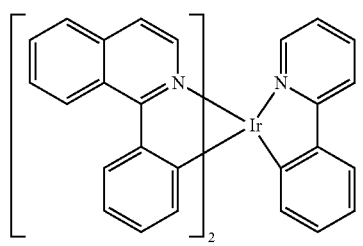
(27)
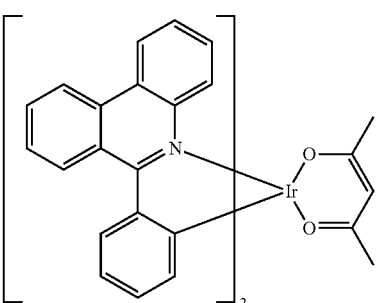
(28)
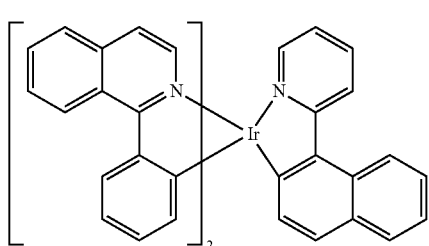
(29)
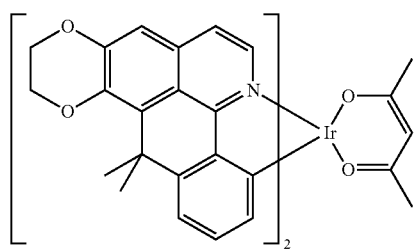
(30)
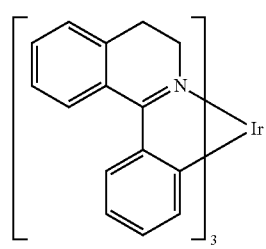
(31)
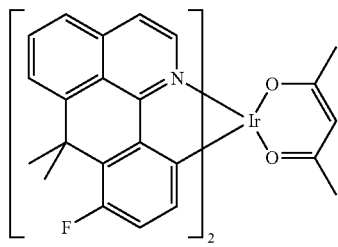
(32)
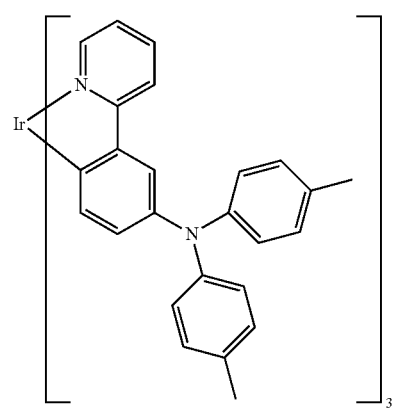
(33)
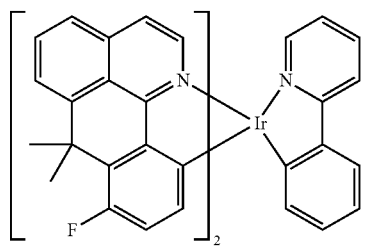
(34)

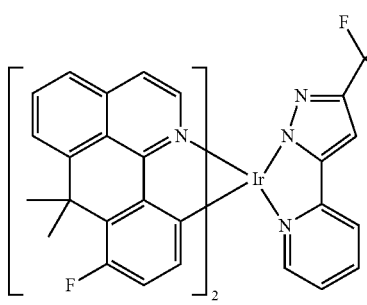
(35)
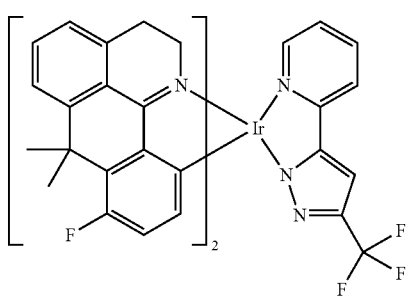
(36)
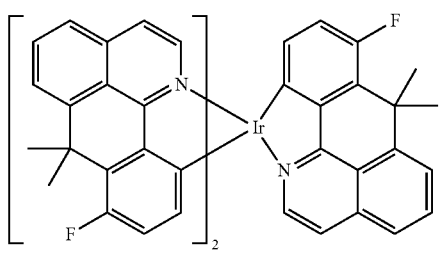
(37)
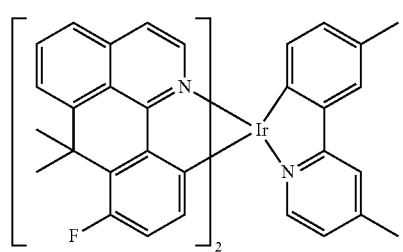
(38)
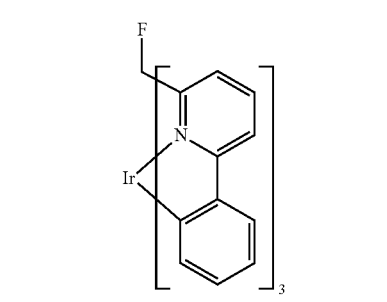
(39)
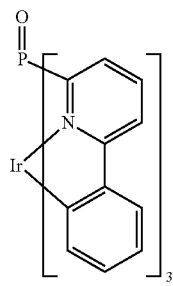
(40)
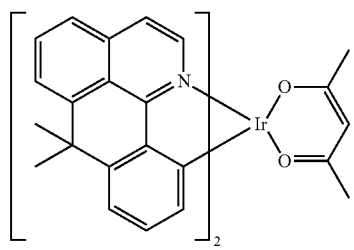
(41)
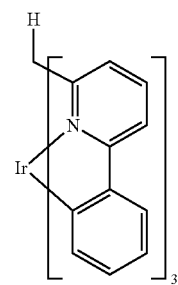
(42)
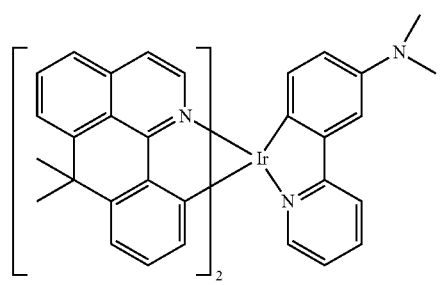
(43)
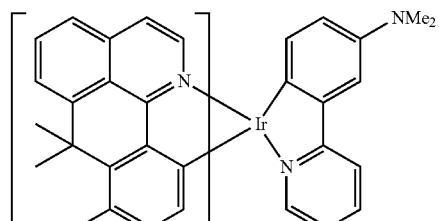
(44)
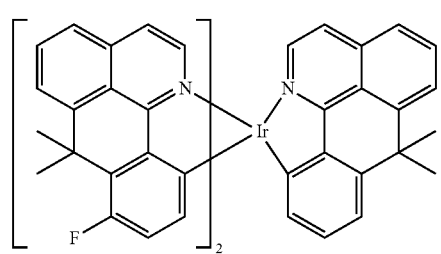
(45)

51
-continued
(46)
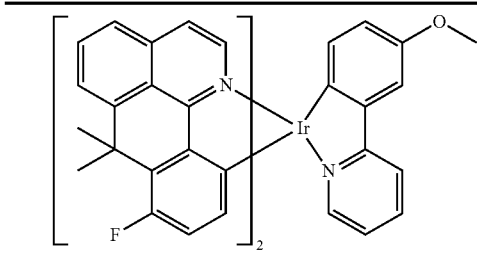
(47)
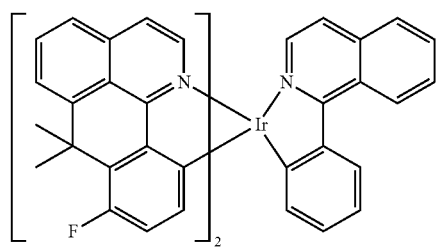
(48)
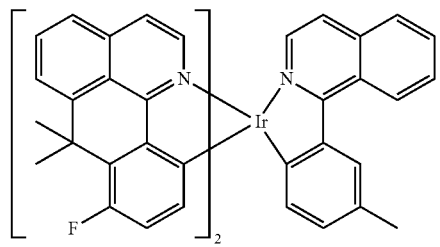
(49)
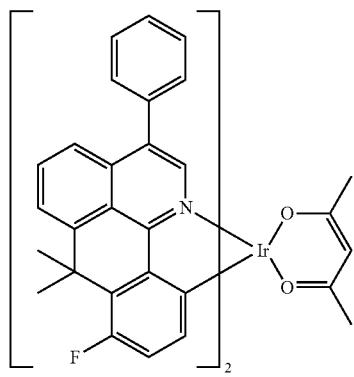
(50)
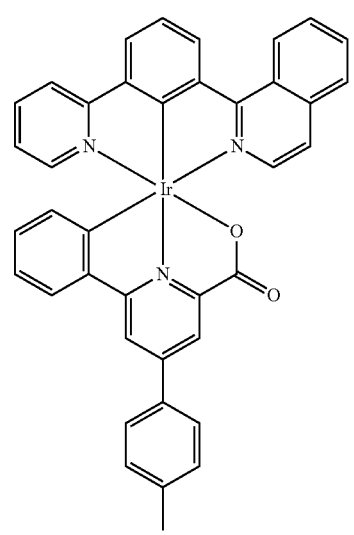
52
-continued
(51)
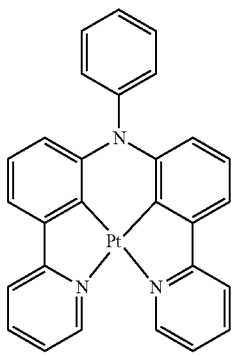
(52)
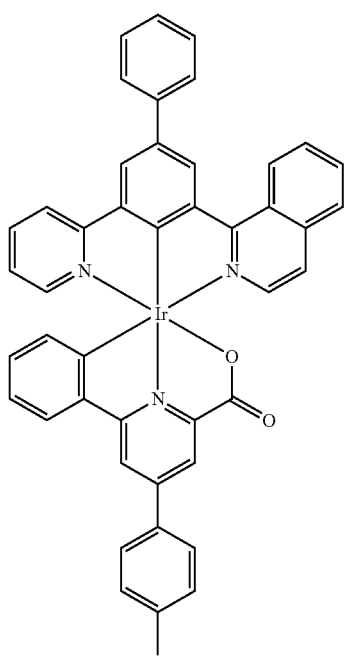
(53)
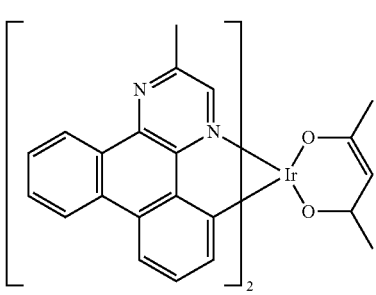
(54)
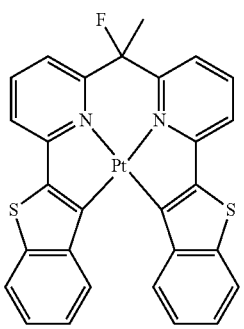

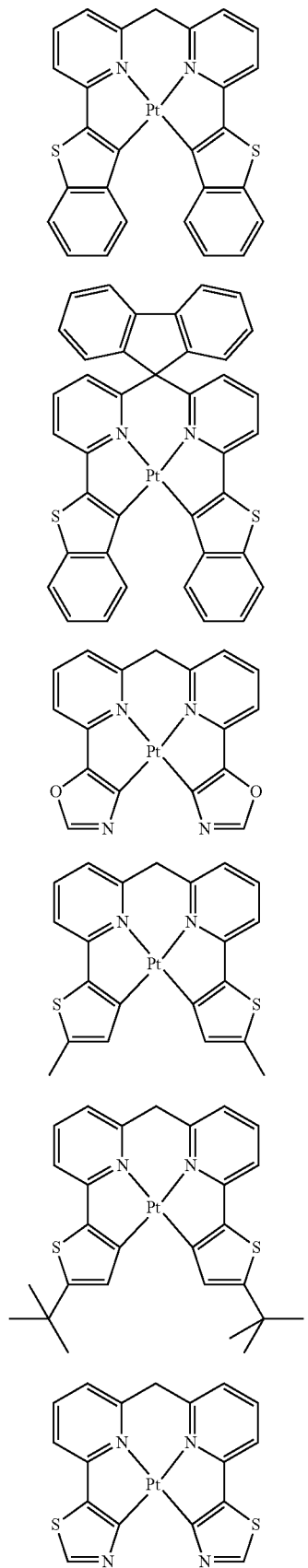
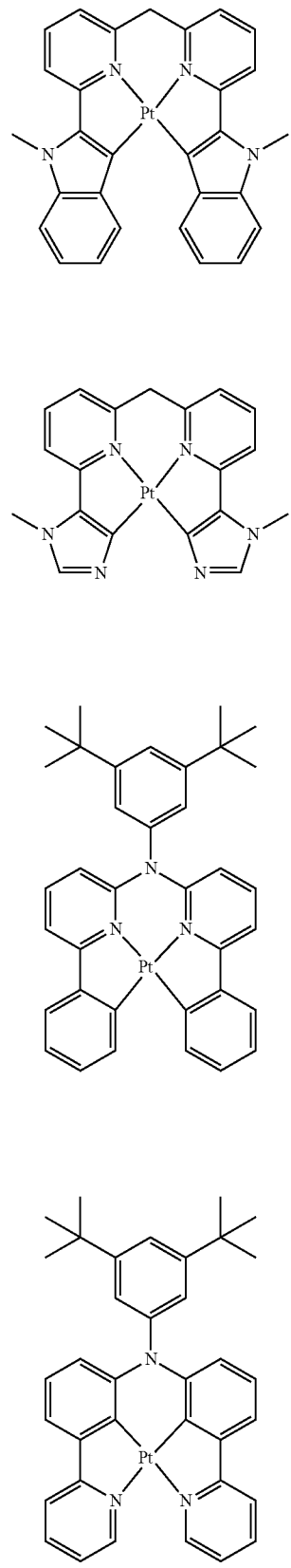

-continued
(65)
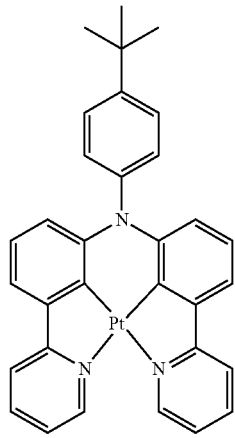
(66)
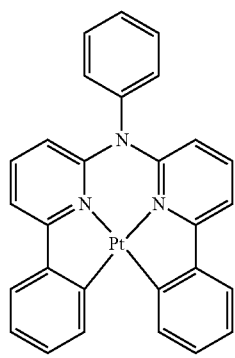
(67)
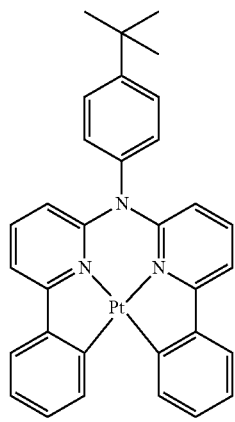
(68)
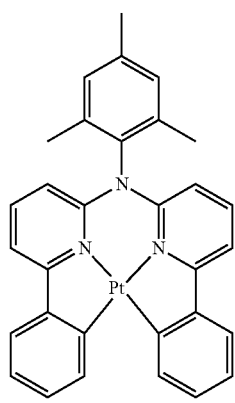
-continued
(69)
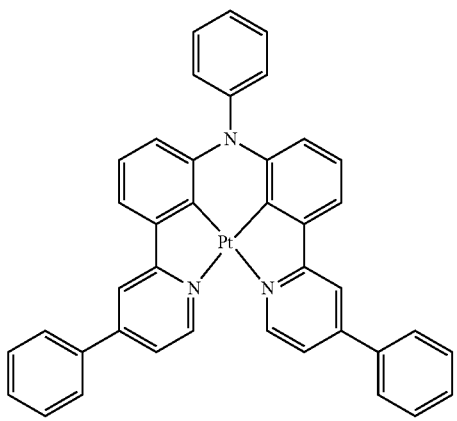
(70)
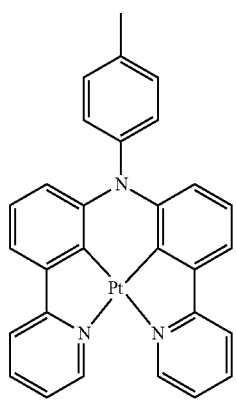
(71)
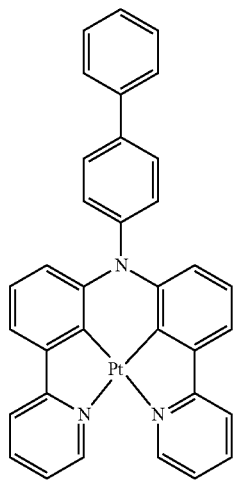

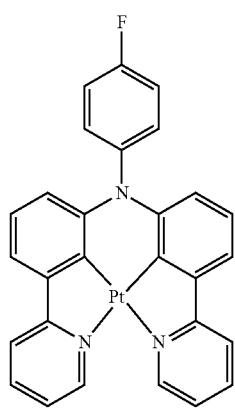
(72)
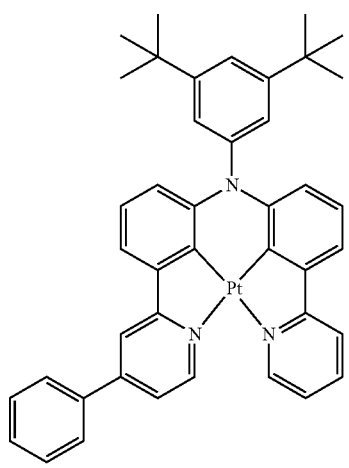
(73)
(74)
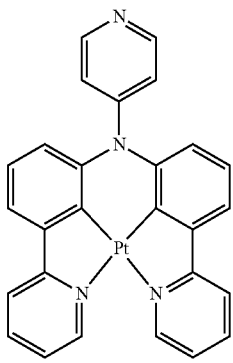
(75)
(76)
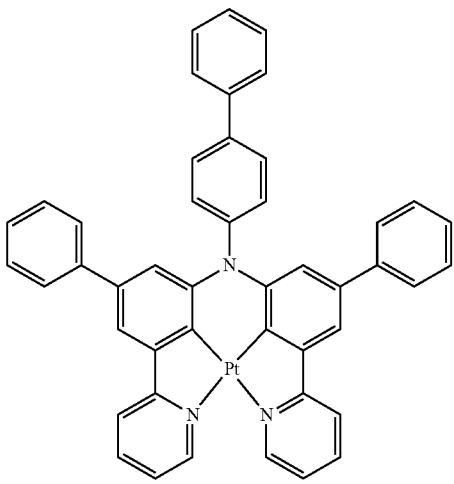
(77)

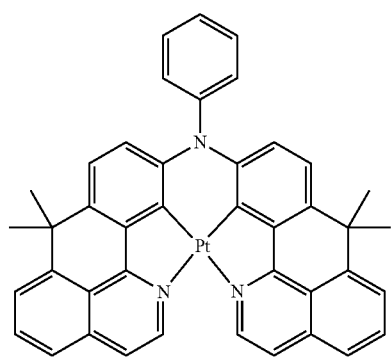
(78)
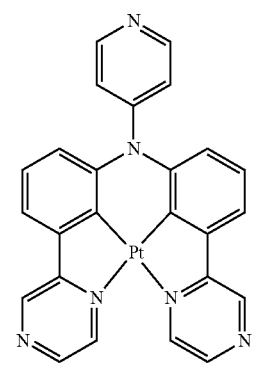
(79)
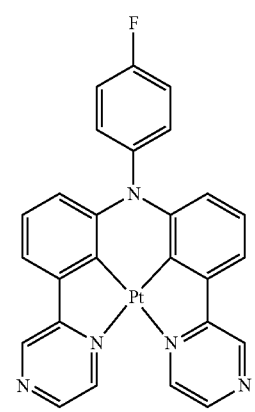
(80)
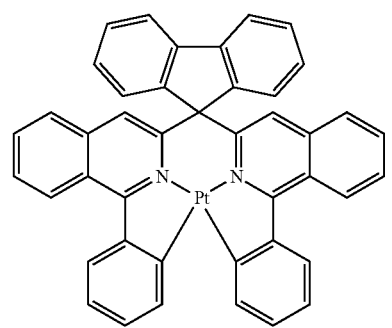
(81)
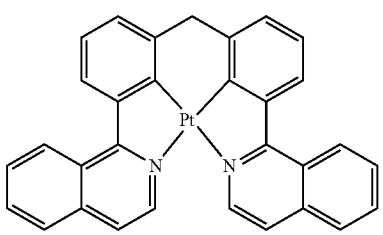
(82)
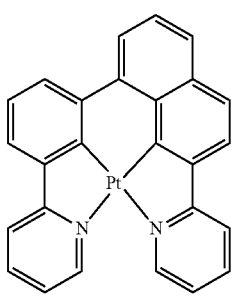
(83)
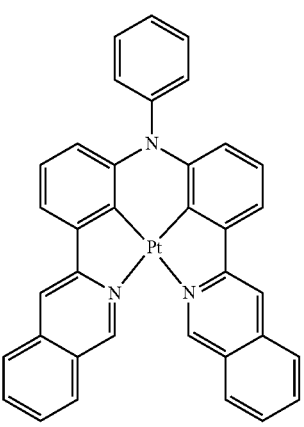
(84)
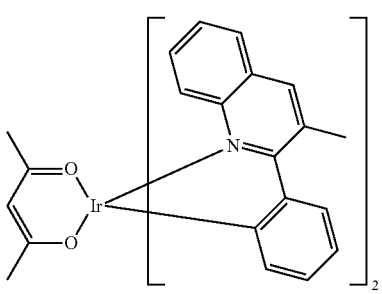
(85)
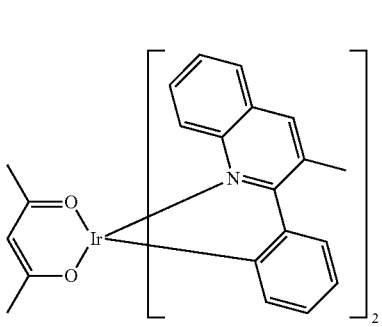
(86)

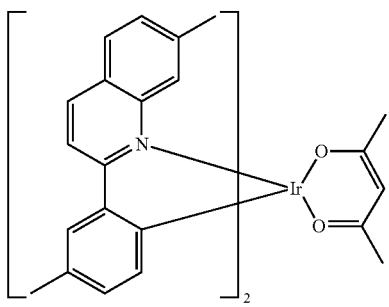 (87)
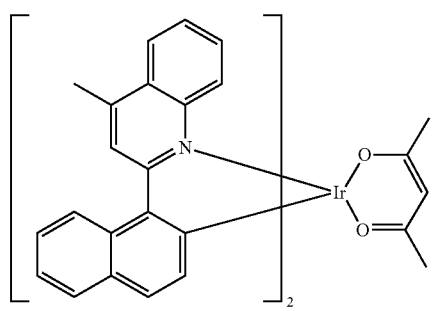 (88)
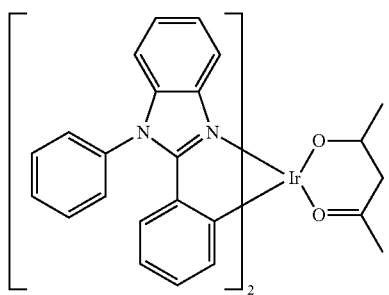 (89)
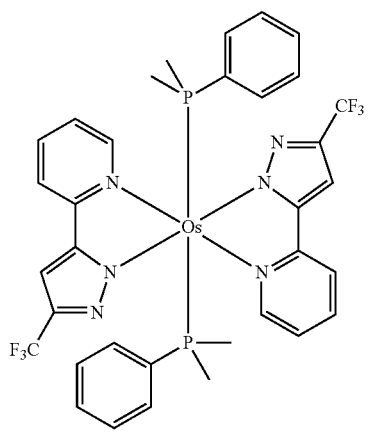 (90)
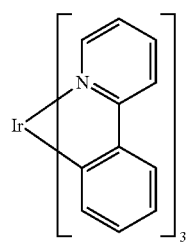 (91)
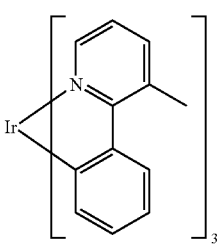 (92)
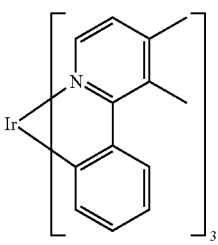 (93)
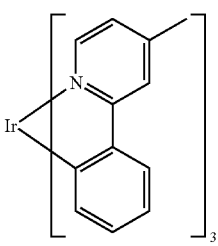 (94)
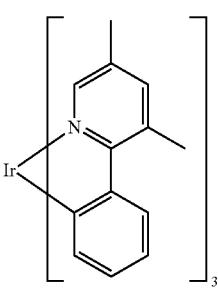 (95)
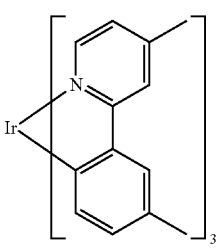 (96)
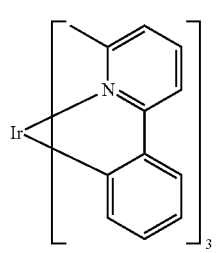 (97)

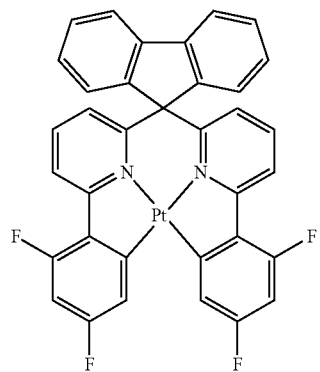
(98)
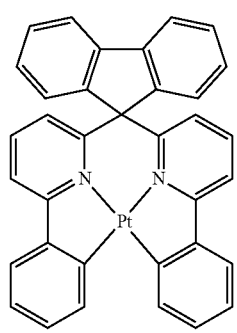
(99)
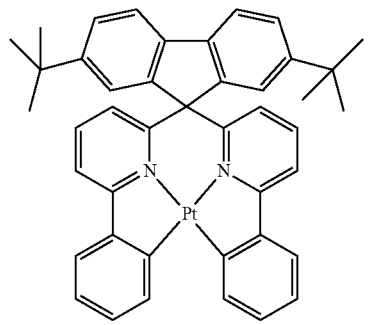
(100)
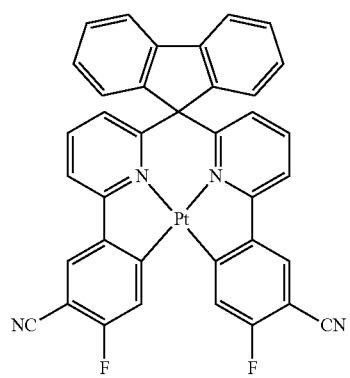
(101)
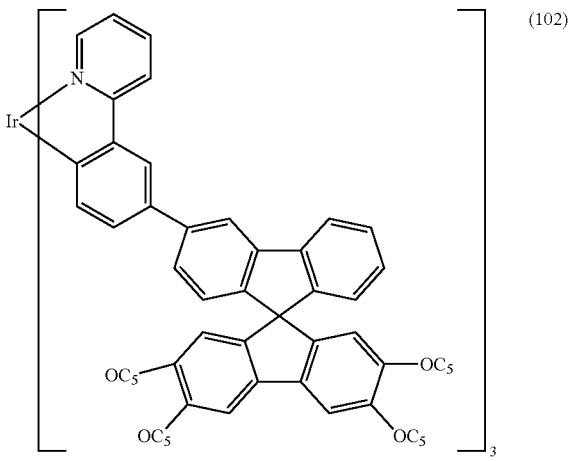
(102)
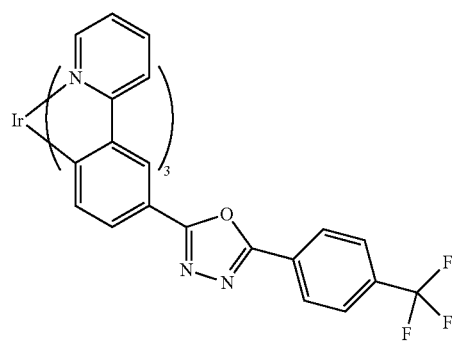
(103)
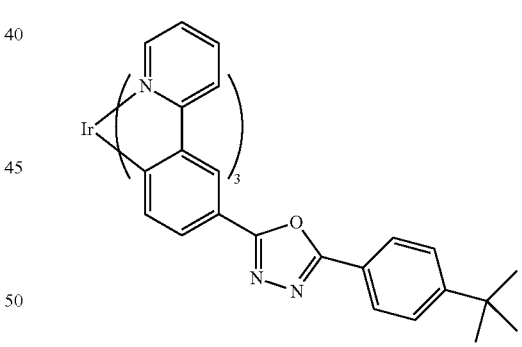
(104)
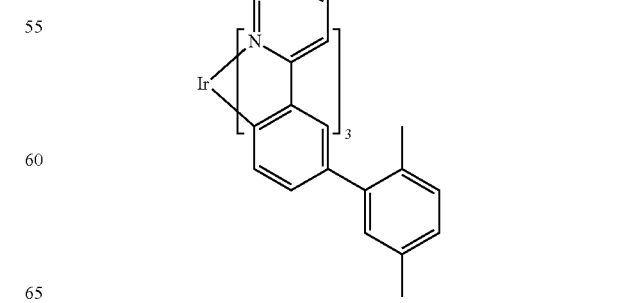
(105)

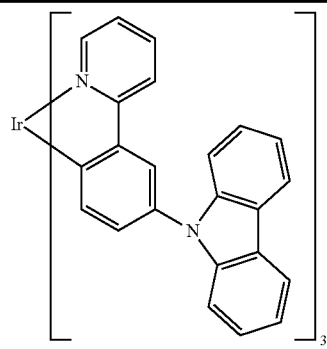 (106)
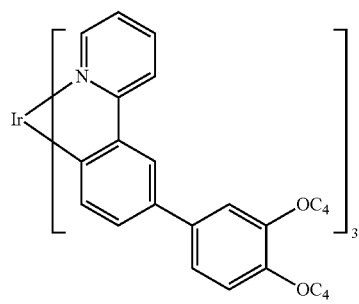 (107)
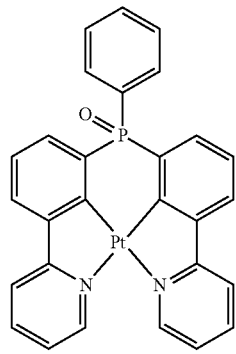 (108)
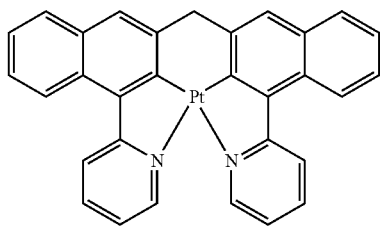 (109)
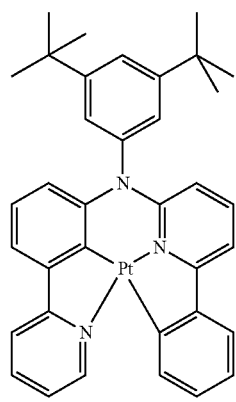 (110)
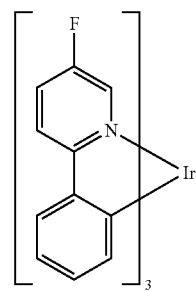 (111)
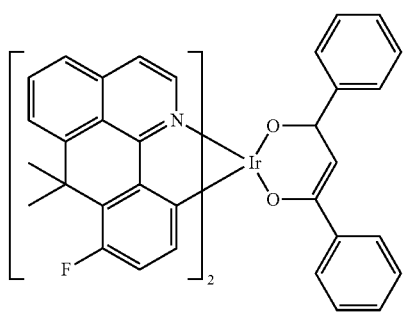 (112)
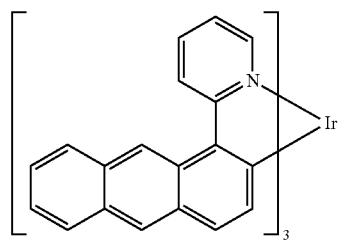 (113)
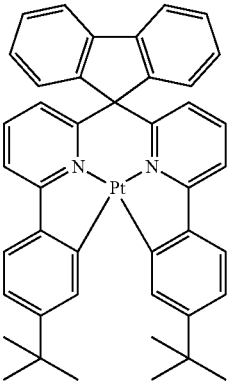 (114)
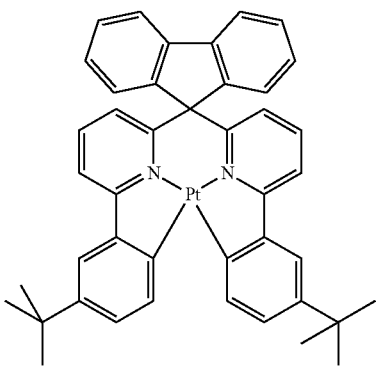 (115)

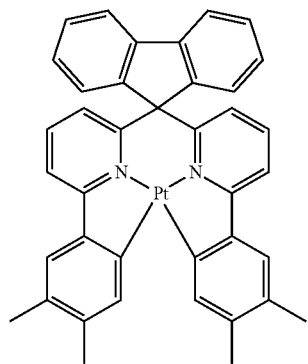 (116)
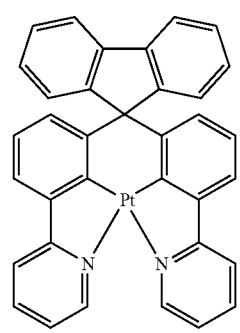 (117)
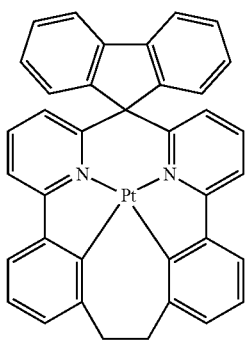 (118)
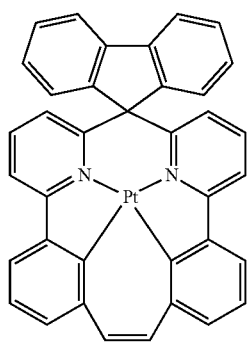 (119)
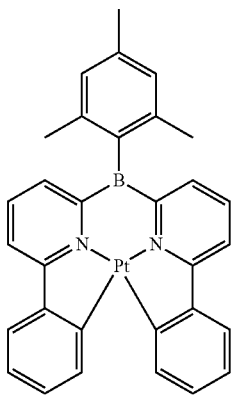 (120)
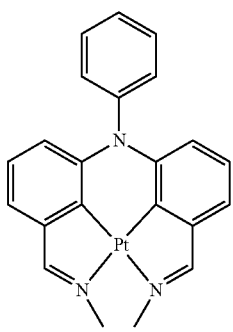 (121)
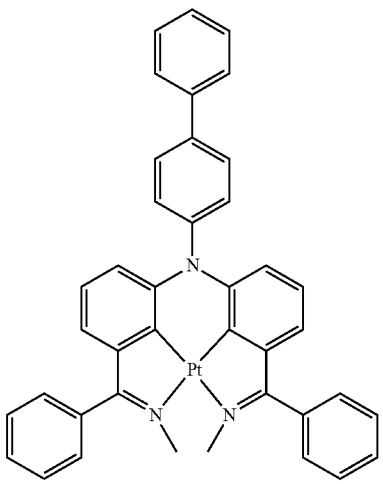 (122)
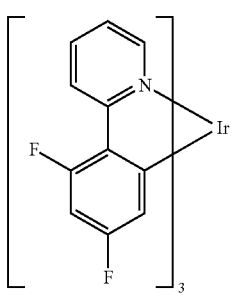 (123)

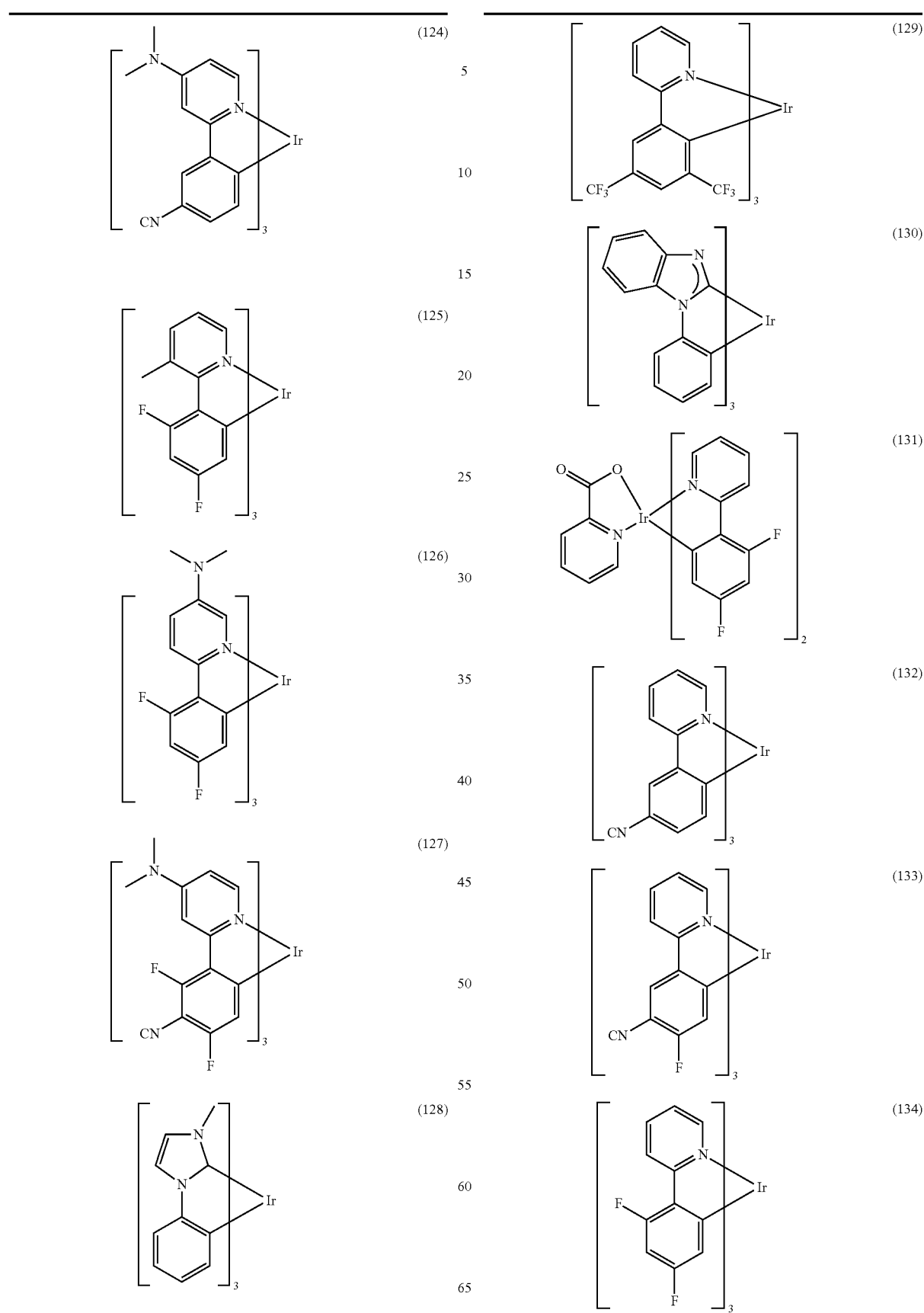

(135)
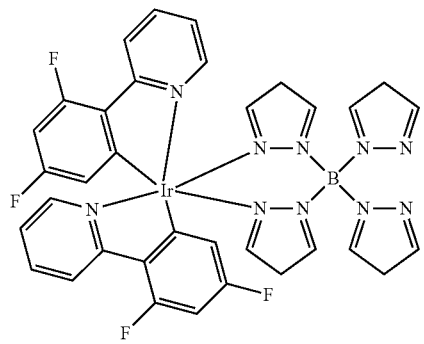

(136)
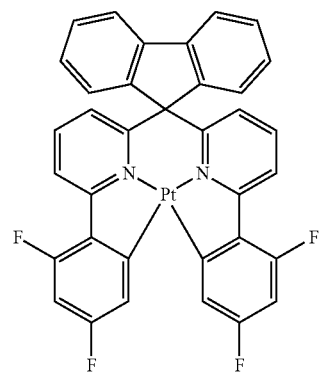

(137)
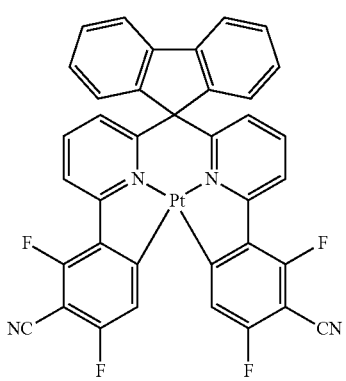

(138)
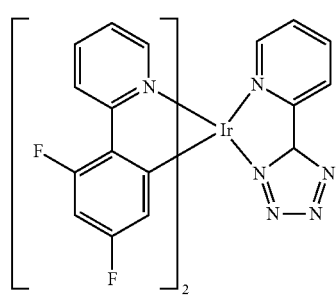

(139)
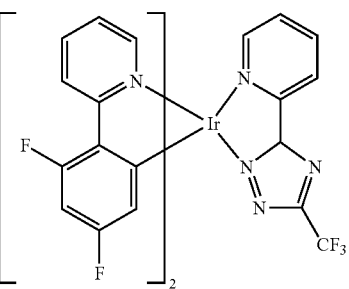

(140)
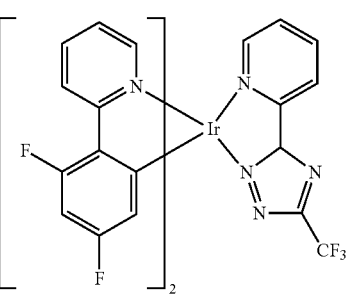

Apart from the cathode, the anode and the at least one emitting layer, which has been described above, the organic electroluminescent device may also comprise further layers. These are selected, for example, from in each case one or more hole-injection layers, hole-transport layers, hole-blocking layers, electron-transport layers, electron-injection layers, electron-blocking layers, exciton-blocking layers, charge-generation layers and/or organic or inorganic p/n junctions. In addition, interlayers which control, for example, the charge balance in the device may be present. In particular, such interlayers may be appropriate as interlayer between two emitting layers, in particular as interlayer between a fluorescent layer and a phosphorescent layer. Furthermore, the layers, in particular the charge-transport layers, may also be doped. Doping of the layers may be advantageous for improved charge transport. However, it should be pointed out that each of the layers mentioned above does not necessarily have to be present, and the choice of layers is always dependent on the compounds used. The use of layers of this type is known to the person skilled in the art, and he will be able to use all materials in accordance with the prior art that are known for such layers for this purpose without inventive step.

It is furthermore possible to use more than one emitting layer, for example two or three emitting layers, which preferably have different emission colours. A particularly preferred embodiment of the invention relates to a white-emitting organic electroluminescent device. This is characterised in that it emits light having CIE colour coordinates in the range from 0.28/0.29 to 0.45/0.41. The general structure of a white-emitting electroluminescent device of this type is disclosed, for example, in WO 05/011013.

The cathode of the electroluminescent device according to the invention preferably comprises metals having a low work function, metal alloys or multilayered structures comprising different metals, such as, for example, alkaline-earth metals, alkali metals, main-group metals or lanthanoids (for example Ca, Ba, Mg, Al, In, Mg, Yb, Sm, etc.). In the case of multilayered structures, further metals which have a relatively high work function, such as, for example, Ag, may also be used in addition to the said metals, in which case combinations of the metals, such as, for example, Ca/Ag or Ba/Ag, are generally used. Preference is likewise given to metal alloys, in particular alloys comprising an alkali metal or alkaline-earth metal and silver, particularly preferably an alloy of Mg and Ag. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides or carbonates (for example LiF, $Li_2O$, CsF, $Cs_2CO_3$, $BaF_2$, MgO, NaF, etc.). The layer thickness of this layer is preferably between 0.5 and 5 nm.

The anode of the electroluminescent device according to the invention preferably comprises materials having a high work function. The anode preferably has a work function of greater than 4.5 eV vs. vacuum. Suitable for this purpose are on the one hand metals having a high redox potential, such as, for example, Ag, Pt or Au. On the other hand, metal/metal oxide electrodes (for example $Al/Ni/NiO_x$, $Al/PtO_x$) may also be preferred. At least one of the electrodes here must be transparent in order to facilitate the coupling-out of light. A preferred structure uses a transparent anode. Preferred anode materials here are conductive mixed metal oxides. Particular preference is given to indium tin oxide (ITO) or indium zinc oxide (IZO). Preference is furthermore given to conductive, doped organic materials, in particular conductive doped polymers.

The device is correspondingly (depending on the application) structured, provided with contacts and finally hermetically sealed, since the lifetime of devices of this type is drastically shortened in the presence of water and/or air.

In general, all further materials as employed in accordance with the prior art in organic electroluminescent devices can be employed in combination with the emitting layer according to the invention, which comprises at least one phosphorescent emitter and matrix materials A and B defined above.

Suitable charge-transport materials, as can be used in the hole-injection or hole-transport layer or in the electron-transport layer of the organic electro-luminescent device according to the invention, are, for example, the compounds disclosed in Y. Shirota et al., Chem. Rev. 2007, 107(4), 953-1010, or other materials as employed in accordance with the prior art in these layers.

Examples of preferred hole-transport materials which can be used in a hole-transport or hole-injection layer in the electroluminescent device according to the invention are indenofluorenamines and derivatives (for example in accordance with WO 2006/122630 or WO 2006/100896), the amine derivatives disclosed in EP 1661888, hexaazatriphenylene derivatives (for example in accordance with WO 2001/049806), amine derivatives containing condensed aromatic ring systems (for example in accordance with U.S. Pat. No. 5,061,569), the amine derivatives disclosed in WO 95/09147, monobenzoindenofluorenamines (for example in accordance with WO 2008/006449) or dibenzoindenofluorenamines (for example in accordance with WO 2007/140847). Hole-transport and hole-injection materials which are furthermore suitable are derivatives of the compounds depicted above, as disclosed in JP 2001/226331, EP 676461, EP 650955, WO 2001/049806, U.S. Pat. No. 4,780,536, WO 98/30071, EP 891121, EP 1661888, JP 2006/253445, EP 650955, WO 2006/073054 and U.S. Pat. No. 5,061,569.

Suitable hole-transport or hole-injection materials are furthermore, for example, the materials listed in the following table.

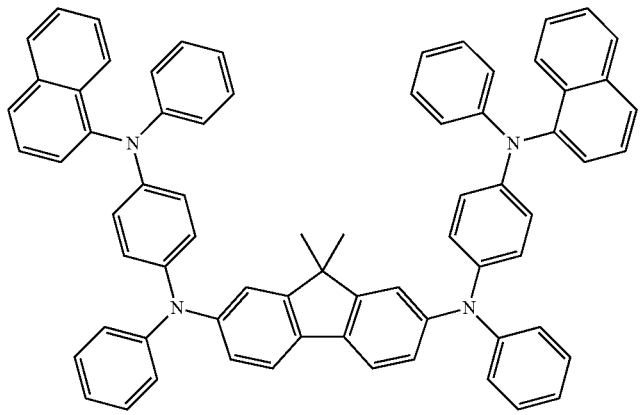 [SMILES: CC1(C)c2cc(N(c3ccccc3)c3ccc(N(c4ccccc4)c4cccc5ccccc45)cc3)ccc2-c2ccc(N(c3ccccc3)c3ccc(N(c4ccccc4)c4cccc5ccccc45)cc3)cc21]

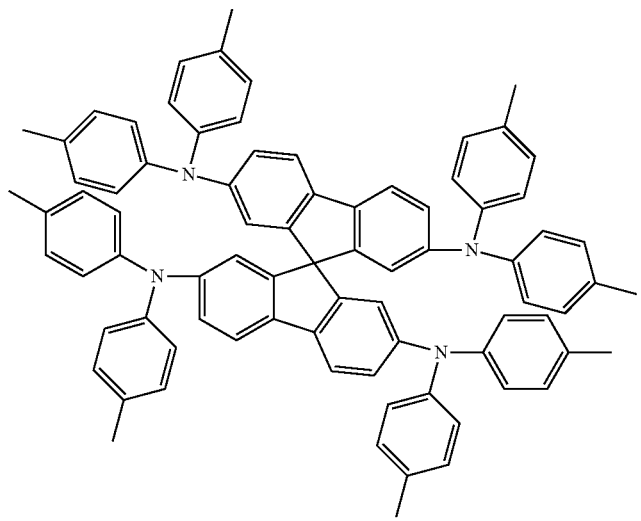
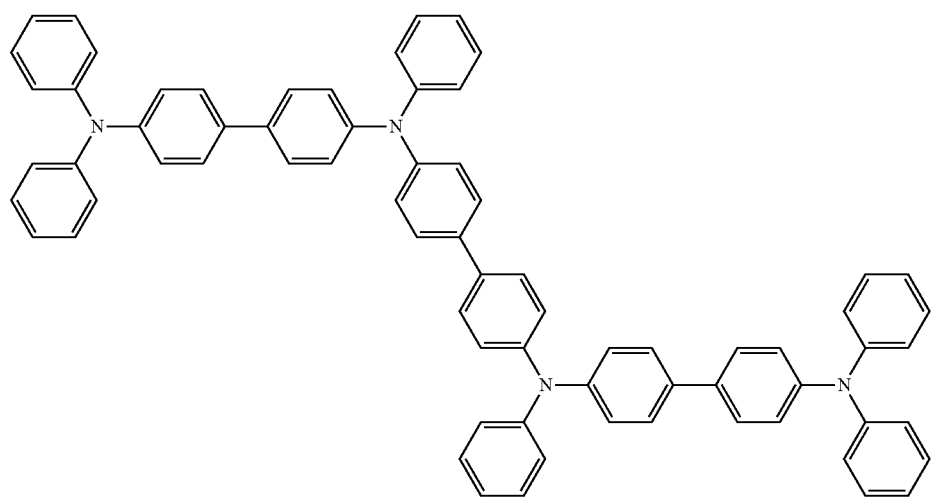 [SMILES: c1ccc(N(c2ccccc2)c2ccc(-c3ccc(N(c4ccccc4)c4ccc(-c5ccc(N(c6ccccc6)c6ccc(-c7ccc(N(c8ccccc8)c8ccccc8)cc7)cc6)cc5)cc4)cc3)cc2)cc1]
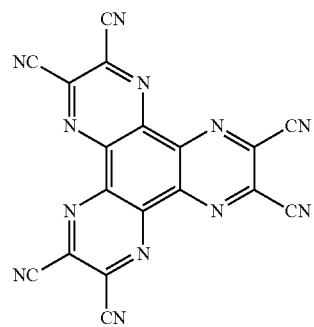 [SMILES: N#Cc1nc2c3nc(C#N)c(C#N)nc3c3nc(C#N)c(C#N)nc3c2nc1C#N]

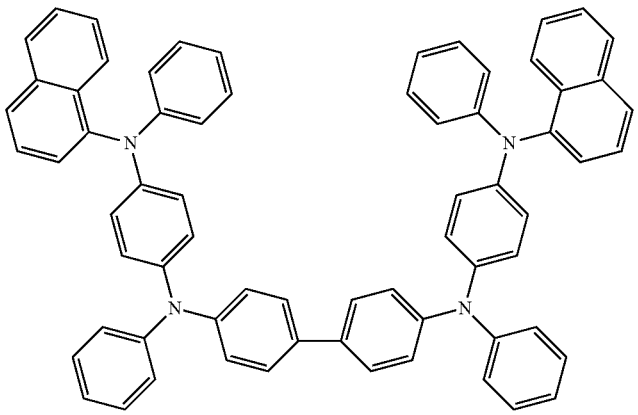 [SMILES: c1ccc(N(c2ccc(-c3ccc(N(c4ccccc4)c4ccc(N(c5ccccc5)c5cccc6ccccc56)cc4)cc3)cc2)c2ccc(N(c3ccccc3)c3cccc4ccccc34)cc2)cc1]
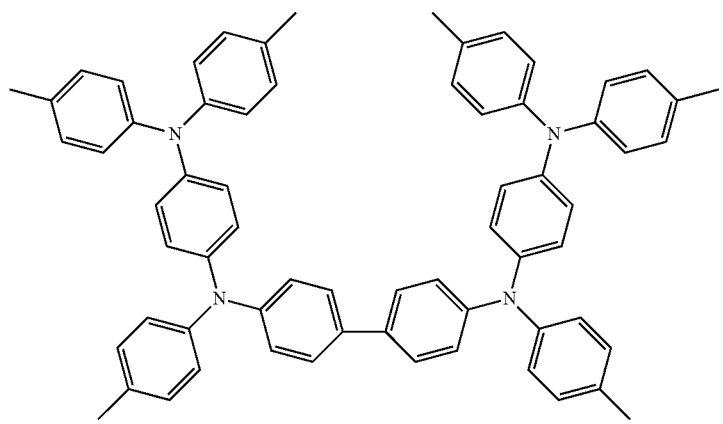
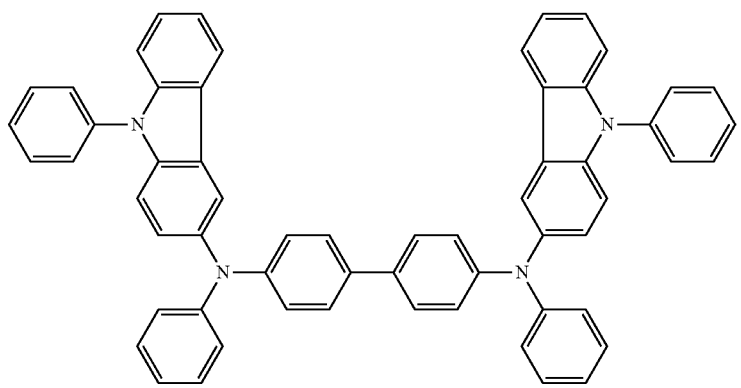 [SMILES: c1ccc(N(c2ccc(-c3ccc(N(c4ccccc4)c4ccc5c(c4)c4ccccc4n5-c4ccccc4)cc3)cc2)c2ccc3c(c2)c2ccccc2n3-c2ccccc2)cc1]
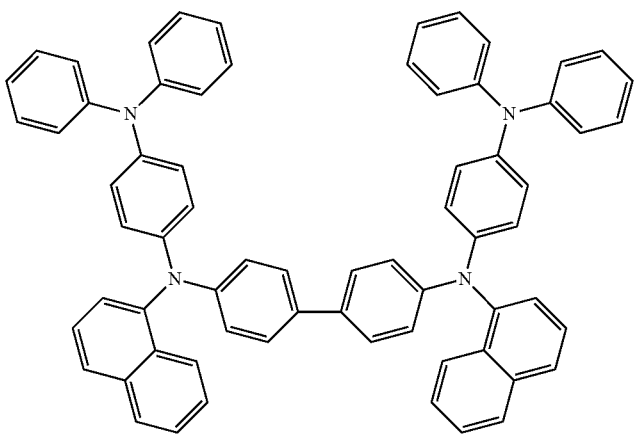 [SMILES: c1ccc(N(c2ccccc2)c2ccc(N(c3ccc(-c4ccc(N(c5ccc(N(c6ccccc6)c6ccccc6)cc5)c5cccc6ccccc56)cc4)cc3)c3cccc4ccccc34)cc2)cc1]

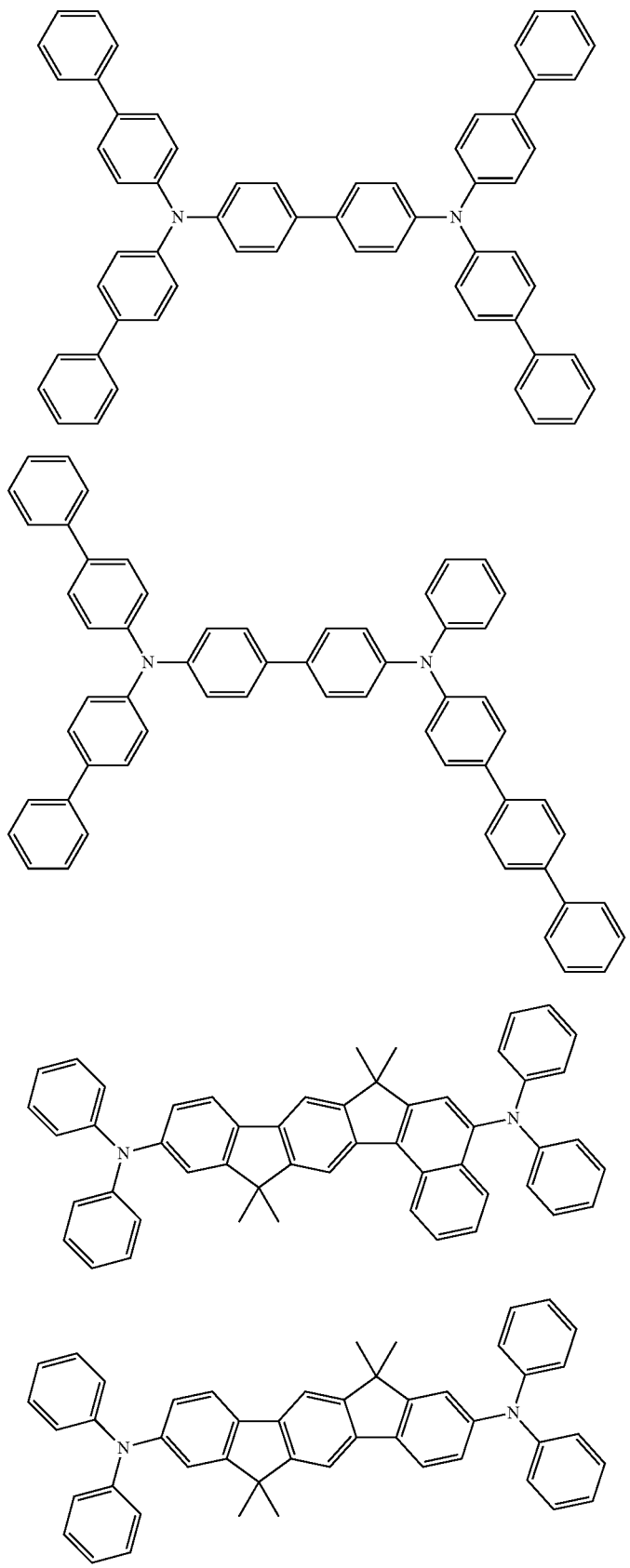

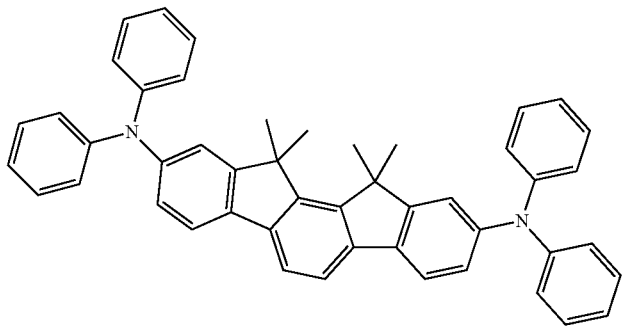 [SMILES: CC1(C)c2cc(N(c3ccccc3)c3ccccc3)ccc2-c2ccc3c(c21)C(C)(C)c1cc(N(c2ccccc2)c2ccccc2)ccc1-3]
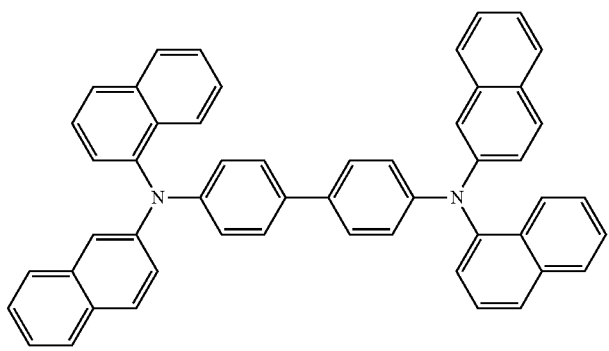 [SMILES: c1ccc2cc(N(c3ccc(-c4ccc(N(c5ccc6ccccc6c5)c5cccc6ccccc56)cc4)cc3)c3cccc4ccccc34)ccc2c1]
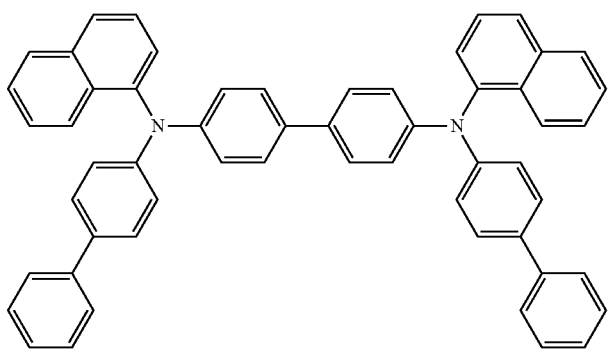 [SMILES: c1ccc(-c2ccc(N(c3ccc(-c4ccc(N(c5ccc(-c6ccccc6)cc5)c5cccc6ccccc56)cc4)cc3)c3cccc4ccccc34)cc2)cc1]
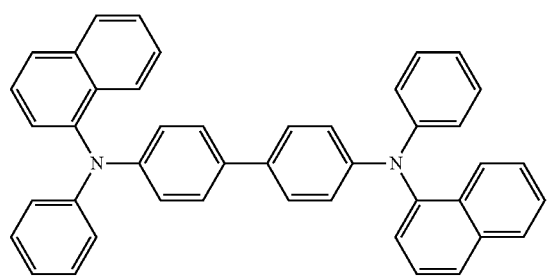 [SMILES: c1ccc(N(c2ccc(-c3ccc(N(c4ccccc4)c4cccc5ccccc45)cc3)cc2)c2cccc3ccccc23)cc1]

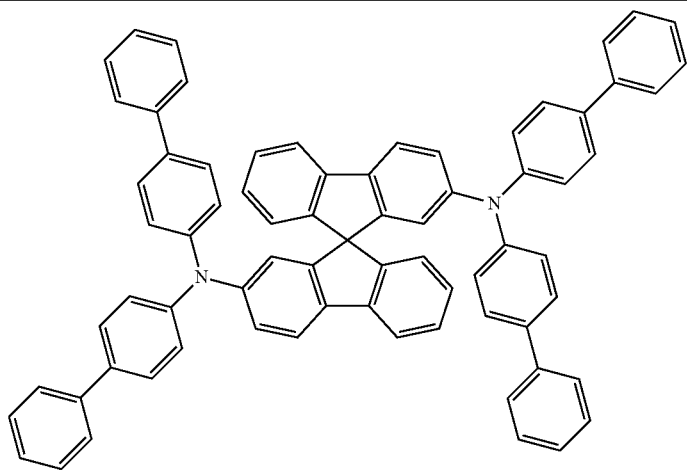

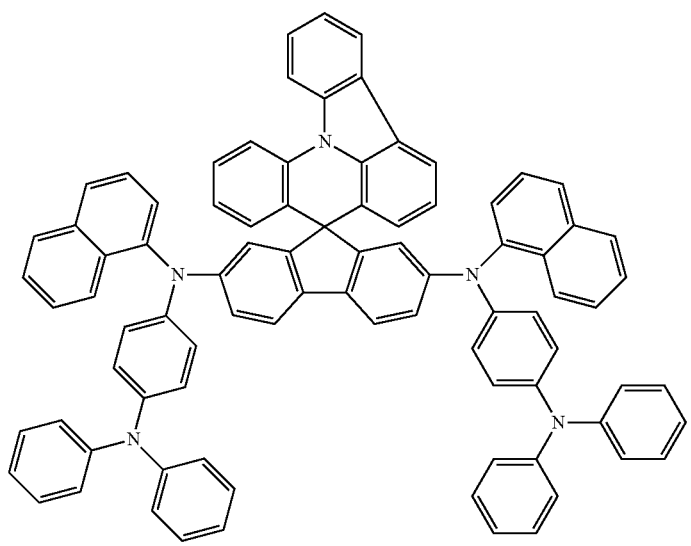 [SMILES: c1ccc(N(c2ccccc2)c2ccc(N(c3ccc4c(c3)C3(c5cc(N(c6ccc(N(c7ccccc7)c7ccccc7)cc6)c6cccc7ccccc67)ccc5-4)c4ccccc4-n4c5ccccc5c5cccc3c54)c3cccc4ccccc34)cc2)cc1]

Suitable electron-transport or electron-injection materials for the electro-luminescent device according to the invention are, for example, the materials listed in the following table. Electron-transport and electron-injection materials which are furthermore suitable are derivatives of the compounds depicted above, as disclosed in JP 2000/053957, WO 2003/060956, WO 2004/028217 and WO 2004/080975, and in general benzimidazole derivatives and triazine derivatives.

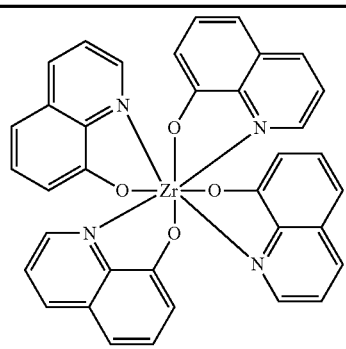

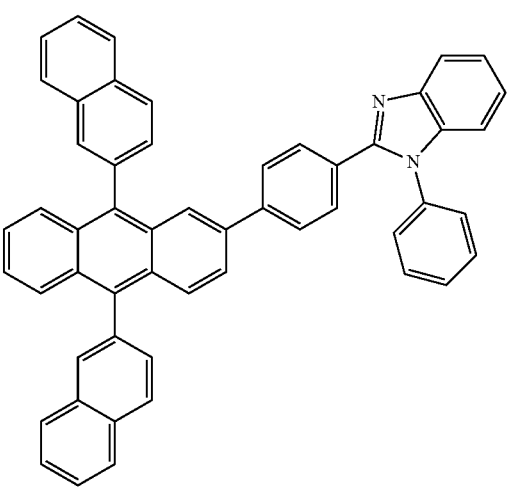 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1]

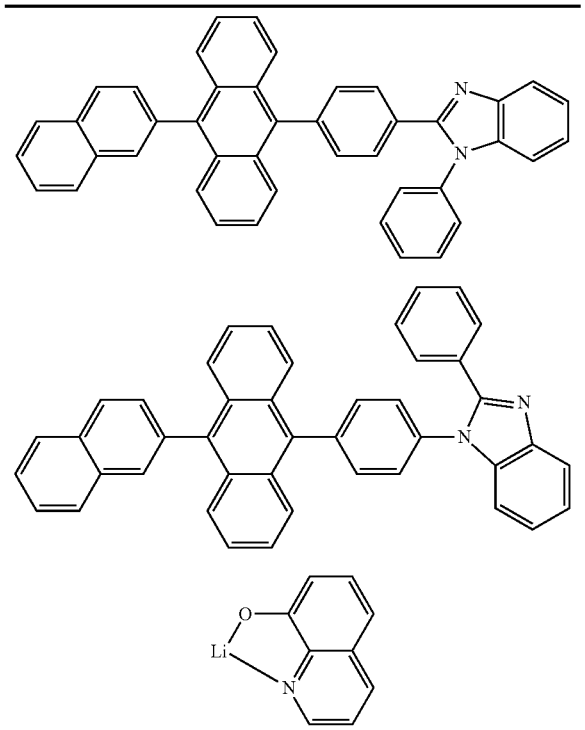

Preference is furthermore given to an organic electroluminescent device, characterised in that one or more layers are applied by means of a sublimation process, in which the materials are vapour-deposited in vacuum sublimation units at an initial pressure of less than $10^{-5}$ mbar, preferably less than $10^{-6}$ mbar. However, it should be noted that the initial pressure may also be even lower, for example less than $10^{-7}$ mbar.

Preference is likewise given to an organic electroluminescent device, characterised in that one or more layers are applied by means of the OVPD (organic vapour phase deposition) process or with the aid of carrier-gas sublimation, in which the materials are applied at a pressure between $10^{-5}$ mbar and 1 bar. A special case of this process is the OVJP (organic vapour jet printing) process, in which the materials are applied directly through a nozzle and thus structured (for example M. S. Arnold et al., *Appl. Phys. Lett.* 2008, 92, 053301).

Preference is furthermore given to an organic electroluminescent device, characterised in that one or more layers are produced from solution, such as, for example, by spin coating, or by means of any desired printing process, such as, for example, screen printing, flexographic printing, offset printing, LITI (light induced thermal imaging, thermal transfer printing), inkjet printing or nozzle printing. Soluble compounds are necessary for this purpose. High solubility can be achieved through suitable substitution of the compounds. It is possible here not only for solutions of individual materials to be applied, but also solutions which comprise a plurality of compounds, for example matrix materials and dopants.

The organic electroluminescent device can also be produced as a hybrid system by applying one or more layers from solution and applying one or more further layers by vapour deposition.

The organic electroluminescent device can be used for various applications, in particular for display applications or as light source, for example for lighting applications or for medical applications.

These processes are generally known to the person skilled in the art and can be applied by him without inventive step to the organic electroluminescent devices according to the invention.

The organic electroluminescent devices according to the invention have the following surprising advantages over the prior art:

1. The organic electroluminescent device according to the invention has very high efficiency. The efficiency here is better than on use of an electron-transporting matrix material in combination with a hole-transporting matrix material.
2. The organic electroluminescent device according to the invention at the same time has an improved lifetime. The lifetime here is longer than on use of an electron-transporting matrix material in combination with a hole-transporting matrix material.

The invention is described in greater detail by the following examples, without wishing to restrict it thereby. The person skilled in the art will be able, without inventive step, to produce further organic electroluminescent devices according to the invention.

EXAMPLES

Determination of the HOMO, LUMO and Energy Gap from Cyclic Voltammetry and Absorption Spectrum For the purposes of the present invention, the HOMO and LUMO values and the energy gap are determined by the general methods described below:

The HOMO value arises from the oxidation potential, which is measured by cyclic voltammetry (CV) at room temperature. The measuring instrument used for this purpose is an ECO Autolab system with Metrohm 663 VA stand. The working electrode is a gold electrode, the reference electrode is Ag/AgCl, the bridge electrolyte is KCl (3 mol/l) and the auxiliary electrode is platinum.

For the measurement, firstly a 0.11 M conductive-salt solution of tetrabutyl-ammonium hexafluorophosphate ($NH_4PF_6$) in dichloromethane is prepared, introduced into the measurement cell and degassed for 5 min. Two measurement cycles are subsequently carried out with the following parameters:

Measurement technique: CV
Initial purge time: 300 s
Cleaning potential: −1 V
Cleaning time: 10 s
Deposition potential: −0.2 V
Deposition time: 10 s
Start potential: −0.2 V
End potential: 1.6 V
Voltage step: 6 mV
Sweep rate: 50 mV/s 1 ml of the sample solution (10 mg of the substance to be measured in 1 ml of dichloromethane) is subsequently added to the conductive-salt solution, and the mixture is degassed again for 5 min. Five further measurement cycles are subsequently carried out, the last three of which are recorded for evaluation. The same parameters are set as described above.

0.1 ml of ferrocene solution (100 mg of ferrocene in 1 ml of dichloromethane) is subsequently added to the solution, the mixture is degassed for 1 min, and a measurement cycle is carried out with the following parameters:

Measurement technique: CV
Initial purge time: 60 s
Cleaning potential: −1 V
Cleaning time: 10 s
Deposition potential: −0.2 V
Deposition time: 10 s
Start potential: −0.2 V
End potential: 1.6 V
Voltage step: 6 mV
Sweep rate: 50 mV/s For evaluation, the mean of the voltages of the first oxidation maximum is taken from the forward curves and the mean of the voltages of the associated reduction maximum is taken from the return curves ($V_P$ and $V_F$) for the sample solution and the solution to which ferrocene solution has been added, where the voltage used is in each case the voltage against ferrocene. The HOMO value of the substance to be investigated $E_{HOMO}$ arises as $E_{HOMO}=-[e \cdot (V_P-V_F)+4.8 \text{ eV}]$, where e represents the elementary charge.

It should be noted that appropriate modifications of the measurement method may have to be carried out in individual cases, for example if the substance to be investigated is not soluble in dichloromethane or if decomposition of the substance occurs during the measurement. If a meaningful measurement should not be possible by means of CV using the abovementioned method, the HOMO energy will be determined by photoelectron spectroscopy by means of a model AC-2 photoelectron spectrometer from Riken Keiki Co. Ltd. (http://www.rikenkeiki.com/pages/AC2.htm), in which case it should be noted that the values obtained are typically around 0.3 eV lower than those measured by CV. For the purposes of this patent, the HOMO value is then taken to mean the value from Riken AC2+0.3 eV.

Furthermore, HOMO values lower than −6 eV cannot be measured reliably either using the CV method described or using the photoelectron spectroscopy described. In this case, the HOMO values are determined from quantum-chemical calculation by means of density functional theory (DFT). This is carried out via the commercially available Gaussian 03W (Gaussian Inc.) software using method B3PW91/6-31 G(d). Standardisation of the calculated values to CV values is achieved by comparison with materials which can be measured by CV. To this end, the HOMO values of a series of materials are measured using the CV method and also calculated. The calculated values are then calibrated by means of the measured values, and this calibration factor is used for all further calculations. In this way, it is possible to calculate HOMO values which correspond very well to those which would be measured by CV. If the HOMO value for a particular substance cannot be measured by CV or Riken AC2 as described above, the HOMO value is, for the purposes of this patent, therefore taken to mean the value which is obtained in accordance with the description by a DFT calculation calibrated to CV, as described above. Examples of values calculated in this way for some common organic materials are: NPB (HOMO −5.16 eV, LUMO −2.28 eV); TCTA (HOMO −5.33 eV, LUMO −2.20 eV); TPBI (HOMO −6.26 eV, LUMO −2.48 eV). These values can be used for calibration of the calculation method.

The energy gap is determined from the absorption edge of the absorption spectrum measured on a film having a layer thickness of 50 nm. The absorption edge here is defined as the wavelength obtained when a straight line is fitted to the longest-wavelength falling flank in the absorption spectrum at its steepest point, and the value at which this straight line intersects the wavelength axis, i.e. the absorption value=0, is determined.

The LUMO value is obtained by addition of the energy gap to the HOMO value described above.

Production and Characterisation of Organic Electroluminescent Devices in Accordance with the Invention Electroluminescent devices according to the invention can be produced as described in general, for example, in WO 05/003253. The structures of the materials used are depicted below for clarity.

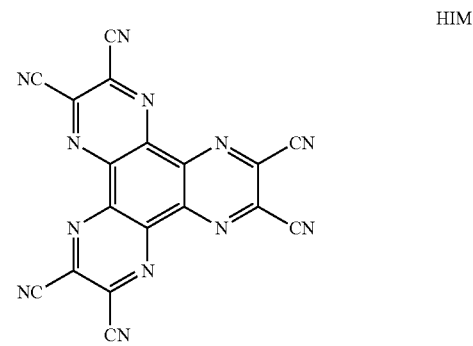

HIM

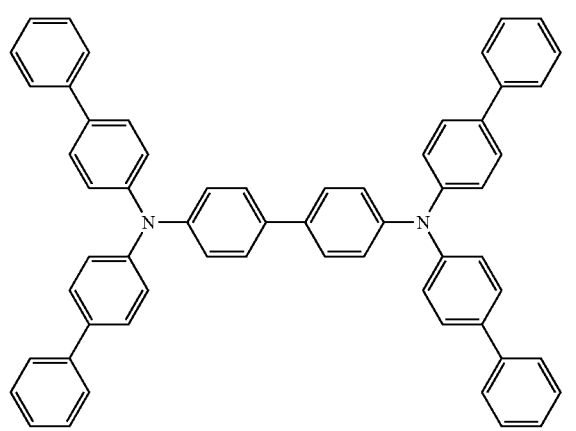

HTM

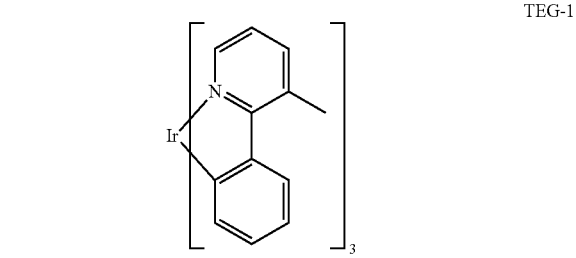

TEG-1

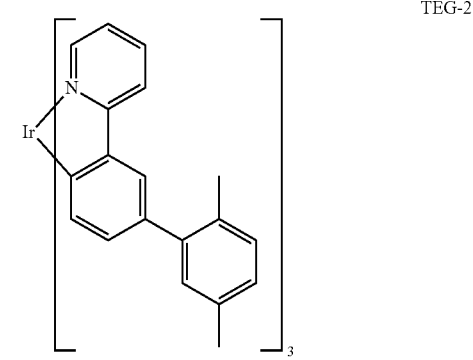

TEG-2

TMM1
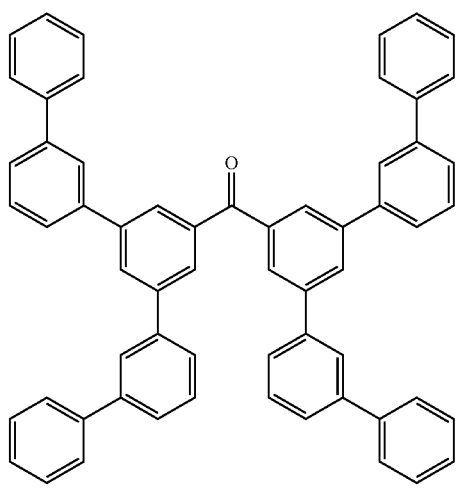
TMM2
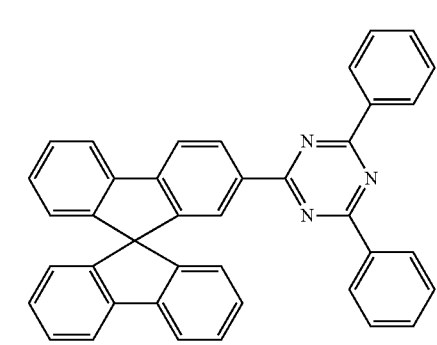
TMM3
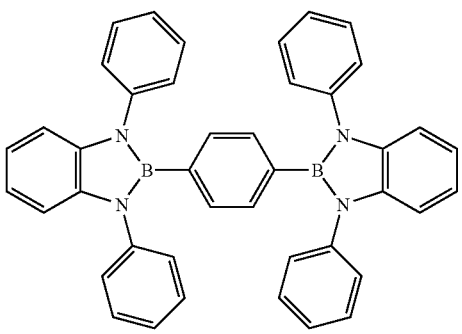
TMM4
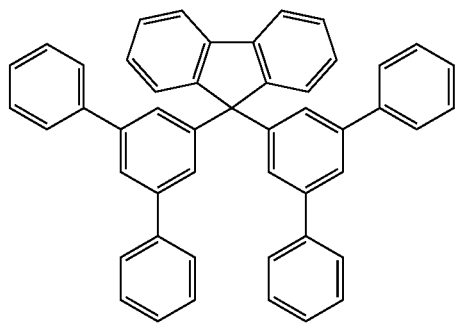
TMM5
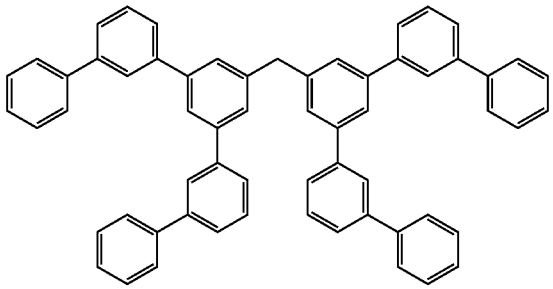
TMM6
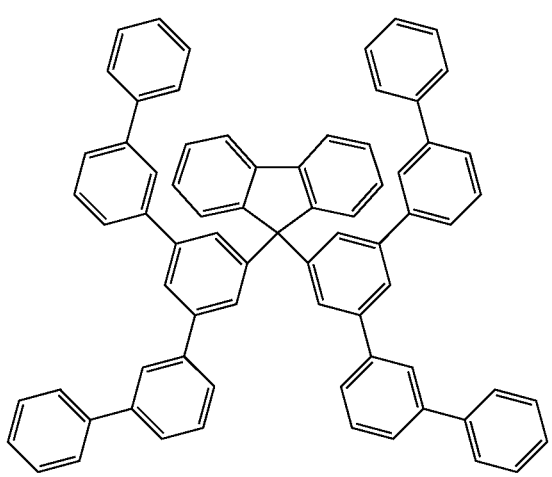
CBP
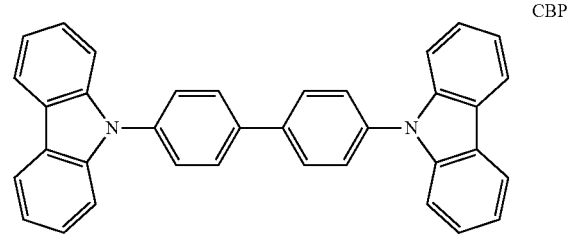
TCTA
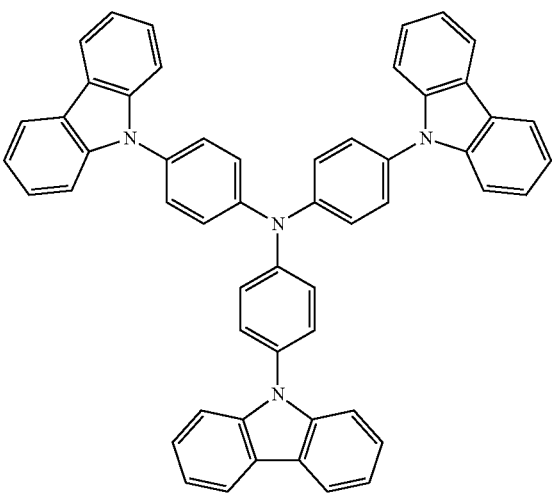

-continued

ETM

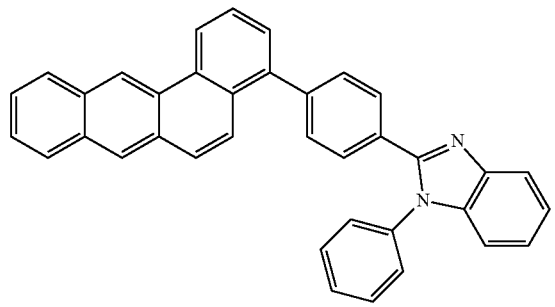

TMM7

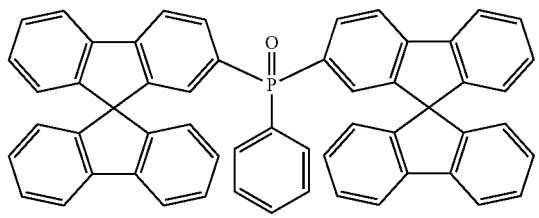

These as yet unoptimised OLEDs are characterised by standard methods; for this purpose, the electroluminescence spectra and colour coordinates (in accordance with CIE 1931), the efficiency (measured in cd/A) as a function of the luminance, the operating voltage, calculated from current-voltage-luminous density characteristic lines (IUL characteristic lines), and the lifetime are determined. The results obtained are summarised in Table 2.

The results for various OLEDs are compared below. For the matrix materials used, the following values for HOMO, LUMO and energy gap are determined using the general method described above (Table 1).

TABLE 1

| Material | HOMO | LUMO | Energy gap |
|---|---|---|---|
| TMM1 | −6.3 eV | −2.75 eV | 3.55 eV |
| TMM2 | −6.1 eV | −2.8 eV | 3.3 eV |
| TMM3 | −5.8 eV | −1.8 eV | 4.0 eV |
| TMM4 | −6.15 eV | −2.0 eV | 4.15 eV |
| TMM5 | −6.2 eV | −2.2 eV | 4.0 eV |
| TMM6 | −6.15 eV | −2.25 eV | 3.9 eV |
| TMM7 | −6.0 eV | −2.5 eV | 3.5 eV |
| CBP | −5.40 eV | −2.0 eV | 3.4 eV |
| TCTA | −5.30 eV | −2.2 eV | 3.1 eV |

TMM1 and TMM2 here are electron-conducting matrix materials, CBP and TCTA are hole-conducting matrix materials and TMM3 to TMM6 are neither electron-conducting nor hole-conducting matrix materials. TMM7 is an electron-conducting matrix material.

Example 1

Examples 1a and 1b according to the invention are achieved through the following layer structure:

20 nm of HIM, 20 nm of HTM, 30 nm of mixed layer TMM1:TMM4 in the ratio 2:1 (1a) or 1:2 (1b) doped with 10% of TEG-1, 10 nm of TMM1, 20 nm of ETM, 1 nm of LiF, 100 nm of Al.

TMM1 here in accordance with the definition represents an electron-conducting host and TMM4 represents a neutral host. The OLEDs obtained have green emission with high efficiency, low operating voltage and a long operating lifetime.

Example 2

Example 2 according to the invention is achieved through the same layer structure as Example 1a, with material TMM3 being used as neutral host instead of TMM4. This OLED also has similarly good emission properties as Examples 1a and 1b.

Example 3

Example 3 according to the invention is achieved through the same layer structure as Example 2, with material TMM5 being used as neutral host instead of TMM3. This OLED also has similarly good emission properties as Example 2.

Example 4

Comparison

Comparative Example 4 is achieved through the same layer structure as Examples 1, 2 and 3, but a mixed layer is omitted here, the emission layer comprises TMM1 alone, doped with 10% of TEG-1.

Although the use of the electron-conducting host without admixture of a neutral material facilitates somewhat lower voltages, the efficiency and operating lifetime are, however, significantly below the data for the OLEDs with mixed layer according to the invention shown in Examples 1, 2 and 3.

Example 5

Comparison

Comparative Example 5 is achieved through the same layer structure as Example 4, but the neutral host TMM4 is used here as the sole host for the emission layer, again doped with 10% of TEG-1.

It is evident that this material is unsuitable as sole host for obtaining a usable OLED emission characteristic owing to its HOMO and LUMO positions. It is evident merely from the very high operating voltage that this material does not result in good charge transport in the OLED.

Example 6

Comparison

Comparative Examples 6a and 6b again comprise a mixed layer as host, but not one according to the invention since they comprise, in accordance with the prior art, the hole-conducting materials CBP or TCTA besides the electron-conducting material TMM1. They are achieved through the following layer structure analogously to Example 1a:

20 nm of HIM, 20 nm of HTM, 30 nm of mixed layer TMM1:CBP (6a) or TMM1:TCTA (6b) in the ratio 2:1 doped with 10% of TEG-1, 10 nm of TMM1, 20 nm of ETM, 1 nm of LiF, 100 nm of Al. It is evident that although the voltage on use of TCTA is somewhat lower than in the case of the mixed layers according to the invention in Examples 1 and 2, the efficiency and in particular the operating lifetime is significantly inferior to the mixed layers according to the invention.

Example 7

Examples 7a and 7b according to the invention are achieved through the following layer structure:

20 nm of HIM, 20 nm of HTM, 30 nm of mixed layer TMM7:TMM4 in the ratio 2:1 (1a) or 1:2 (1b) doped with 10% of TEG-1, 10 nm of TMM1, 20 nm of ETM, 1 nm of LiF, 100 nm of Al.

Example 10

Comparison

Comparative Example 10 is achieved through the same layer structure as Example 9, but a mixed layer is omitted here, the emission layer comprises TMM2 alone, doped with 10% of TEG-1.

TABLE 2

Device results

| Ex. | Host material(s) | Dopant | CIE x/y at 1000 cd/m$^2$ | Efficiency at 1000 cd/m$^2$ | Voltage at 1000 cd/m$^2$ | Lifetime 50% at 4000 cd/m$^2$ |
|---|---|---|---|---|---|---|
| 1a | TMM1:TMM4 (2:1) | TEG-1 10% | 0.36/0.61 | 46 cd/A | 4.0 V | 2900 |
| 1b | TMM1:TMM4 (1:2) | TEG-1 10% | 0.36/0.61 | 45 cd/A | 4.3 V | 3100 |
| 2 | TMM1:TMM3 (2:1) | TEG-1 10% | 0.36/0.61 | 47 cd/A | 4.1 V | 2700 |
| 3 | TMM1:TMM5 (2:1) | TEG-1 10% | 0.36/0.61 | 45 cd/A | 4.1 V | 2300 |
| 4 (comp.) | TMM1 | TEG-1 10% | 0.37/0.60 | 42 cd/A | 3.8 V | 2000 |
| 5 (comp.) | TMM4 | TEG-1 10% | 0.34/0.59 | 12 cd/A | 8.7 V | 140 |
| 6a (comp.) | TMM1:CBP (2:1) | TEG-1 10% | 0.36/0.61 | 44 cd/A | 4.1 V | 2000 |
| 6b (comp.) | TMM1:TCTA (2:1) | TEG-1 10% | 0.35/0.60 | 42 cd/A | 3.9 V | 1100 |
| 7a | TMM7:TMM4 (2:1) | TEG-1 10% | 0.37/0.60 | 47 cd/A | 3.9 V | 2200 |
| 7b | TMM7:TMM4 (1:2) | TEG-1 10% | 0.36/0.61 | 45 cd/A | 4.2 V | 2200 |
| 8 (comp.) | TMM7 | TEG-1 10% | 0.38/0.60 | 41 cd/A | 3.9 V | 1200 |
| 9 | TMM2:TMM4 (1:1) | TEG-1 10% | 0.36/0.60 | 48 cd/A | 4.9 V | 3000 |
| 10 (comp.) | TMM2 | TEG-1 10% | 0.37/0.60 | 45 cd/A | 4.9 V | 2000 |

TMM7 in accordance with the definition represents an electron-conducting host and TMM4 represents a neutral host. The OLEDs obtained have green emission with high efficiency, low operating voltage and a longer operating lifetime than Comparative Example 8.

Example 8

Comparison

Comparative Example 8 is achieved through the same layer structure as Example 7, but a mixed layer is omitted here, the emission layer comprises TMM7 alone, doped with 10% of TEG-1.

Although the use of the electron-conducting host without admixture of a neutral material facilitates somewhat lower voltages, the efficiency and operating lifetime are, however, below the data for the OLED with mixed layer according to the invention shown in Example 7.

Example 9

Example 9 according to the invention is achieved through the following layer structure:

20 nm of HIM, 20 nm of HTM, 30 nm of mixed layer TMM2:TMM4 in the ratio 1:1 doped with 10% of TEG-1, 10 nm of TMM2, 25 nm of ETM, 1 nm of LiF, 100 nm of Al.

TMM2 in accordance with the definition represents an electron-conducting host and TMM4 represents a neutral host. The OLEDs obtained have green emission with high efficiency and in particular a longer operating lifetime than Comparative Example 10.

Production and Characterisation of Organic Electroluminescent Devices from Solution Electroluminescent devices according to the invention can also be produced from solution, which results in significantly simpler devices with nevertheless good properties. The production of such components is based on the production of polymeric light-emitting diodes (PLEDs), which has already been described many times in the literature (for example in WO 2004/037887). In the present case, the corresponding compounds are dissolved in toluene or chlorobenzene. The typical solids content of such solutions is between 16 and 25 g/l if, as here, the typical layer thickness of 80 nm for a device is to be achieved by means of spin coating. FIG. 1 shows the typical structure of a device of this type. The jointly dissolved matrix materials and the emitter are present in the emitting layer in the form of an amorphous layer. Structured ITO substrates and the material for the so-called buffer layer (PEDOT, actually PEDOT:PSS) are commercially available (ITO from Technoprint and others, PEDOT:PSS as Clevios P aqueous dispersion from H. C. Starck). The interlayer used serves for hole injection; in this case, HIL-012 from Merck was used. The emission layer is applied by spin coating in an inert-gas atmosphere, in the present case argon, and dried by heating at 160° C. or 180° C. for 10 min. Finally, a barium and aluminium cathode is applied by vacuum vapour deposition. The hole-blocking and/or electron-transport layers used in the above-mentioned examples can also be applied between the emitting layer and cathode by vapour deposition, and the interlayer may also be replaced by one or more layers, which merely need to satisfy the condition that they are not detached again by the downstream processing step of deposition of the emitting layer from solution. The devices processed from solution are also characterised by standard methods, and the OLED examples mentioned have not yet been optimised. In Table 3, the device results in accordance with the prior art are compared with those obtained by means of a mixed layer comprising matrix materials A and B. It is also evident in the area of devices processed from solution that the materials according to the invention significantly improve the efficiency and lifetime of the components.

spin rate of 3260 rpm. The layer is dried by heating at 160° C. for 10 min before vapour deposition of the cathode.

Example 15

40 mg of TEG-2, 100 mg of TMM2 and 100 mg of TMM6 are dissolved jointly in 10 ml of dry and oxygen-free toluene. 80 nm of EML are deposited on the previously applied HIL-012 layer in an argon-flushed glove box at a spin rate of 2080 rpm. The layer is dried by heating at 160° C. for 10 min before vapour deposition of the cathode.

TABLE 3

Device results

| Ex. | Host material(s) | Dopant | CIE x/y at 1000 cd/m² | Efficiency at 1000 cd/m² | Voltage at 1000 cd/m² | Lifetime 50% at 1000 cd/m² |
|---|---|---|---|---|---|---|
| 11 (comp.) | TMM1 | TEG-2 16.7% | 0.35/0.61 | 24 cd/A | 6.4 V | 2700 |
| 12 | TMM1:TMM5 (1:1) | TEG-2 16.7% | 0.33/0.63 | 32 cd/A | 6.4 V | 6600 |
| 13 (comp.) | TMM2 | TEG-2 16.7% | 0.36/0.61 | 11 cd/A | 5.7 V | 9400 |
| 14 | TMM2:TMM4 (1:1) | TEG-2 16.7% | 0.32/0.62 | 20 cd/A | 4.6 V | 13000 |
| 15 | TMM2:TMM6 (1:1) | TEG-2 16.7% | 0.33/0.63 | 26 cd/A | 4.7 V | 20500 |

Example 11

Comparison 30 mg of TEG-2 and 150 mg of TMM1 are dissolved jointly in 10 ml of dry and oxygen-free toluene. 80 nm of EML (emitting layer) are deposited on the previously applied HIL-012 layer in an argon-flushed glove box at a spin rate of 1000 rpm. The layer is dried by heating at 120° C. for 10 min before vapour deposition of the cathode.

Example 12

40 mg of TEG-2, 100 mg of TMM1 and 100 mg of TMM5 are dissolved jointly in 10 ml of dry and oxygen-free toluene. 80 nm of EML are deposited on the previously applied HIL-012 layer in an argon-flushed glove box at a spin rate of 2110 rpm. The layer is dried by heating at 120° C. for 10 min before vapour deposition of the cathode.

Example 13

Comparison 40 mg of TEG-2 and 200 mg of TMM2 are dissolved jointly in 10 ml of dry and oxygen-free chlorobenzene. 80 nm of EML are deposited on the previously applied HIL-012 layer in an argon-flushed glove box at a spin rate of 1000 rpm. The layer is dried by heating at 180° C. for 10 min before vapour deposition of the cathode.

Example 14

40 mg of TEG-2, 100 mg of TMM2 and 100 mg of TMM4 are dissolved jointly in 10 ml of dry and oxygen-free toluene. 80 nm of EML are deposited on the previously applied HIL-012 layer in an argon-flushed glove box at a

The invention claimed is:

1. An organic electroluminescent device comprising an anode, a cathode and at least one emitting layer which comprises at least one phosphorescent compound which is doped into a mixture of two materials A and B, where materials A and B are defined low-molecular-weight compounds having a molecular weight of 2000 g/mol or less, wherein material A is a charge-transporting material and is an electron-conducting compound which is selected from the group consisting of aromatic ketones, aromatic phosphine oxides, aromatic sulfoxides, aromatic sulfones, triazine derivatives, zinc complexes and aluminum complexes, and in that material B which is not involved in charge transport, has a HOMO of −5.4 eV or less and a LUMO of −2.4 eV or more and which has an energy gap of at least 3.5 eV and wherein the material B is a compound of the formula (23), (24) or (25):

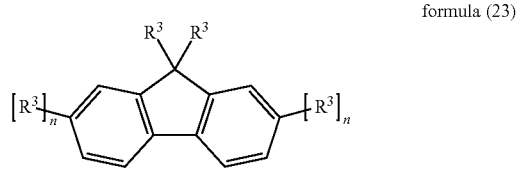

formula (23)

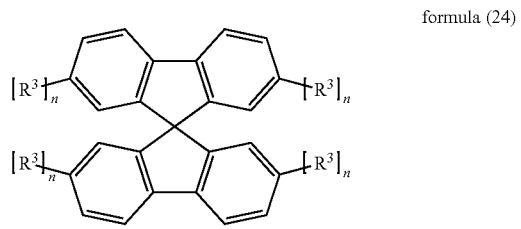

formula (24)

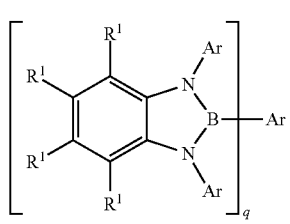

formula (25)

wherein

Ar is on each occurrence, identically or differently, an aromatic or heteroaromatic ring system having 5 to 60 aromatic ring atoms, which optionally in each case be substituted by one or more groups $R^1$;

$R^1$ is on each occurrence, identically or differently, H, D, F, Cl, Br, I, CHO, C(=O)Ar$^1$, P(=O)(Ar$^1$)$_2$, S(=O)Ar$^1$, S(=O)$_2$Ar$^1$, CR$^2$=CR$^2$Ar$^1$, CN, NO$_2$, Si(R$^2$)$_3$, B(OR$^2$)$_2$, B(R$^2$)$_2$, B(N(R$^2$)$_2$)$_2$, OSO$_2$R$^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which is optionally substituted by one or more radicals R$^2$, where one or more non-adjacent CH$_2$ groups is optionally replaced by R$^2$C=CR$^2$, C≡C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and where one or more H atoms is optionally replaced by F, Cl, Br, I, CN or NO$_2$, or an aromatic or heteroaromatic ring system having 5 to 60 aromatic ring atoms, which is optionally in each case be substituted by one or more radicals R$^2$, or an aryloxy or heteroaryloxy group having 5 to 60 aromatic ring atoms, which is optionally substituted by one or more radicals R$^2$, or a combination of these systems; two or more adjacent substituents R$^1$ here optionally forms a mono- or polycyclic, aliphatic or aromatic ring system with one another;

Ar$^1$ is on each occurrence, identically or differently, an aromatic or heteroaromatic ring system having 5 to 40 aromatic ring atoms, which is optionally substituted by one or more radicals R$^2$;

R$^2$ is on each occurrence, identically or differently, H, D, CN or an aliphatic, aromatic and/or heteroaromatic hydrocarbon radical having 1 to 20 C atoms, in which, in addition, H atoms is optionally replaced by F; two or more adjacent substituents R$^2$ here optionally forms a mono- or polycyclic, aliphatic or aromatic ring system with one another, n is, identically or differently on each occurrence, 0 or 1, R$^3$ is on each occurrence, identically or differently, a straight-chain alkyl group having 1 to 20 C atoms or a branched or cyclic alkyl group having 3 to 20 C atoms, or an aromatic ring system having 6 to 60 aromatic C atoms, which does not contain any non-aromatic groups other than carbon or hydrogen and which is optionally substituted by one or more radicals R$^4$; two or more radicals R$^3$ here optionally forms a ring system with one another;

R$^4$ is on each occurrence, identically or differently, a straight-chain alkyl group having 1 to 20 C atoms or a branched or cyclic alkyl group having 3 to 20 C atoms; two or more radicals R$^4$ here optionally forms a ring system with one another;

q is 1, 2, 3 or 4.

2. The organic electroluminescent device according to claim 1, wherein the proportion of the phosphorescent compound in the emitting layer is 1 to 50% by volume.

3. The organic electroluminescent device according to claim 1, wherein the mixing ratio between the charge-transporting material A and material B is between 10:1 and 1:10 based on the volume.

4. The organic electroluminescent device according to claim 1, wherein the proportion of the phosphorescent compound in the emitting layer is 5 to 25% by vol., and the mixing ratio between the charge-transporting material A and material B is between 7:1 and 1:7 based on the volume.

5. The organic electroluminescent device according to claim 1, wherein the proportion of the phosphorescent compound in the emitting layer is 10 to 20% by vol. and the mixing ratio between the charge-transporting material A and material B is between 4:1 and 1:4, in each case based on the volume.

6. The organic electroluminescent device according to claim 1, wherein the charge-transporting material A is the aromatic ketone which is a compound of the formula (1a) and in that the aromatic phosphine oxide is a compound of the formula (1b):

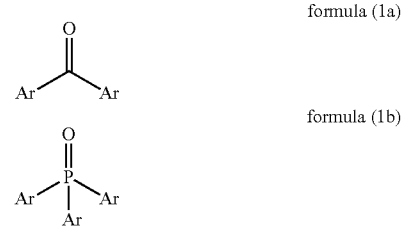

wherein the following applies to the symbols used:

Ar is on each occurrence, identically or differently, an aromatic or heteroaromatic ring system having 5 to 60 aromatic ring atoms, which optionally in each case be substituted by one or more groups $R^1$;

$R^1$ is on each occurrence, identically or differently, H, D, F, Cl, Br, I, CHO, C(=O)Ar$^1$, P(=O)(Ar$^1$)$_2$, S(=O)Ar$^1$, S(=O)$_2$Ar$^1$, CR$^2$=CR$^2$Ar$^1$, CN, NO$_2$, Si(R$^2$)$_3$, B(OR$^2$)$_2$, B(R$^2$)$_2$, B(N(R$^2$)$_2$)$_2$, OSO$_2$R$^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which is optionally substituted by one or more radicals R$^2$, where one or more non-adjacent CH$_2$ groups is optionally replaced by R$^2$C=CR$^2$, C≡C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and where one or more H atoms is optionally replaced by F, Cl, Br, I, CN or NO$_2$, or an aromatic or heteroaromatic ring system having 5 to 60 aromatic ring atoms, which is optionally in each case be substituted by one or more radicals R$^2$, or an aryloxy or heteroaryloxy group having 5 to 60 aromatic ring atoms, which is optionally substituted by one or more radicals R$^2$, or a combination of these systems; two or more adjacent substituents R$^1$ here optionally forms a mono- or polycyclic, aliphatic or aromatic ring system with one another;

Ar$^1$ is on each occurrence, identically or differently, an aromatic or heteroaromatic ring system having 5 to 40 aromatic ring atoms, which is optionally substituted by one or more radicals R$^2$;

R² is on each occurrence, identically or differently, H, D, CN or an aliphatic, aromatic and/or heteroaromatic hydrocarbon radical having 1 to 20 C atoms, in which, in addition, H atoms is optionally replaced by F; two or more adjacent substituents R² here optionally forms a mono- or polycyclic, aliphatic or aromatic ring system with one another.

7. The organic electroluminescent device according to claim 1, wherein the charge-transporting material A is the aromatic ketone which is a compound of the formula (2), (3), (4) or (5):

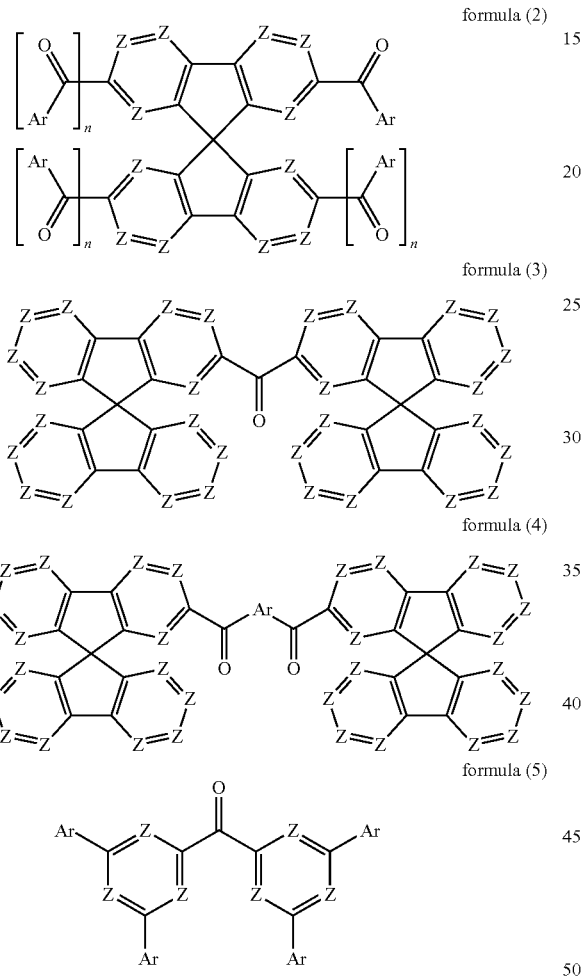

formula (2)

formula (3)

formula (4)

formula (5)

wherein R¹ is on each occurrence, identically or differently, H, D, F, Cl, Br, I, CHO, C(=O)Ar¹, P(=O)(Ar¹)₂, S(=O)Ar¹, S(=O)₂Ar¹, CR²=CR²Ar¹, CN, NO₂, Si(R²)₃, B(OR²)₂, B(R²)₂, B(N(R²)₂)₂, OSO₂R², a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which is optionally substituted by one or more radicals R², where one or more non-adjacent CH₂ groups is optionally replaced by R²C=CR², C≡C, Si(R²)₂, Ge(R²)₂, Sn(R²)₂, C=O, C=S, C=Se, C=NR², P(=O)(R²), SO, SO₂, NR², O, S or CONR² and where one or more H atoms is optionally replaced by F, Cl, Br, I, CN or NO₂, or an aromatic or heteroaromatic ring system having 5 to 60 aromatic ring atoms, which is optionally in each case be substituted by one or more radicals R², or an aryloxy or hetero-aryloxy group having 5 to 60 aromatic ring atoms, which is optionally substituted by one or more radicals R², or a combination of these systems; two or more adjacent substituents R¹ here optionally forms a mono- or polycyclic, aliphatic or aromatic ring system with one another;

Ar¹ is on each occurrence, identically or differently, an aromatic or heteroaromatic ring system having 5 to 40 aromatic ring atoms, which is optionally substituted by one or more radicals R²;

R² is on each occurrence, identically or differently, H, D, CN or an aliphatic, aromatic and/or heteroaromatic hydrocarbon radical having 1 to 20 C atoms, in which, in addition, H atoms is optionally replaced by F; two or more adjacent substituents R² here optionally forms a mono- or polycyclic, aliphatic or aromatic ring system with one another, Z is, identically or differently on each occurrence, CR¹ or N;

n is, identically or differently on each occurrence, 0 or 1.

8. The organic electroluminescent device according to claim 1, wherein the charge-transporting material A is the triazine derivative which is a compound of the formula (6) or (7):

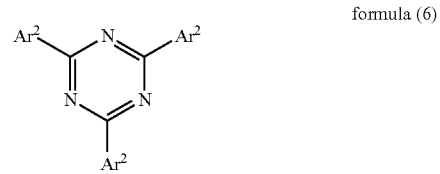

formula (6)

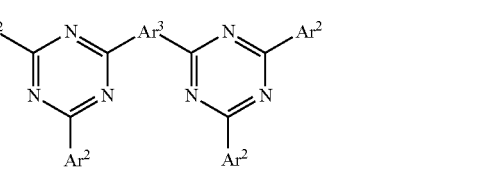

formula (7)

wherein

R¹ is on each occurrence, identically or differently, H, D, F, Cl, Br, I, CHO, C(=O)Ar¹, P(=O)(Ar¹)₂, S(=O)Ar¹, S(=O)₂Ar¹, CR²=CR²Ar¹, CN, NO₂, Si(R²)₃, B(OR²)₂, B(R²)₂, B(N(R²)₂)₂, OSO₂R², a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which is optionally substituted by one or more radicals R², where one or more non-adjacent CH₂ groups is optionally replaced by R²C=CR², C≡C, Si(R²)₂, Ge(R²)₂, Sn(R²)₂, C=O, C=S, C=Se, C=NR², P(=O)(R²), SO, SO₂, NR², O, S or CONR² and where one or more H atoms is optionally replaced by F, Cl, Br, I, CN or NO₂, or an aromatic or heteroaromatic ring system having 5 to 60 aromatic ring atoms, which is optionally in each case be substituted by one or more radicals R², or an aryloxy or heteroaryloxy group having 5 to 60 aromatic ring atoms, which is optionally substituted by one or more radicals R², or a combination of these systems; two or more adjacent substituents $R^1$ here optionally forms a mono- or polycyclic, aliphatic or aromatic ring system with one another;

$Ar^1$ is on each occurrence, identically or differently, an aromatic or heteroaromatic ring system having 5 to 40 aromatic ring atoms, which is optionally substituted by one or more radicals $R^2$;

$R^2$ is on each occurrence, identically or differently, H, D, CN or an aliphatic, aromatic and/or heteroaromatic hydrocarbon radical having 1 to 20 C atoms, in which, in addition, H atoms is optionally replaced by F; two or more adjacent substituents $R^2$ here optionally forms a mono- or polycyclic, aliphatic or aromatic ring system with one another, $Ar^2$ is, identically or differently on each occurrence, a monovalent aromatic or heteroaromatic ring system having 5 to 60 aromatic ring atoms, which optionally in each case is substituted by one or more radicals $R^1$;

$Ar^3$ is a divalent aromatic or heteroaromatic ring system having 5 to 60 aromatic ring atoms, which is optionally substituted by one or more radicals $R^1$.

9. The organic electroluminescent device according to claim 1, wherein material B has a HOMO of −5.7 eV or less.

10. The organic electroluminescent device according to claim 1, wherein material B has an energy gap of 3.7 eV or more.

11. The organic electroluminescent device according to claim 1, wherein material B has a LUMO of −2.2 eV or more.

12. The organic electroluminescent device according to claim 1, wherein material B has a HOMO of −6.0 eV or less and material B has an energy gap of 3.9 eV or more, and material B has a LUMO of −2.0 eV or more.

13. The organic electroluminescent device according to claim 1, wherein material B is a diazaborole or a pure hydrocarbon.

14. The organic electroluminescent device according to claim 1, wherein material B is an aromatic hydrocarbon.

15. The organic electroluminescent device according to claim 1, wherein the phosphorescent compound is a compound of the formulae (26) to (29):

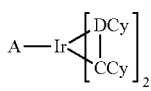

formula (26)

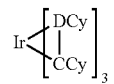

formula (27)

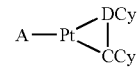

formula (28)

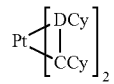

formula (29)

wherein

DCy is, identically or differently on each occurrence, a cyclic group which contains at least one donor atom via which the cyclic group is bonded to the metal, and which may in turn carry one or more substituents $R^1$; the groups DCy and CCy are bonded to one another via a covalent bond;

CCy is, identically or differently on each occurrence, a cyclic group which contains a carbon atom via which the cyclic group is bonded to the metal and which may in turn carry one or more substituents $R^1$;

A is, identically or differently on each occurrence, a monoanionic, bidentate chelating ligand, or diketonate ligand.

16. The organic electroluminescent device according to claim 15, wherein

DCy is, identically or differently on each occurrence, a cyclic group which contains at least nitrogen, carbon in the form of a carbene or phosphorus, via which the cyclic group is bonded to the metal, and which may in turn carry one or more substituents $R^1$; the groups DCy and CCy are bonded to one another via a covalent bond; and A is, identically or differently on each occurrence, a diketonate ligand.

17. A process for the production of the organic electroluminescent device according to claim 1, wherein one or more layers are applied by means of a sublimation process or in that one or more layers are applied by means of the OVPD (organic vapour phase deposition) process or with the aid of carrier-gas sublimation or in that one or more layers are applied from solution or by means of a printing process.

* * * * *